United States Patent
Byrne

(10) Patent No.: US 8,690,590 B2
(45) Date of Patent: Apr. 8, 2014

(54) POWER AND DATA COMPONENT MOUNTED ON A MOVABLE CARRIAGE AND A MOVABLE COVER WITH A DAMPER

(76) Inventor: Norman R. Byrne, Ada, MI (US)

( * ) Notice: Subject to any disclaimer, the term of this patent is extended or adjusted under 35 U.S.C. 154(b) by 0 days.

(21) Appl. No.: 12/664,251

(22) PCT Filed: Jun. 11, 2008

(86) PCT No.: PCT/US2008/007281
§ 371 (c)(1),
(2), (4) Date: Dec. 11, 2009

(87) PCT Pub. No.: WO2008/154021
PCT Pub. Date: Dec. 18, 2008

(65) Prior Publication Data
US 2010/0178797 A1 Jul. 15, 2010

Related U.S. Application Data

(60) Provisional application No. 60/943,298, filed on Jun. 11, 2007.

(51) Int. Cl.
*H01R 13/44* (2006.01)
(52) U.S. Cl.
USPC .......................................................... 439/131

(58) Field of Classification Search
USPC ............ 439/134, 501, 131, 528, 574; 174/48, 174/148, 490, 53; 361/118, 724
See application file for complete search history.

(56) References Cited

U.S. PATENT DOCUMENTS

| | | | | |
|---|---|---|---|---|
| 4,372,629 A | * | 2/1983 | Propst et al. | 312/223.6 |
| 4,551,577 A | * | 11/1985 | Byrne | 174/57 |
| 4,747,788 A | * | 5/1988 | Byrne | 439/131 |
| 4,984,982 A | * | 1/1991 | Brownlie et al. | 439/131 |
| 5,575,668 A | * | 11/1996 | Timmerman | 439/131 |
| 5,709,156 A | * | 1/1998 | Gevaert et al. | 108/50.02 |
| 6,290,518 B1 | * | 9/2001 | Byrne | 439/131 |

* cited by examiner

*Primary Examiner* — Chandrika Prasad
(74) *Attorney, Agent, or Firm* — Varnum, Riddering, Schmidt & Howlett LLP

(57) ABSTRACT

An expandable power and data center (300) is adapted to be mounted within a slot (304) of a work surface (302). The power and data center (300) includes a stationary housing (306) and a carriage (328). The carriage (328) includes socket areas where power receptacles (338) and data ports (340) can be inserted. A top surface (330) of the carriage (328) and a top surface (350) of a frontal cover (348) form a pressure area (360). With the carriage in a closed position (328), a user can exert a downward pressure on the pressure area (360), causing the carriage (328) to move to an open position. A damper (368) restricts the speed at which the carriage (328) moves between the closed position and an open position.

6 Claims, 37 Drawing Sheets

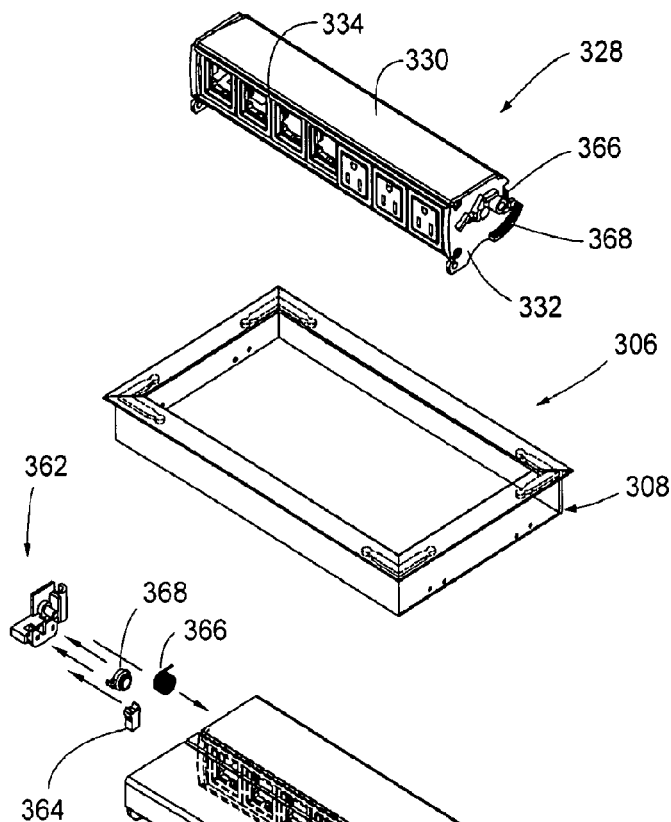
Fig. 49
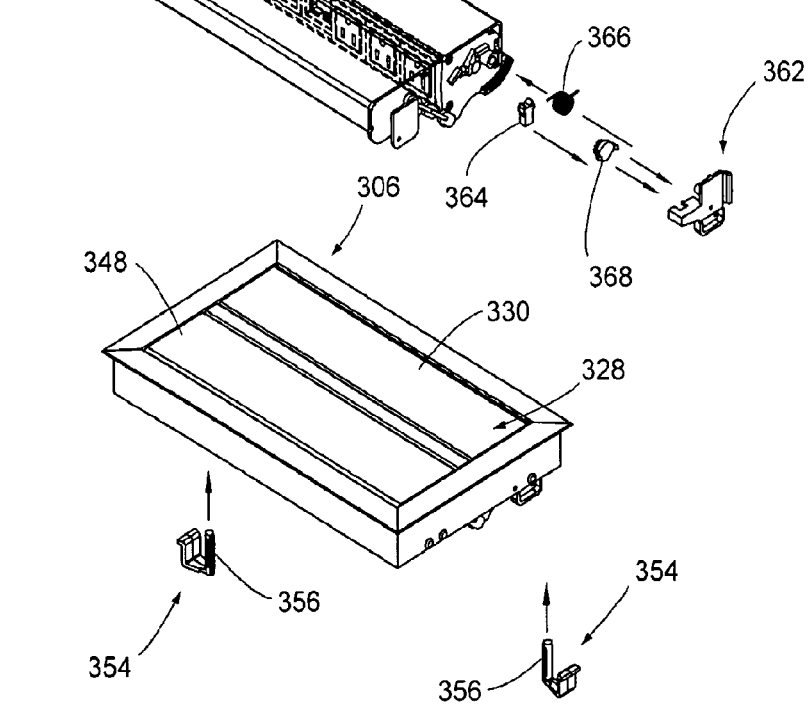
Fig. 50
Fig. 51

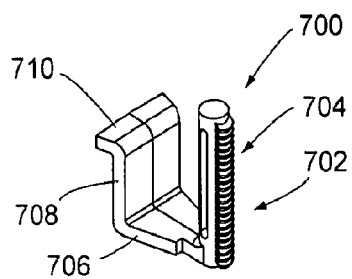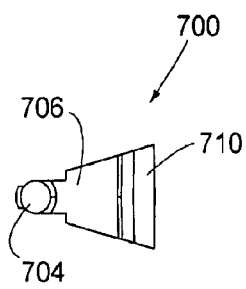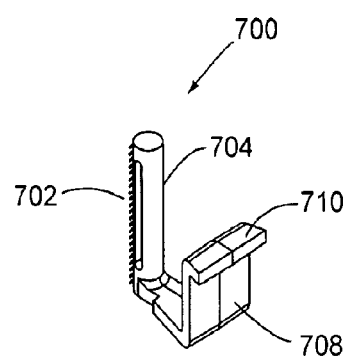
Fig. 52  Fig. 53  Fig. 54
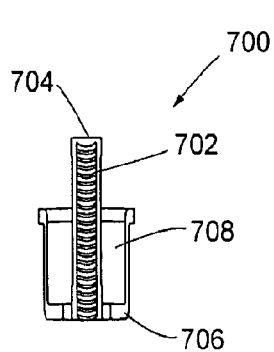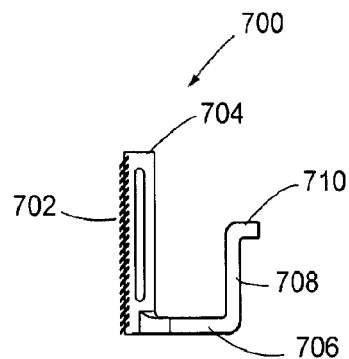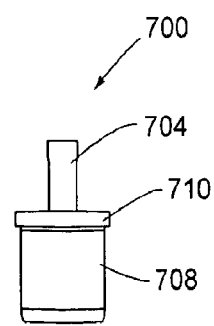
Fig. 55  Fig. 56  Fig. 57
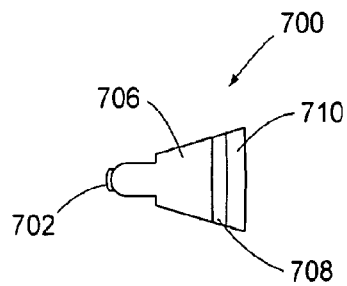
Fig. 58

POWER AND DATA COMPONENT MOUNTED ON A MOVABLE CARRIAGE AND A MOVABLE COVER WITH A DAMPER

CROSS-REFERENCE TO RELATED APPLICATIONS

This international patent application claims priority of U.S. Provisional Patent Application Ser. No. 60/943,298 filed on Jun. 11, 2007.

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

The invention relates to electrical power, and power and data distribution systems and, more particularly, to power and data center systems having particular latching mechanisms.

DESCRIPTION OF RELATED ART

The use of computers, sophisticated telecommunications equipment and other electronic devices is continuing to rapidly increase in commercial, industrial and other office environments. As a result, the importance of efficiently supplying power throughout these environments is also increasing. Historically, one problem common to the use of electrical power and communications equipment is the positioning of electrical power outlets and communication ports, such as conventional RS-232 voice/data interface connectors. The communication ports are often referred to as "data ports" or "voice/data ports." Positioning of these devices is important with respect to both convenience and cost efficiency. Electrical receptacles and communication ports for supplying power and communication signals to various types of devices (lighting, computers, etc.) must be located in accessible positions for all types of use.

However, the cost of electrical materials rapidly increases as the number of power source receptacles and associated equipment is increased. In addition, and perhaps more importantly, the conventional design of single- or double-unit receptacles (for both electrical power and communications) within walls or floor surfaces, which are often a substantial distance from the devices to be powered or with which to communicate, cause unsightly and sometimes dangerous arrays, and may result in entanglements of the electrical cords and communications wires connected to the devices.

To overcome the problems associated with efficiency and convenience of electrical and communications outlet design, it is not uncommon to employ multiple receptacle raceways having a number of receptacles or communication ports with a common power source cord or communications cable plugged into a utility or commercial communications company's outlet. Again, however, the raceways can result in unsightly and entangled arrays of electrical cords and communication lines. In addition, such raceways are often located on floor surfaces and are not particularly convenient.

It is also known to employ electrical receptacles and communications ports rigidly and directly mounted to various types of furniture, such as bookshelves and desks. These receptacles may be mounted at a location substantially above the floor surface, and allow the user to interconnect electrical and communications devices nearer their location of use, thereby avoiding the necessity of running device cords and cables a substantial distance. However, rigidly secured receptacles and communication ports must be mounted in a manner so that the user can readily insert device plugs and corresponding communication port connectors. Accordingly, these receptacles and communication ports are typically in a fairly "open" location, and the device cords again may prove to be unsightly and space consuming. If, alternatively, the receptacles and communication ports are somewhat hidden from view, they can be difficult to access.

A system employing covered receptacles mounted within a work station is disclosed in Propst, U.S. Pat. No. 4,372,629 issued Feb. 8, 1983. The Propst et al. arrangement includes a desk top having a rear cover hinged to a vertical back panel. Receptacles are mounted to the lower portion of the cover and bristles extend horizontally from the cover to an edge of the desk top when the cover is closed. When the cover is open, the user can "plug in" the cord of a desired electrical device and close the cover, with the cord then extending through the bristles.

One relatively substantial advance over the prior art, relating to the mounting of electrical receptacles in a retractable manner in work surfaces and the like, is shown in the commonly owned Byrne, U.S. Pat. No. 4,551,577 issued Nov. 5, 1985. In the Byrne patent, a retractable power center includes a rectangular housing formed in the work surface, with a clamping arrangement to secure the housing to the work surface. A lower extrusion is connected to a lower portion of the housing, and a movable power carriage mounts receptacles. A catch assembly releasably maintains the carriage in a closed, retracted position. In response to manual activation, the catch assembly is released and springs tensioned between the carriage and the extrusion exert forces so as to extend the carriage upward into an extended open position. In the open position, the user can energize desired electrical devices from the receptacles, and then lower the carriage into the releasably secured, retracted position.

Although the foregoing Byrne patent represents a substantial advance with respect to retractable power centers mounted on work surfaces and the like, it can also be advantageous to employ a retractable power center having a relatively more simple construction. That is, the use of springs or similar arrangements can sometimes result in additional repair and maintenance costs. Further, the use of a relatively long extrusion and spring assemblies can also result in higher initial costs.

In this regard, a further advance over the prior art was achieved with the commonly owned Byrne, U.S. Pat. No. 4,747,788 issued May 31, 1988. In this patent, a retractable power center is disclosed which is manually operable. The power center includes a stationary upper housing received within a slot formed within a work surface, and a clamping arrangement to secure the housing to the work surface. A manually movable and vertically slidable power carriage is utilized to mount the electrical receptacles. In response to manually exerted forces, the carriage can be extended vertically upward into an open position. Small bosses extend laterally from the sides of the carriage to provide a means to support the carriage in its extended position, with the bosses resting on the top portion of the housing. Ledges are integrally formed on the lateral sides of the carriage near the bottom portions thereof, so as to prevent any additional movement of the carriage upwardly relative to the housing.

An example of a device having electrical receptacles, data ports and other types of communication outlets is disclosed in Brownlie et al., U.S. Pat. No. 4,984,982 issued Jan. 15, 1991. The Brownlie et al. patent illustrates an access flooring module to be mounted in an opening provided in an access floor. The module is movable between open and closed positions, and recesses are provided so as to receive electrical components such as power sockets or signal sockets. Electrical isolation is provided between certain components. In an alternative embodiment, high tension and low tension cables are interconnected to the rear of a module. The high tension cable is secured through a hard wire bracket, with the low tension cable secured through a data bracket. Cable ties are utilized to secure the cables to the rear of the module.

A device comprising both electrical power and data service lines, and specifically directed to use in a work surface, is disclosed in Timmerman, U.S. Pat. No. 5,575,668 issued Nov. 19, 1996. In the Timmerman patent, a temporary power/data tap is provided for delivering both electrical power and data service to a work surface from a distant standard wall or floor mounted electrical receptacle and data port. The power/data tap is movable between retracted and extended positions. The Timmerman patent illustrates a temporary power/data tap comprising an enclosure assembly, power distribution assembly, at least one outlet enclosure and a power cord. The enclosure assembly comprises a box structure having a top opening with two side surfaces and two removable end surfaces. The side surfaces include spot welded nuts on their inside surfaces for mounting the enclosure assembly to a work surface. The inside surface of the side surfaces of the box structure include rivets intruding into non-conductor space and serving as positive stops for the outlet enclosure housed therein. The end surfaces can also have openings for receiving a strain relief bushing or an electrical connector.

Disposed inside the enclosure assembly is a power distribution assembly for receiving and distributing electrical power through the enclosure assembly to the outlet enclosure. The power distribution assembly is an I-shaped structure comprising a first junction box and a second junction box. Each of the junction boxes includes a recessed central area with two centrally located conduit holes manufactured thereon which are used to attach one end of a metallic rigid conduit and one end of a metallic flexible conduit. Trade holes are also manufactured on the inside surface near the upper edge of each junction box, for engaging bullet catches located on lateral sides of each outlet enclosure for purposes of limiting the upper rotation of the outlet enclosure from the enclosure assembly.

During assembly, the power distribution assembly is disposed inside the enclosure assembly over a bottom surface so that a rigid conduit is parallel with the longitudinal axis of the enclosure assembly, with the junction boxes disposed on opposite sides thereof. This concept is shown in FIG. 5 of the Timmerman patent. Electrical power is delivered to the enclosure assembly from a standard receptacle by means of a power cord. The power cord extends through a bushing attached to the side surface of the box structure.

In the embodiment shown in FIGS. 1 and 2 of Timmerman, two outlet enclosures are placed through the top opening and disposed in a side-by-side manner inside the enclosure assembly. A hinge is disposed between the two outlet enclosures or between one outlet enclosure and the enclosure assembly, thereby enabling the outlet enclosures to freely pivot inside the enclosure assembly. Each outlet enclosure is made of sheet metal and comprises a cover and a box member divided by a partition into first and second compartments. The cover is connected along its back edge by a full length hinge to the top surface of the box member. A connecting rod is used to interconnect the hinge element on the cover with the hinge elements located on an adjacent outlet enclosure or on the enclosure assembly. The box member is divided into a first compartment used to house high voltage electrical connections, and a second compartment used to house low voltage electrical connections, such as data service line connections. Each end of the box member is fitted with a bullet cache which engages trade holes manufactured on the sides of the adjacent junction box to limit the upward rotation of the outlet enclosure.

Manufactured on a front surface of the box member are cutouts for receiving the electrical power receptacle and the data port. Manufactured on the bottom surface of the box member directly under the first compartment is an opening which enables a flexible conduit to be attached to the box structure. Attached over a rear opening of the box member is a removable cover. The cover fully encloses the first compartment and partially encloses the rear opening of the second compartment, thereby providing a means for the data service line to enter the second compartment.

To mount the temporary tap to a work surface, a suitable opening is manufactured on the work surface slightly larger than the box structure. Mounting brackets are utilized to attach the box structure to the work surface. In general, the Timmerman patent shows the concept of a power center pivotable between open and closed positions, with the power center having both an electrical receptacle and a data port mounted in separate and isolated compartments.

Another device comprising utility receptacles and specifically directed to use in a work surface is disclosed in Gevaert et al., U.S. Pat. No. 5,709,156 issued Jan. 20, 1998. In the Gevaert et al. patent, a utility receptacle assembly comprises a base mountable to a work surface and a utility receptacle pivotably and removably mounted to the base. With reference to FIGS. 1 and 2, the utility receptacle assembly is mounted within a support surface. The assembly includes a base member, receptacle member and cover member. FIG. 1 illustrates the utility receptacle assembly in a closed and inoperative position. FIG. 2 illustrates the receptacle assembly in an open and operative position.

With reference to FIGS. 2 and 3, the base member includes an upper wall, end walls and a pair of side walls. The end walls and side walls extend downwardly from the underside of the upper wall. The base member is mounted to the support surface within an opening formed in the support surface. Locking members on the base member have a series of locking tabs at their lower portions, which engage the lower surface of the support surface when the base member is assembled within the opening of the support surface. The base member includes a central passage and a pair of side recesses located on each side of the central passage. The central passage extends fully through the base member, and the recesses face upwardly within the base member. The side recesses are formed by bottom sections, each having a rectangular passage defined by side walls and end walls. The end walls have central recesses which can receive locking ears of a conventional communication receptacle.

The utility receptacle member, with reference to FIGS. 2 and 3, includes a pair of side walls, rear wall and stepped front wall construction having an upper wall section, lower wall section and receptacle face extending therebetween. A finger notch is formed in the upper wall section, and conventional electrical receptacle slots are formed in the receptacle face for receiving electrical plug-type connectors. The receptacle face is substantially perpendicular to the lower wall section, and a series of internal walls extend perpendicularly to the receptacle face into an internal cavity. An upwardly-facing opening is formed in the rear wall. The opening is U-shaped in configuration, and communicates with the internal cavity.

With specific reference to FIGS. 4 and 5, an electrical cable extends through the upwardly-facing opening and into the internal cavity. The cable is conventional in its construction, and provides power through its series of wires. For purposes of interconnection, and with reference to FIG. 3, the side walls include openings located toward upper and rear corners of each side wall. A retainer member is formed integrally with each of the side walls. The retainer member is resilient and flexible, and is defined by a slot, with a foot formed at the end.

Continuing with reference to FIG. 3, the cover member is engageable with the upper end of the utility receptacle member. The cover member includes a planar wall having an extension and a finger notch. A series of triangular retainer bosses extend from the lower surface of the planar wall. The retainer bosses are oriented so as to angle downwardly in a rearward direction. The cover member is mounted to the receptacle member, so that the lower surface of the planar wall abuts the upper ends of the receptacle member side walls, rear wall and upper wall section. A cable-locking strain relief tab is inserted into the upwardly-facing opening and is utilized with other elements to prevent relative movement between the electrical cable and the assembly defined by the cover member and the utility receptacle member. The cover member is defined as being securable to the utility receptacle member in any satisfactory arrangement, but preferably sonic-welded to provide a permanent bond.

For purposes of engagement and disengagement of the utility receptacle member with the base member, FIG. 9 illustrates the relative positions of one of the resilient fingers, in solid-line and phantom-line format. The utility receptacle member can be inserted into the central passage, with the member side walls of the utility receptacle member having a relatively close tolerance relative to the central passage transverse walls. The user can then press outwardly on the fingers so as to move the protrusions to a flush or recessed position relative to the transverse walls. The utility receptacle member can then be slid rearwardly so that transverse openings or holes within the utility receptacle member are in alignment with the protrusions of the fingers. The resiliency of the fingers will then cause the fingers to return to an engagement position, in which the fingers are co-planar with their respective traverse side walls, and the protrusions extend into the traverse openings. In this manner, the utility receptacle member is pivotably and removably mounted to the base member. For purposes of removal, the user can manually depress the fingers so as to disengage the protrusions from the transverse openings. Simultaneously, the user can apply an outward force to the utility receptacle member, so as to withdraw the receptacle member upwardly out of the central passage for removal from the base.

With respect to specific operation, the cover member can first be secured to the utility receptacle member. The utility receptacle member is then pivotably mounted to the base member. The pivotable mounting occurs through the protrusions of the fingers associated with the transverse walls engaging with previously described openings in the side walls of the utility receptacle member. The base member is then secured to the support surface, through the previously described locking members and locking tabs. With the pivotable movement of the utility receptacle member, the user has access to electrical power receptacles on the receptacle face and/or within the communication recesses. For purposes of access, the user will insert his/her finger into the previously described finger notch, located in an upper wall section of the receptacle member. This finger notch is located below the cover member finger notch associated with the cover.

The user can then lift upwardly on the finger notch of the cover, resulting in pivoting movement of the utility receptacle member and the cover member, with movement of the same to the open or accessible position illustrated in FIGS. 2 and 6. With the receptacle member moved to its open or accessible position, a pair of feet located on either side of the utility receptacle member and their associated tabs engage portions of the inner, transverse side walls of the base member, below forwardly projecting retainer surfaces of the base member. Once the ends of the feet have cleared the retainer surfaces, resiliency of the retainer tabs move the associated feet outwardly, so that the outer portions of the feet overlie and engage the retainer surfaces. This concept is shown in solid line format in FIG. 9 of the Gevaert et al. patent. In this manner, the utility receptacle member is maintained in an open or operative position.

With further reference to FIG. 2, any further rearward pivoting movement of the utility receptacle member is prevented by engagement of lower, outer sections of the cover member with the upper surface of the base member upper wall. With the utility receptacle member and cover member moved to the open position, access is provided to the side recesses and the communications receptacles mounted therein. Also, the user can then insert one or more power plugs into the power receptacle face. Correspondingly, one or more communication cables can be operatively engaged with the communication receptacles secured to recessed bottom sections of the base member.

To return the utility receptacle member to the closed position (illustrated in FIG. 1 of the Gevaert et al. patent), the user can manually engage the retainer tabs on opposing sides of the receptacle member, and press the tabs inwardly towards each other so as to move the feet associated with each tab out of alignment with the retainer surfaces. In this manner, the utility receptacle member may be pivoted back to its closed or inoperative position. In the closed or inoperative position, portions of the cover extending from the sides of the receptacle member overlie the base member recesses, thereby preventing access to the recesses and the communication receptacles mounted therein.

Although the aforedescribed devices provide various advantageous configurations relating to the use of electrical receptacles and data ports at a work surface level, it would also be advantageous to provide other concepts with these types of devices, particularly ones where such concepts can be provided in combination. For example, it may be advantageous to provide use of electrical receptacles and data ports, even when the device is in a fully closed or retracted position. That is, it can be contemplated to provide the capability of continuing engagement of electrical devices with the electrical receptacles (and communications devices with the data ports), even when the device is retracted. In addition, for various reasons, including aesthetic purposes, it may be advantageous to somewhat "hide" recessed areas of the devices, even when the devices are in an open or "extended" position. Still further, it may be advantageous to provide the capability of "hiding" or storing excess cord length of electrical or communications utility devices, when such utility equipment is engaged with the electrical receptacles and data ports.

BRIEF DESCRIPTION OF THE DRAWING

The invention will now be described with reference to the drawing, in which:

FIG. 49 is an exploded view of certain components of the first embodiment of the power and data center shown in FIG. 18;

FIG. 50 is a further exploded view similar to FIG. 49, but showing a carriage of the power and data center shown in FIG. 18, and further showing components of the spring mechanism used with the power and data center;

FIG. 51 is a partially exploded view of the power and data center shown in FIG. 18, but shown in a closed position and showing the positions of the locking cams as they are initially inserted into the power and data center;

FIG. 52 is a locking mechanism in accordance with the invention;

FIG. 53 is a side, elevation view of the locking mechanism shown in FIG. 52;

FIG. 54 is a reverse, perspective view rotated 180° relative to the view of the locking mechanism shown in FIG. 52;

FIG. 55 is a front, elevation view of the locking mechanism shown in FIG. 52;

FIG. 56 is a right-side, elevation view of the locking mechanism as shown in FIG. 52;

FIG. 57 is a rear, elevation view of the locking mechanism shown in FIG. 52;

FIG. 58 is an underside view of the locking mechanism shown in FIG. 52;

DESCRIPTION OF THE PREFERRED EMBODIMENT

Figure 18:
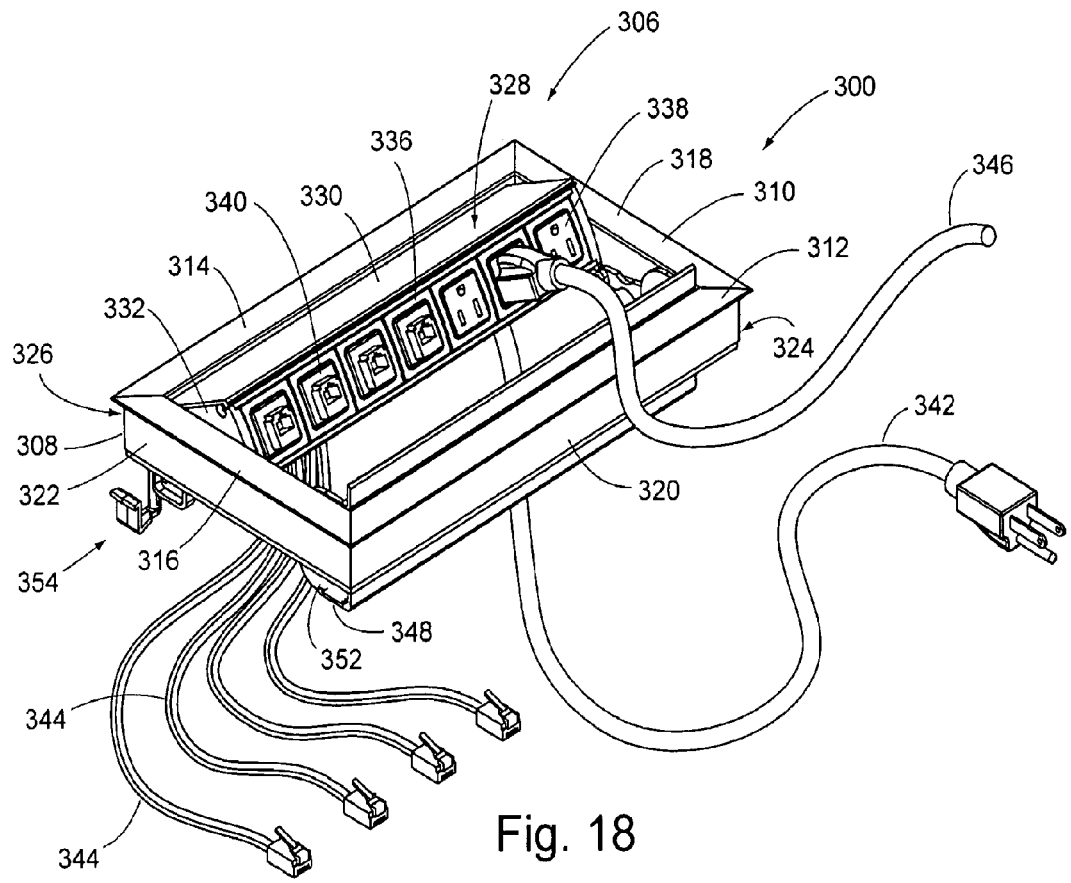
FIG. 18 is a perspective view of one embodiment of a one touch pivotable, expandable power and data center in accordance with the invention.
Figure 78:
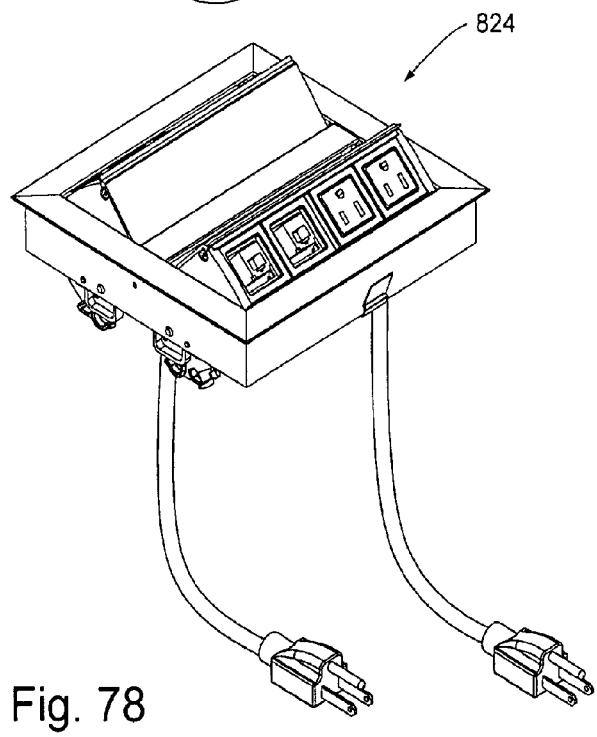
FIG. 78 represents another embodiment in perspective view of a power and data center in accordance with the invention.
Figure 79:
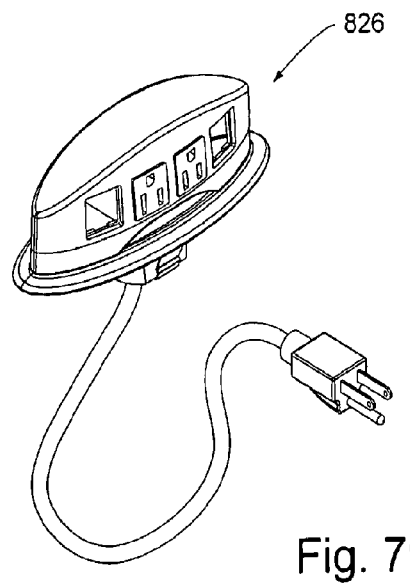
FIG. 79 illustrates a still further embodiment in perspective of a power and data center in accordance with the invention.
Figure 80:
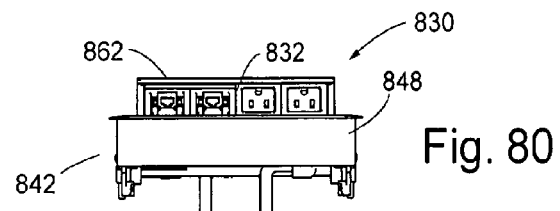
FIG. 80 is a front, elevation view of a power and data center in accordance with the invention.
Figure 81:
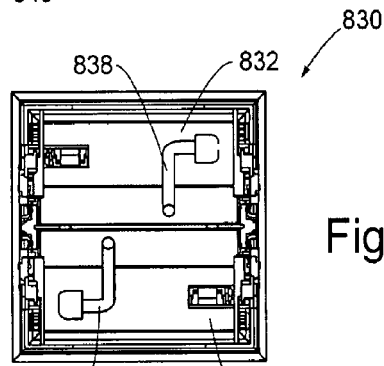
FIG. 81 is an underside view of the power and data center shown in FIG. 80.
Figure 82:
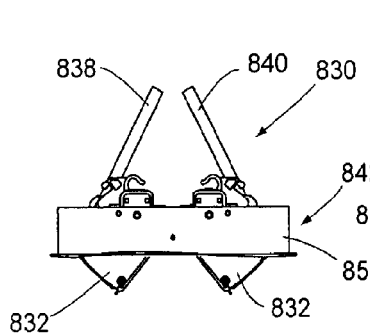
FIG. 82 is an upside down left-end elevation view of the power and data center shown in FIG. 80.
Figure 83:
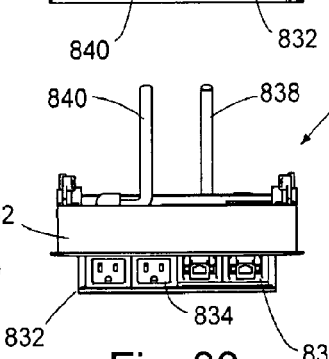
FIG. 83 is an upside down, elevation view of the power and data center shown in FIG. 80.
Figure 84:
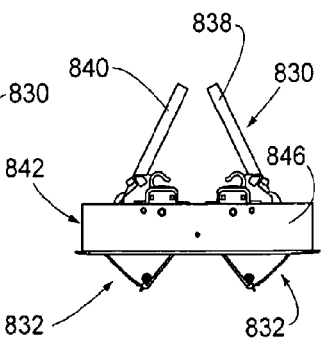
FIG. 84 is a right-side, upside down elevation view of the power and data center shown in FIG. 80.
Figure 85:
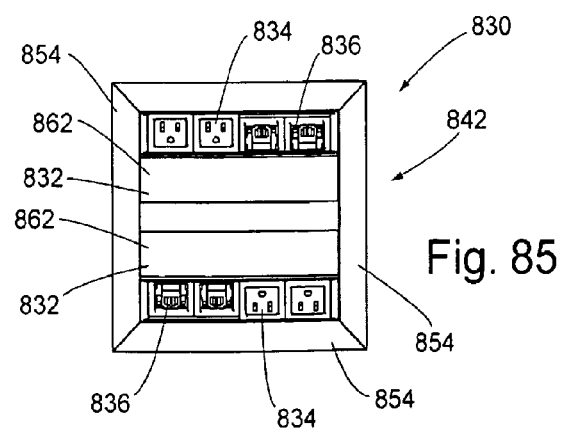
FIG. 85 is a top, plan view of the power and data center shown in FIG. 80.

The principles of the invention are disclosed, by way of example, in latching components utilized with various configurations of power and data centers as illustrated in FIGS. 80-99. For purposes of describing the invention principles, other power and data centers and concepts associated therewith are first described and illustrated in FIGS. 1-79. More specifically, certain of FIGS. 18-79 illustrate an embodiment referred to herein as an expandable power and data center 300. Others of the drawings of FIGS. 18-79 illustrate a second embodiment of a power data center, referred to as an expandable power and data center 600. In addition to the foregoing, other power and data centers showing concepts associated with a latching mechanism and a use of a connecting clip are particularly illustrated in FIGS. 52-79. The expandable power and data centers 300, 600 provide several advantages. Expandable power and data centers are adapted to support variable numbers of electrical devices (such as power receptacles) and various numbers of communication devices (such as data ports) and the like.

To more completely describe prior art associated with power and data centers, the following paragraphs describe an embodiment of a rotatable power and data center with storage area 100 as illustrated in FIGS. 1-17. This prior art power and data center 100 is disclosed in Byrne, U.S. Pat. No. 6,290,518 B1 issued Sep. 18, 2001. Following the description of the prior art power and data center 100 as illustrated in FIGS. 1-17, the expandable power and data centers 300, 600 are described herein with respect to FIGS. 18-51. Thereafter, certain types of latching mechanisms and connection clips are described with respect to FIGS. 52-79. Following that description, latching and connecting mechanisms in accordance with the invention are described with respect to FIGS. 80-99.

The power and data center with storage area 100 provides for access, work surface level, to electrical power, voice/data signals and other types of electrical and/or communications input/output. The power and data center 100 is adapted to be maintained in a closed, retracted position, while still retaining the capability of interconnection of electrical and communication devices. In addition, the power and data center 100 is adapted to facilitate interconnection of electrical and communication lines when a rotatable carriage of the power and data center 100 is moved to an open, extended position. Advantageously, the positioning of the rotatable carriage while in the open, extended position and the positional and structural relationship of components of the power and data center 100 serve to facilitate interconnection of electrical and communication lines, through providing a relatively "large" and "open" access area.

The power and data center includes a carriage which can be readily assembled and disassembled from other components of the rotatable power and data center, without any substantial complexity or the need for any specific tools. In addition, and as earlier mentioned, the relationship of various components of the rotatable power and data center serves to facilitate interconnection of electrical and communication lines through providing a relatively "open" access area when the power and data center is in an open, extended position. In addition, with the configuration of a rotatable power and data center in accordance with the invention, a relatively large "storage" area is provided within a stationary housing of the power and data center, without the storage area being limited in depth by any elements of the power and data center. The relatively large and deep storage area facilitates the storing of wire or cable excess.

In accordance with another aspect of the rotatable power and data center 100, the power and data center facilitates use of electrical receptacles and communication ports, even when the power and data center is in a closed, retracted position. Still further, with respect to the depth of the power and data center, it can be constructed with a relatively "thin" sectional profile or depth. That is, there is no need to require a housing or carriage to extend below the bottom portion of a work surface. Accordingly, users are not subjected to a loss of leg room or potential injury from structural elements projecting downward below the bottom of the work surface. In brief summary, the rotatable power and data center 100 in accordance with the invention primarily facilitates use of electrical receptacles and communication ports, even when the power and data center is in a closed, retracted position. In addition, the overall structure of the power and data center 100 facilitates a storage area for storing wire or cable excess.

Figure 1:
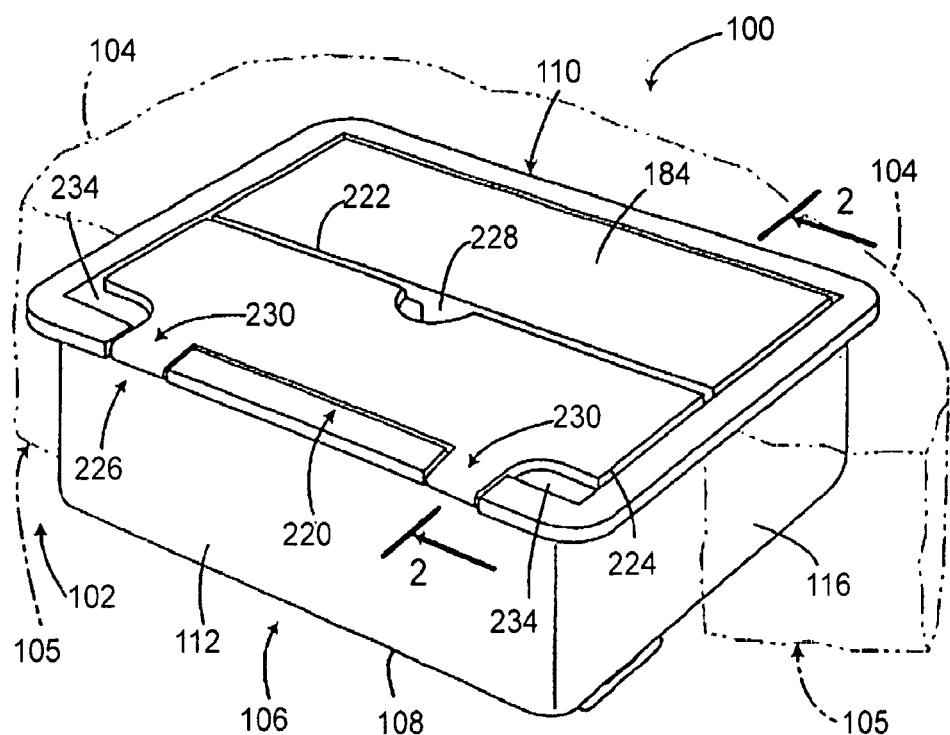
FIG. 1 is a perspective view of an embodiment of a prior art rotatable power and data center with storage area in accordance with the invention, with the rotatable power and data center illustrated in a closed, retracted position, and with a portion of an associated work station surface shown partially broken away, in phantom line format.

More specifically, with reference to the drawings, the power and data center 100 as illustrated in FIG. 1 is adapted to be mounted within a slot or opening, such as the slot 102 formed within a furniture component. The furniture component may include, for example, a work surface such as the work surface 104 which is partially depicted in "cut-out" format in FIGS. 1-5. Work surface 104 can, for example, be the working surface of a desk or similar furniture component. Although not specifically shown in the drawings, the slot 102 may be rectangular or of a similar shape, for purposes of appropriately fitting and securing the power and data center 100.

The power and data center 100, as particularly shown in FIGS. 1-5, includes a stationary housing 106, which may comprise a rectangular sleeve 108 and a horizontal flange or lip 110. The rectangular sleeve 108 will be of a sufficient depth so as to appropriately cover and protect the electrical and communication components as described in subsequent paragraphs herein. However, in accordance with the invention, the rectangular sleeve 108 advantageously may have a depth which is less than the depth of the work surface 104. That is, a bottom 105 of the work surface 104 will extend below the bottom of the rectangular sleeve 108. This thin "profile" or short depth of the rectangular sleeve 108 (and the fact that other components of the power and data center 100 do not need to extend below the bottom of the rectangular sleeve 108) advantageously provides additional leg room to the user and does not subject the user to potential injury or other problems associated with structural elements of the power and data center 100 extending below the bottom of the work surface 104. The rectangular sleeve 108 is vertically disposed and includes a frontal wall 112 and two opposing vertical side walls 114, 116. The rectangular sleeve 108 also includes a rear vertical wall 118, with the front wall 112, side walls 114, 116 and rear vertical wall 118 integrally or otherwise connected together with appropriate means. These walls 112, 114, 116 and 118 form a rectangular box or sleeve-like structure 108 for protecting the electrical and communication components associated with the power and data center 100.

Integral with or otherwise appropriately connected to the rectangular sleeve 108 is the horizontal flange or lip 110. As shown primarily in FIG. 1, the horizontal flange or lip 110 is also rectangular in shape and should be of an appropriate size so as to provide support on the work surface 104 for the power and data center 100 within the slot 102. The rectangular sleeve 108 may be appropriately sized and the power and data center 100 may be configured so that the flange or lip 110 is supported on the upper portion of the work surface 104, when the stationary housing 106 is workably positioned within the slot 102. Although the horizontal flange or lip 110 provides a relatively secure supporting relationship for the stationary housing 106 with the work surface 104, additional means can be provided for more rigidly securing the power and data center 100 to the work surface 104. One example of such a connecting arrangement in accordance with the invention is described in subsequent paragraphs herein.

Figure 5:
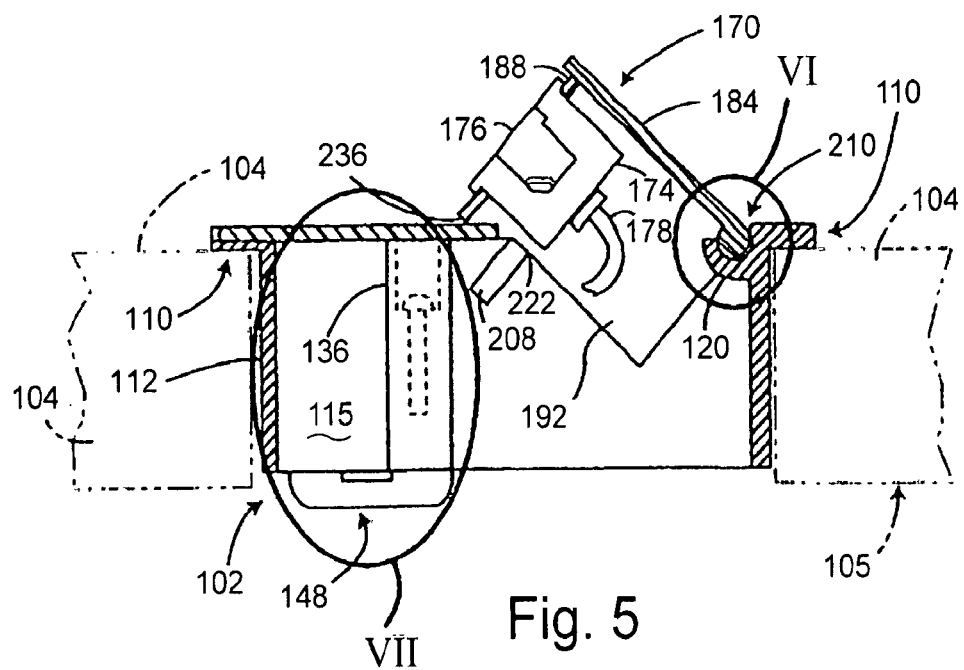
FIG. 5 is a sectional, end view of the rotatable power and data center, taken along lines 5-5 of FIG. 4.
Figure 6:
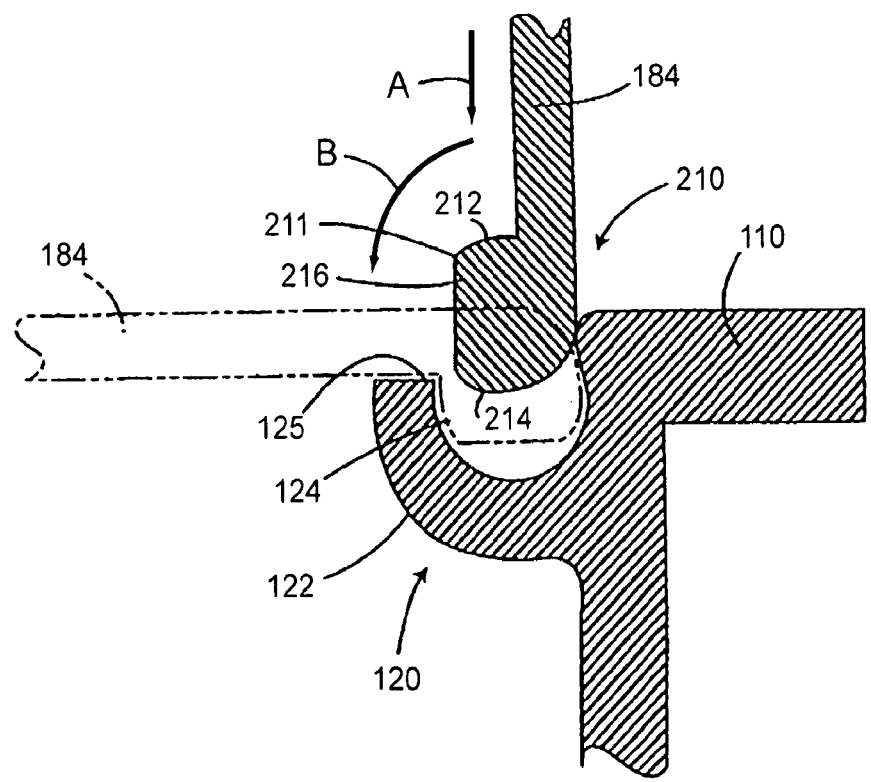
FIG. 6 is a partial, enlarged view of the corresponding identified portion of FIG. 5, showing the releasable coupling of the carriage of the rotatable power and data center with a rear portion of a stationary housing of the power and data center.
Figure 11:
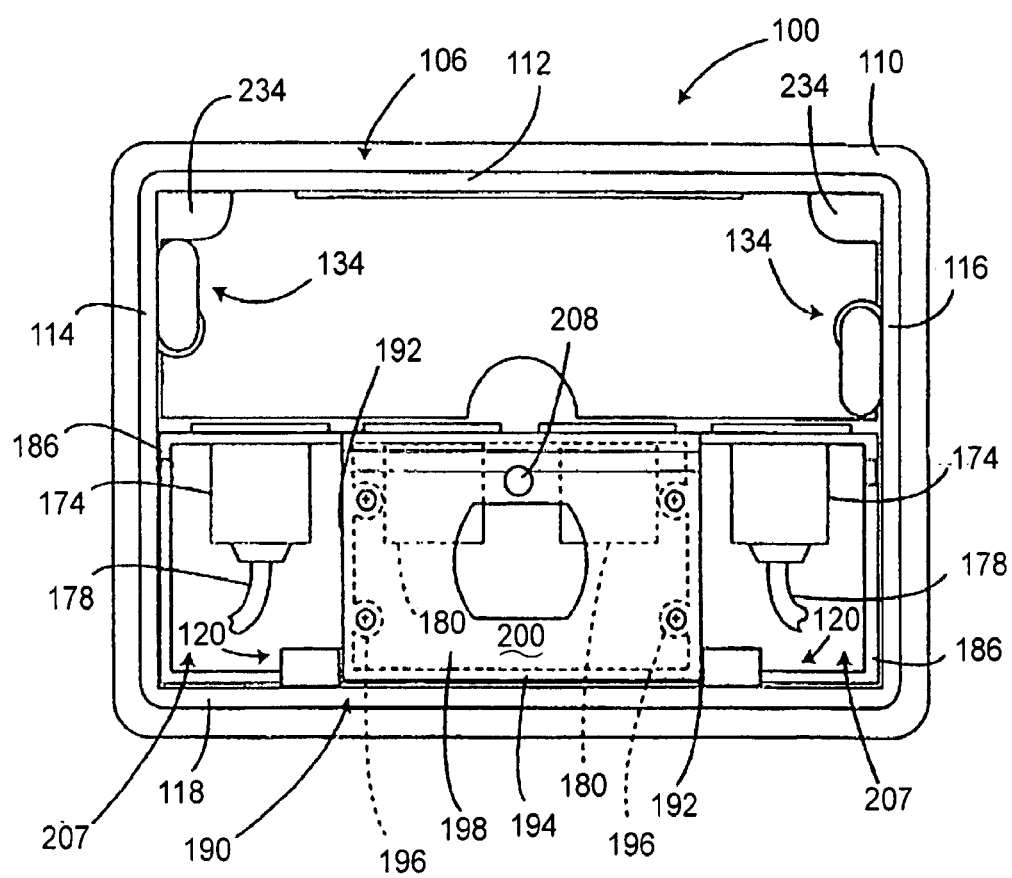
FIG. 11 is an underside view of the rotatable power and data center, with the cover and the carriage shown in a closed, retracted position.
Figure 12:
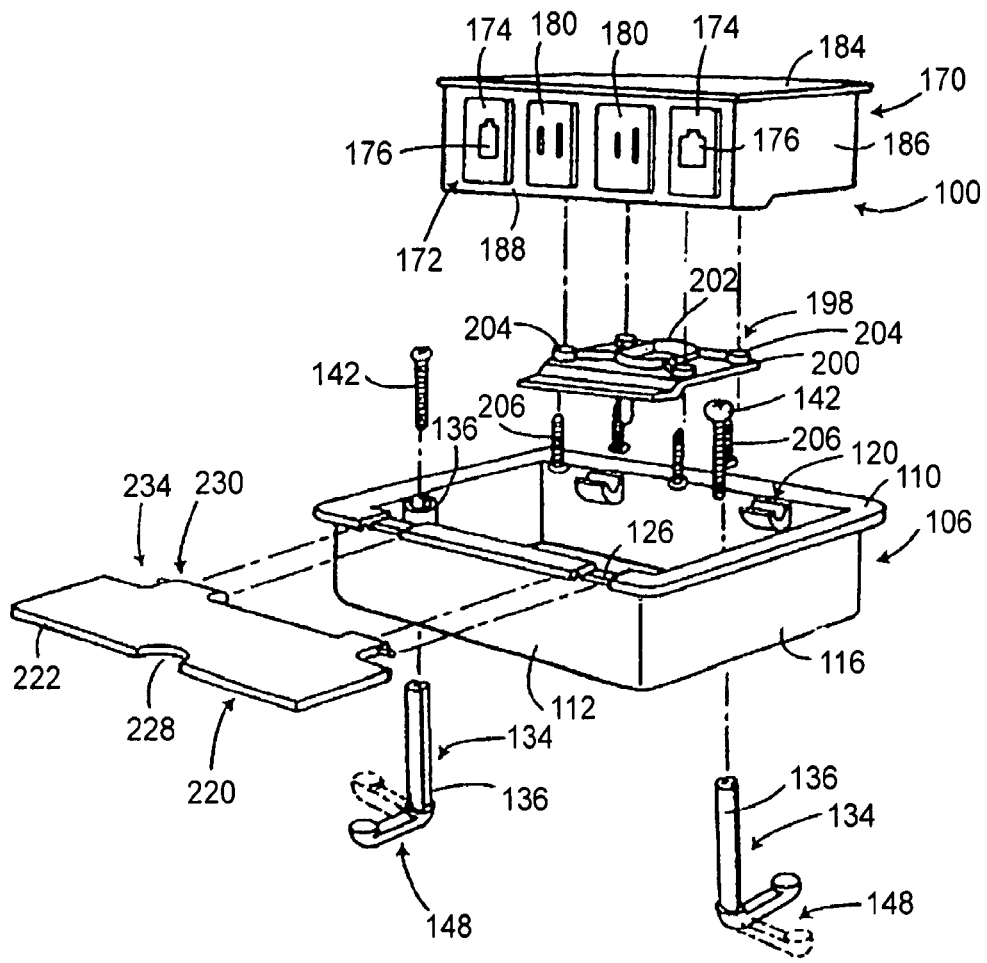
FIG. 12 is an exploded, perspective view of the rotatable power and data center illustrated in FIG. 1, showing the structural relationship between the carriage, cover, stationary housing, coupling connectors and interconnecting means for connecting together various elements of the rotatable power and data center.

With reference primarily to FIGS. 2, 5, 6, 11 and 12, the stationary housing 106 also includes a pair of carriage pivot flanges 120 positioned on an inner portion of the rear vertical wall 118, as primarily shown in FIG. 12. Each carriage pivot flange 120 is integral with or otherwise appropriately secured to an inner surface of the rear vertical wall 118. As shown primarily in FIG. 6, with respect to one of the pivot flanges 120, each pivot flange 120 includes an arcuate portion 122 which forms, with the rear vertical wall 118, a substantially U-shaped channel 124. However, the arcuate portion 122 includes a channel edge 125 which extends "beyond" a vertically disposed position (as viewed in FIG. 6) which would exist with a channel 124 which is "exactly" U-shaped. That is, the radius and arc of the arcuate portion 122 extends greater than 180E, which would exist with a channel of exact U-shaped proportions. With the edge 125 extending as illustrated in FIG. 6, the arcuate portion 122 and the radius of the formed U-shaped channel 124 may be appropriately sized so as to provide suitable positioning and rotation of a carriage portion of the power and data center 100 as described in subsequent paragraphs herein. As also described in subsequent paragraphs, the sizing and shape of the carriage pivot flange 120 provides a means for securing a carriage to the stationary housing 106, while correspondingly facilitating removal of the carriage from its releasable interconnection with the stationary housing 106, when the carriage is in a specific orientation.

Figures 3, 4:
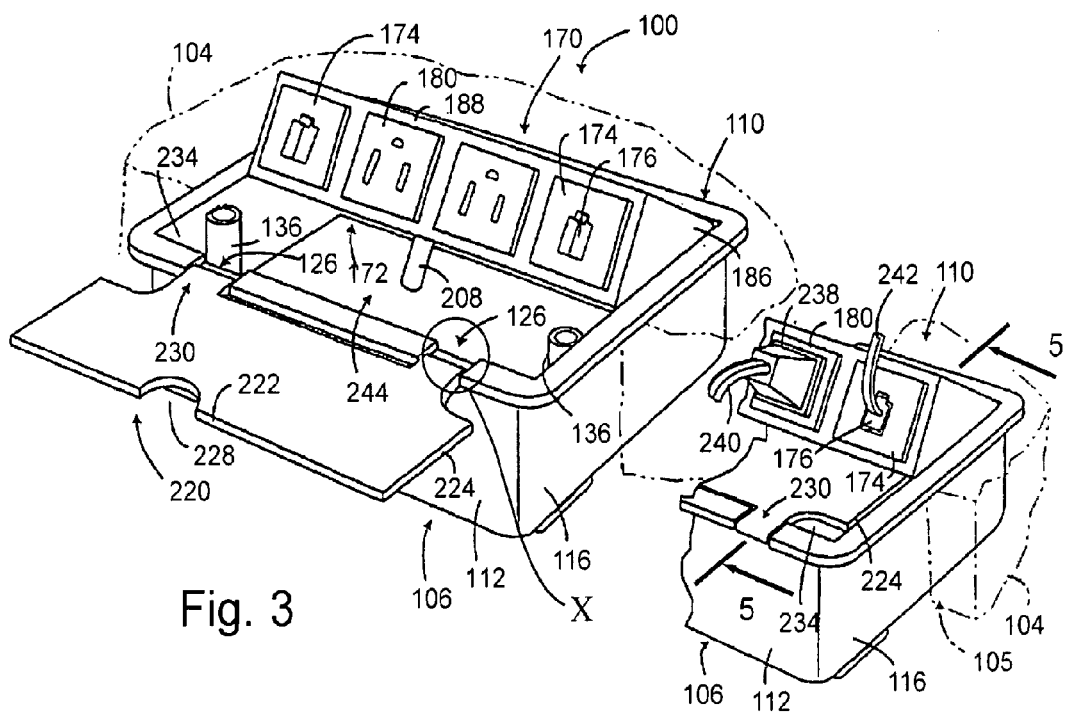
FIG. 3 is a perspective view of the rotatable power and data center illustrated in FIG. 1, with the carriage of the power and data center in an open position to illustrate various elements thereof, and with the cover illustrated in its 180E position.
FIG. 4 is a partial, perspective view (in a somewhat enlarged format) of a portion of the rotatable power and data center, with the power and data center in an open, extended position, the cover returned to its closed position and interconnection of an electrical plug-type cord and communication line to an electrical receptacle and data port, respectively, of the power and data center.
Figure 10:
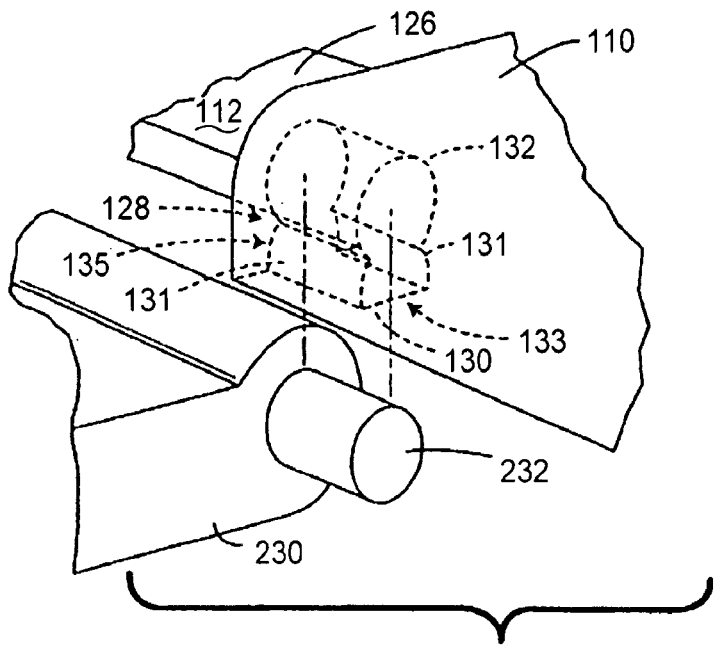
FIG. 10 is a partial, enlarged and exploded view of the corresponding identified portion of FIG. 3, showing elements associated with pivotable and releasable interconnection of the cover with the stationary housing.

With reference to FIGS. 3, 10 and 12, the horizontal flange or lip 110 of the stationary housing 106 also includes a pair of appropriately sized cut-outs or connecting slots 126, each spaced above the front wall 112 an equal distance from associated side walls 114, 116. With reference particularly to FIG. 10, the horizontal flange or lip 110 also includes a pair of cover connecting chambers 128, each formed in opposition to the other adjacent a corresponding one of the cut-outs or connecting slots 126. In FIG. 10, only one of the cover connecting chambers 128 is shown, specifically the cover connecting chamber 128 associated with the specifically identified connecting slot 126 illustrated in FIG. 3 and positioned to the right of the specifically identified connecting slot 126. The other cover connecting chamber 128 is located in an opposing configuration to the specific cover connecting chamber 128 shown in FIG. 10, and is a mirror image thereof. Both of the cover connecting chambers 128 associated with the specifically identified connecting slot 126 illustrated in FIG. 3 and FIG. 10 are shown in hidden-line format in FIG. 10B. With reference to the cover connecting chamber 128 shown in FIG. 10, the chamber 128 includes a lower bore 130 having three sides which form a substantially box-like configuration. The lower bore 130 includes a pair of opposing side walls 131. The bore 130 also includes an opening 133 at a lower portion having a rectangular-shaped configuration, with a width sufficient so as to insert a pivot mandrel 232 also shown in FIG. 10 and described in subsequent paragraphs herein. Further, the lower bore 130 also includes an opening 135 at its forward position, again so as to allow insertion of the pivot mandrel 232. At its top portion, the lower bore 130 opens to a substantially cylindrical aperture 132 positioned immediately above the lower bore 130 within the horizontal flange or lip 110. The diameter of the substantially cylindrical aperture 132 is also sufficient so as to receive a corresponding one of the pivot mandrels 232. As described in subsequent paragraphs herein, the pivot mandrels 232 and the cover connecting chambers 128 provide a means for removably securing a cover 220 of the power and data center 100 to the stationary housing 106.

With reference primarily to FIGS. 2, 5, 7-9 and 12, the stationary housing 106 includes a pair of coupling connectors 134 associated therewith. The coupling connectors 134 are utilized to removably secure the stationary housing 106 of the power and data center 100 to the work surface 104. More specifically, each of the coupling connectors 134 includes a cylindrical bushing 136 which is vertically oriented and integrally coupled with or otherwise secured to the stationary housing 106. One of the bushings 136 is located on an inner surface 115 of side wall 114, while the other bushing 136 is located in an opposing configuration on an inner surface of the other side wall 116. For purposes of brevity, the structural configuration of only one of the coupling connectors 134 will be described, it being understood that the configuration of the other coupling connector 134 is substantially identical.

Within each of the bushings 136 is a vertically disposed cylindrical aperture 138. The cylindrical aperture 138 includes a first cylindrical portion 140 having a diameter sufficient so as to receive the head 143 of a threaded screw 142, in a counter-sunk configuration. That is, the longitudinal length of the first cylindrical portion 140 allows for the threaded screw 142 to be positioned so that the head 143 is below the top of the bushing 136 when the threaded screw 142 is assembled with the coupling connector 134. The cylindrical aperture 138 further includes a second cylindrical portion 144 having a diameter as primarily shown in FIG. 7A. At the lower portion of the cylindrical aperture 138, the aperture 138 includes a third substantially cylindrical portion 145, with a diameter substantially larger than the diameter of the threaded second cylindrical portion 144. A cross section of only the bushing 136, showing the third substantially cylindrical portion 145, is illustrated in FIG. 7B. As shown in FIG. 7B, although the portion 145 is substantially cylindrical in configuration, the inner surface of the bushing 136 (which forms the aperture 138) includes an arcuate-shaped detent 146 which acts so as to essentially narrow the diameter of the third substantially cylindrical portion 145 within an arc of the maximum, circular cross-sectional area of the cylindrical portion 145 as illustrated in FIG. 7B.

The coupling connector 134 further comprises a coupler 148 having an upstanding sleeve portion 150 and a horizontally disposed foot 152 integrally formed with or otherwise secured to the lower end of the upstanding sleeve portion 150. As primarily illustrated in FIGS. 8, 9 and 12, the upstanding sleeve portion 150 is formed of a substantially cylindrical portion 154 having an arcuate-shaped sill 156, with a cross-sectional configuration as primarily shown in FIGS. 8 and 9. The sill 156 is preferably integrally formed with the substantially cylindrical portion 154 of the upstanding sleeve portion 150. As described in subsequent paragraphs herein with respect to operation of the coupling connectors 134, the arcuate-shaped sill 156 is adapted to abut the arcuate-shaped detent 146 of the bushing 146 when the stationary housing 106 is secured to the work surface 104. A threaded aperture 158 extends at least partially longitudinally through the upstanding sleeve portion 150. The threaded aperture 158 is adapted to threadably receive the connecting screw 142. The foot 152 includes a leg 160 extending from the underside of the upstanding sleeve portion 150. A boss 162 projects upwardly from the distal section of the leg 160.

The operation of the coupling connectors 134 in removably securing the stationary housing 106 and associated power and data center 100 to the work surface 104 will now be described. Each of the couplers 148 is first inserted from the underside of stationary housing 106 (as shown in FIG. 12) into a corresponding one of the bushings 136. More specifically, the upstanding sleeve portion 150 is inserted into the third substantially cylindrical portion 145, so that the substantially cylindrical portion 154 and arcuate-shaped sill 156 are received within the third substantially cylindrical portion 145. The relative sizes of the bushings 136 and the couplers 148 are such that the sills 156 of the upstanding sleeve portions 150 are positioned relative to the detents 146 of the bushings 136 so as to appropriately cooperate with the same to allow insertion of the substantially cylindrical portions 154 and sills 156 into the third substantially cylindrical portion 145 of the bushings 136. The connecting screws 142 are then inserted into the first cylindrical portions 140 of the bushings 136 from above the stationary housing 106, and threadably secured within the threaded apertures 158 of the upstanding sleeve portions 150.

Figure 7:
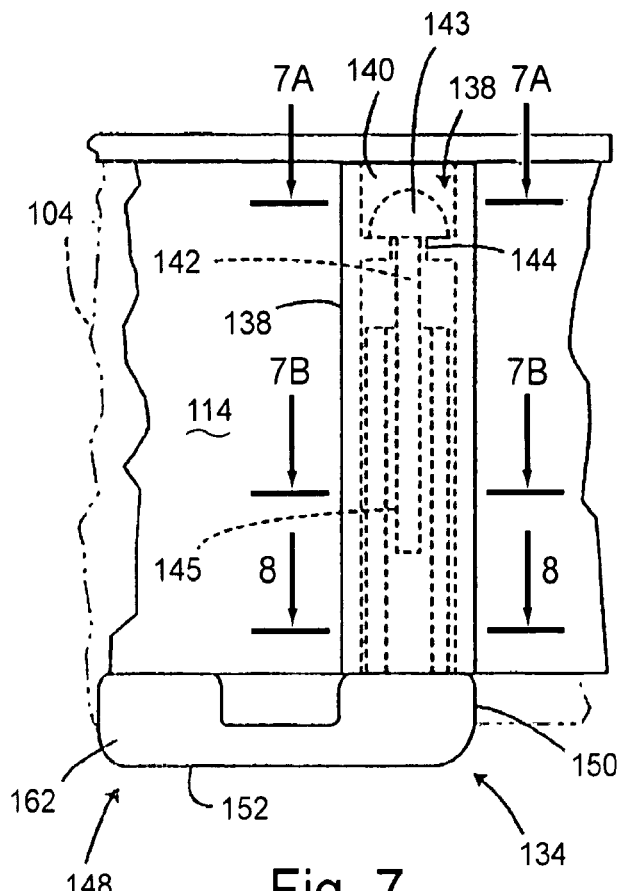
FIG. 7 is a partial, enlarged view of the corresponding identified portion of FIG. 5, showing one of the coupling connectors of the stationary housing, utilized to secure the stationary housing to the work surface.
Figure 7A:
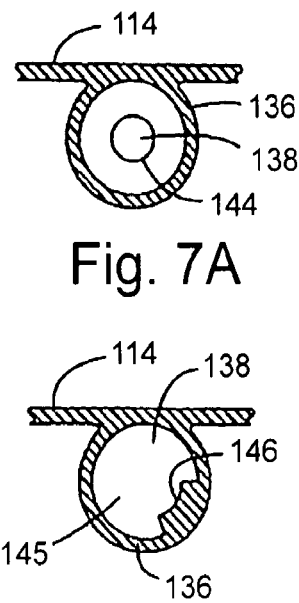
FIG. 7A is a sectional, plan view of the coupling connector illustrated in FIG. 7, taken along lines 7A-7A of FIG. 7.
Figure 7B:
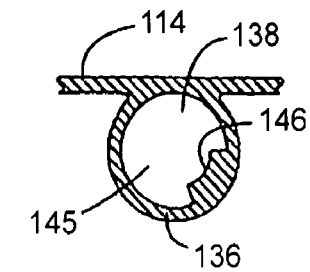
FIG. 7B is a sectional, plan view of the coupling connector illustrated in FIG. 7, taken along lines 7B-7B of FIG. 7, but is limited to a view of only the bushing of the coupling connector.
Figure 8:
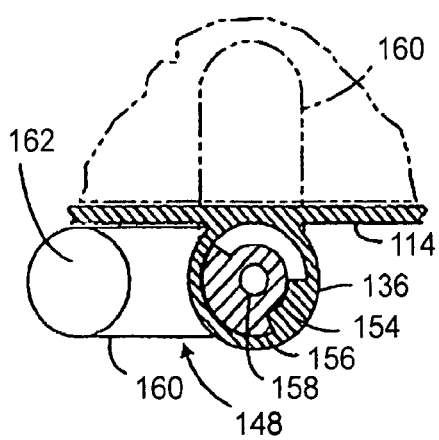
FIG. 8 is a sectional, plan view of the coupling connector illustrated in FIG. 7, taken along lines 8-8 of FIG. 7 and illustrating (in solid-line format) the coupling connector in a position which allows removal of the stationary housing from the work surface.

For purposes of then inserting the stationary housing 106 and the coupling connectors 134 into the slot 102 of the work surface 104, the couplers 148 are positioned as shown in FIGS. 7 and 8, and as further shown in solid-line format in FIG. 12, with the feet 152 positioned so that the legs 160 extend parallel to the side walls 114, 116 of the stationary housing 106. It is seen that for the legs 160 to be extended in this parallel configuration with the upstanding sleeve portions 150 inserted into the bushings 136, the detents 146 and arcuate-shaped sills 156 must be of a relative configuration to allow this specific positioning of the legs 150. Again, such relative positioning is illustrated in FIG. 8.

With this configuration, the rectangular sleeve 108 of the stationary housing 106 can be inserted into the slot 102 of work surface 104. After such insertion, the connecting screws 142 can each be turned clockwise (as viewed from above the stationary housing 106 and in the direction illustrated in FIGS. 8 and 9). With reference first to FIG. 8, as the connecting screw 142 is turned clockwise, it will correspondingly rotate the substantially cylindrical portion 154 of the upstanding sleeve portion 150. With this clockwise rotation, the substantially cylindrical portion 154 will continue to rotate until the sill 156 abuts one side of the corresponding detent 146 of the bushing 136. This abutment will then prevent any further clockwise and simultaneous rotational movement of the connecting screw 142 and threadably secured sleeve portion 150, relative to the corresponding bushing 136. With this clockwise rotation of connecting screw 142, the foot 152 will correspondingly rotate in a clockwise direction from its position as shown in FIG. 8 to the position shown in FIG. 9. At this position, with the detent 146 abutting the sill 156, further rotational movement of the sleeve 150 and leg 152 is prevented. Also, in this position, the boss 162 is located immediately beneath an underside of the work surface 104. Continued rotation of the connecting screw 142 will thereby cause upward movement of the upstanding sleeve portion 150 within the bushing 136. Such upward movement will also cause corresponding upward movement of the foot 152. This upward movement will continue until the boss 162 securely engages the underside portion of the work surface 104. In this manner, the stationary housing 106 can be readily secured within slot 102 of the work surface 104.

Figure 9:
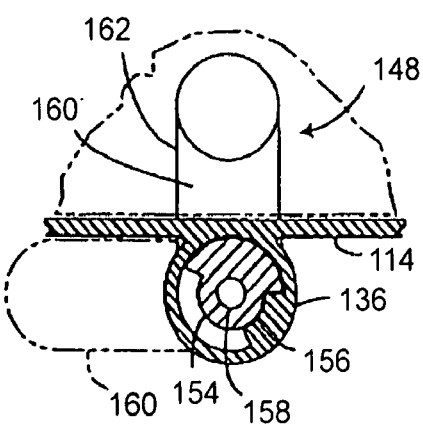
FIG. 9 is a sectional, plan view of the coupling connector of FIG. 7, similar to the illustration of FIG. 8, but instead showing the coupling connector in its locked position (in solid-line format), whereby the stationary housing is secured to the work surface.

When it is desired to disassemble the power and data center 100, including removal of the stationary housing 106 from the slot 102 of work surface 104, the connecting screws 142 can be rotated in a counter-clockwise direction as seen from the top portion of the stationary housing 106 (and as also viewed in FIGS. 8 and 9). Such rotation of the connecting screws 142 will cause corresponding rotation of the upstanding sleeve portions 150, until the sills 156 of the sleeve portion 150 again abut opposing edges of the detents 146. This abutment is illustrated in FIG. 8, and the abutment prevents any further counter-clockwise rotation of the couplers 148. In this position, however, the legs 160 are correspondingly positioned under the stationary housing 106, substantially parallel to the side walls 114, 116 of the stationary housing 106, and away from the underside portion of the work surface 104. Further counter-clockwise, rotational movement of the connecting screws 142 will "loosen" the couplers 148 and allow the same to "drop" within the bushings 136 of stationary housing 106. Such movement will facilitate removal of the stationary housing 106 from the work surface 104.

It is to be understood that proper operation of the coupling connectors 134 will require proper sizing of various components, including relative sizes of the sills 156 and detents 146. For example, these elements must be properly sized so that the legs 160 are allowed rotational movement through an arc of approximately 90E, thereby allowing proper connection and disconnection of the feet 152 from the underside portion of the work surface 104. If, for example, rotational movement of greater than 180E was permitted through the relative sizing of the detents 146 and sills 156, the coupling connectors 134 would not properly operate.

One advantage of the use of the coupling connectors 134 will be apparent. Specifically, the coupling connectors 134 allow the stationary housing 106 to be rigidly (albeit removably) secured to the work surface 104, without requiring any "bulky" or otherwise substantial structural elements extending below the underside portion of the work surface 104. Accordingly, connecting elements do not hamper the user's leg room or otherwise subject the user to possible injury as a result of underhanging structure elements. Further, as earlier mentioned, it is advantageous for the stationary housing 106 to have a depth which is less than the depth of the work surface 104. Again, with the relatively "low profile" in depth of the stationary housing 104, the user's leg room is not hampered by such underhanging structure. However, although the stationary housing 106 advantageously does not extend below the underside of the work surface 104, the coupling connectors 134 provide a means for rigidly and removably securing the stationary housing 106 to the work surface 104.

With respect to the lack of connecting elements hampering the user's leg room or otherwise extending below the underside portion of work surface 104, the requisite positioning of the connecting screws 142 is particularly noted. As apparent from FIGS. 7, 8 and 9, the relative structure of the connecting screws 142, the threaded aperture 158 and the remaining portions of the upstanding sleeve portion 150 do not require the connecting screws to extend below the underside of the work surface 104. In view of this structure, the connecting screws do not present any impediment to the user's leg room or otherwise subject the user to possible injury.

Turning to other aspects of the power and data center 100, the power and data center 100 also includes a manually operable and rotatable carriage 170. As shown in FIG. 3, the rotatable carriage 170 includes a component section 172 into which a selected number and type of electrical and communication components may be incorporated. These components may generally be assembled in any manner as desired by the purchaser of the power and data center 100. For example, and as shown primarily in FIG. 3, the component section 172 may include receptacle devices comprising voice/data or "communication" receptacles 174 having data ports 176 for purposes of providing communications interfaces, such as conventional RS-232 communication connectors. The data ports 176 may be connected through conventional communications cables 178 (as partially shown in FIG. 11) to an incoming/outgoing conventional communications port located below the work surface 104 at the floor level or at any other conventional location. The incoming/outgoing communications port is not shown in the drawings. However, the concept of utilizing data ports, incoming/outgoing communications components and data service lines are shown, for example, in Timmerman, U.S. Pat. No. 5,575,668 issued Oct. 6, 1995.

Figure 14:
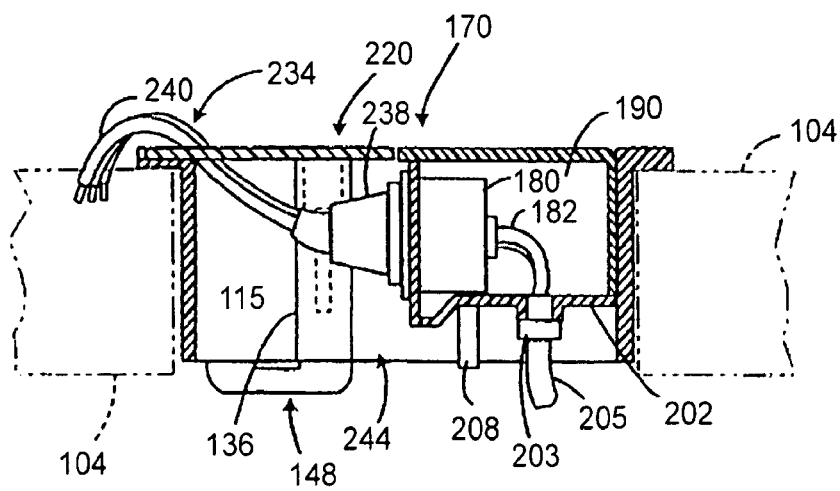
FIG. 14 is a sectional, end view of the rotatable power and data center, taken along lines 14-14 of FIG. 13.

As further shown in FIG. 3, the component section 172 may also include a series of conventional electrical receptacles 180 for supplying power to AC voltage office equipment or similar devices. The electrical receptacles 180 may be interconnected to conventional incoming power cables 182, as illustrated in FIG. 14. The incoming power cables 182 may be energized through interconnection at their distal ends to conventional incoming AC power outlets located at a floor surface or other area. The AC power outlets are not shown in the drawings.

In addition, the component section 172 may include other conventional electrical/communication devices, such as an on-off switch (not shown in the drawings) which may, if desired, be interconnected with other components of the component section 172 so as to provide a single location for energizing or deenergizing both high and low voltage power provided through the component section 172. Still further, if desired, a conventional circuit breaker (also not shown in the drawings) or similar device may be provided and appropriately interconnected for purposes of protection. In addition, a power surge protector (also not shown in the drawings) could be utilized within the component section 172 for purposes of providing protection for sensitive electronic communications equipment which may be energized and interconnected through the component section 172.

As earlier stated, interconnections of the communications cables 178 and incoming power cables 182 to the appropriate receptacles of the component section 172 are conventional in design and do not comprise any portions of the novel concepts of the invention. These types of interconnections are well known in the electrical and communications arts. For example, for purposes of appropriately guiding cables 178 and 182, cable clamps (not shown in the drawings) may be located to the rear of the component section 172 of carriage 170. One type of cable shielding and strain relief for the incoming power cables 182 will be described in subsequent paragraphs herein.

With reference primarily to FIGS. 1-6, 11, 12 and 14, the carriage 170 also includes a top portion 184 which is substantially rectangular in structure as expressly shown in FIG. 1. The carriage 170 also includes a pair of opposing side walls 186 and a substantially rectangular front portion 188. The front portion 188 essentially forms the area where the component section 172 is positioned.

With reference primarily to FIGS. 11 and 12, the carriage 170 may also include inner side walls 192 in an opposing configuration (as shown in FIG. 11), with a rear wall 194 extending therebetween. The inner side walls 192 may include threaded bushings 196, with a pair of the threaded bushings 196 integrally molded with or otherwise secured to an inside surface of each of the inner side walls 192. The threaded bushings 196 are vertically disposed. The middle of the front portion 188, inner side walls 192 and rear wall 194 essentially comprise a substantially rectangular and box-like protected compartment 190 within which the conventional electrical receptacles 180 may be positioned within the front portion 188 of the component section 172. For purposes of covering the underside of the protected compartment 190, a lower cover 198 may be employed as particularly shown in FIG. 12. As shown in FIGS. 11 and 12, the lower cover 198 may have a substantially planar portion 200 with a plug aperture 202 extending therethrough. The planar portion 200 also includes a series of four holes 204. When the lower cover 198 is appropriately positioned at the underside of the protected compartment 190, the holes 204 are coaxial with the threaded bushings 196 in the inner side walls 192. Connecting screws 206 are utilized to secure the lower cover 198 to the underside of the protected compartment 190.

For purposes of clarity, incoming power cables 182 are not shown in either FIG. 11 or FIG. 12. However, as shown in FIG. 14, the incoming power cables 182 may be extended through the plug aperture 202 to the conventional electrical receptacles 180. Also, for purposes of protection of the incoming power cables 182, a strain relief clamp or collar 203 may be coupled in a conventional manner to the exterior of the plug aperture 202 extending outwardly from the lower cover 198. In addition, the multiple incoming power cables 182 may be received within a single cable 205 which is connected to the strain relief collar 203 and which extends to a plug or other device (not shown in the drawings) connectable to an incoming power source (also not shown in the drawings). The configuration of the single cable 205, strain relief collar 203 and the like are relatively conventional in nature, and do not form any of the novel concepts of the invention.

With reference again to FIG. 11, sections of the top portion 184, front portion 188, opposing side walls 186 and inner side walls 192 form a pair of communication channels 207. The communication channels 207 form semi-protected areas where the data ports 176 and interconnected communications cables 178 may be located. However, as earlier described, various other arrangements for the component section 172 may be utilized. Accordingly, the channels 207 may include not only data ports 176, but may also include other electrical/communication receptacles and similar devices. Further, however, with the particular configuration illustrated in FIG. 11, the conventional electrical receptacles 180 and associated incoming power cables 182 are substantially shielded from the data ports 176 and associated communications cables 178. Accordingly, electrical isolation may be provided between the conventional electrical receptacles 180 and communications receptacles 174.

The carriage 170 also includes a projecting stub 208 which extends downwardly from the planar portion 200 of the lower cover 198, as shown in FIGS. 3, 11 and 12. The projecting stub 208 is utilized to assist the user in repositioning the carriage 170 during operation, as described in subsequent paragraphs herein.

Referring to FIGS. 5 and 6, extending rearwardly and downwardly from the top portion 184 of the carriage 170 are a pair of pivot tongues 210 positioned on each side of the rear wall 194 of the carriage 170, and equal distance from the side walls 114, 116. Only one of the pivot tongues 210 is illustrated in FIGS. 5 and 6. Each of the pivot tongues 210 has a cross-sectional configuration as expressly shown in FIGS. 2, 5 and 6. As specifically shown in an enlarged view in FIG. 6, the pivot tongue 210 is formed of a pair of arcuate sections 212 and 214 joined together by a flat section 216. The intersection of the arcuate section 212 and flat section 216 forms an edge 211 as referenced in FIG. 6. Each of the pivot tongues 210 is appropriately sized and configured on the carriage 170 so that each can be fitted into a corresponding one of the U-shaped channels 124 associated with the stationary housing 106.

As shown primarily in FIGS. 5 and 6, with the use of the flat section 216, and the particular shapes and configurations of the remainder of the pivot tongues 210 and the U-shaped channels 124, the pivot tongues 210 can be made to be fitted into the U-shaped channels 124 only when the pivot tongues 210 are substantially vertically disposed as illustrated in solid line format in FIG. 6. This particular configuration of the carnage 170 will be referred to herein as the "vertical orientation" of the carriage 170. After the pivot tongues 210 have been inserted into the U-shaped channels 124 from the vertical orientation as shown in solid line format in FIG. 6 (and indicated by the arrow A in FIG. 6), the pivot tongues 210 can then be rotated counter-clockwise (as indicated by the arrow B in FIG. 6). The carriage 170 can be rotated counter-clockwise as shown in FIG. 6 until the top portion 184 is in a substantially horizontal plane, as shown in dotted line format in FIG. 6. When the top portion 184 and associated carriage 170 is in substantially any position other than one where the top portion 184 is vertically disposed (i.e. the vertical orientation of the carriage 170), the pivot tongues 210 are essentially "locked" within the U-shaped channels 124 of the stationary housing 106, in a manner such that the carriage 170 cannot be removed from this pivotal interconnection with the stationary housing 106. More specifically, with the carriage 170 in the orientation shown in dotted line format in FIG. 6, where the top portion 184 is in a substantially horizontal plane, or when the carriage 170 is in an "open" position as illustrated in FIG. 5 (and described in subsequent paragraphs herein), the edge 211 of each of the pivot tongues 210 is prevented by the edge 125 of the U-shaped channel 124 from "rotating out of" the U-shaped channel 124.

In accordance with the foregoing, the pivot tongues 210 and the U-shaped channel 124 provide a means for the carriage 170 to be readily assembled and disassembled from the stationary housing 106. Advantageously, removably securing the carriage 170 to the stationary housing 106 in accordance with the foregoing requires no tools.

With respect to other elements of the power and data center 100, and with reference primarily to FIGS. 1, 3, 10, 10A, 10B and 12, the center 100 also includes a cover 220 in a substantially rectangular configuration as particularly shown in FIGS. 1 and 3. The cover 220 includes a forward edge 222, side edges 224 and a coupling portion 226 which is located opposite from the forward edge 222. The forward edge 222 includes an opening comprising a finger notch 228 positioned equal distance from each of the side edges 224. The finger notch 228 is utilized to facilitate rotational movement of the cover 220 and carriage 170, relative to the stationary housing 106.

Positioned within the coupling portion 226 of the cover 220 is a pair of pivot arms 230, primarily shown in FIGS. 1 and 3 and positioned equal distance from the side edges 224. Integrally molded with or otherwise connected to each of the pivot arms 230 is a pair of pivot mandrels 232. As primarily shown in FIG. 10B, each of the pivot mandrels 232 extends outwardly from an opposing side of each of the corresponding pivot arms 230. It is to be understood that each of the pivot mandrels 232 associated with a particular one of the pivot arms 230 is essentially a mirror image of the other. The primary purpose of the pivot arms 230 and the pivot mandrels 232 is to provide a means for rotatable and removable interconnection of the cover 220 with the stationary housing 106.

Figure 10A:
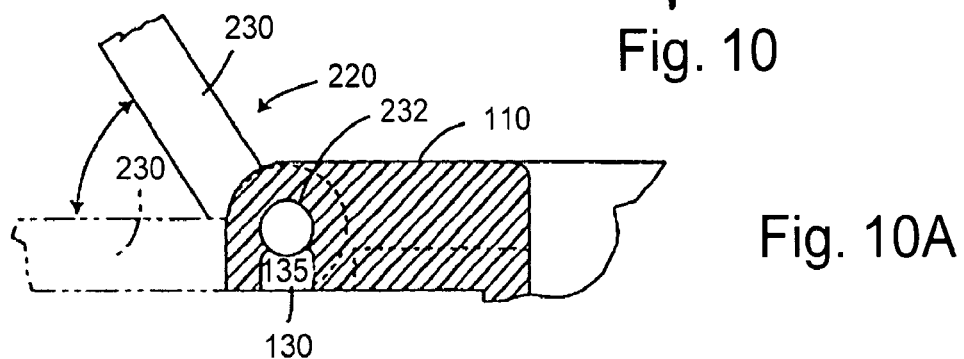
FIG. 10A is a sectional, end view of the interconnection elements illustrated in FIG. 10, showing the interconnection of one of the pivot mandrels of the cover with the stationary housing, when the cover is interconnected with the stationary housing.
Figure 10B:
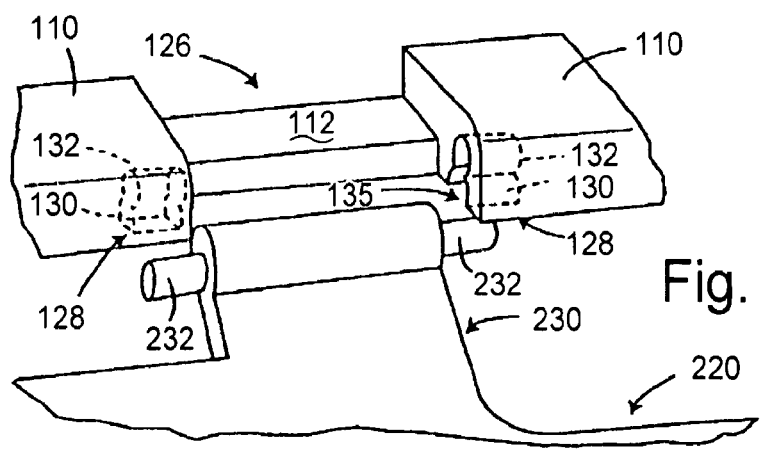
FIG. 10B is a partial, plan view of one of the pivot arms of the cover as illustrated in FIG. 10, showing the pair of pivot mandrels associated with the pivot arm and further showing the general, positional relationship of the pivot arm with the cover connecting slots during interconnection.

For purposes of interconnecting the cover 220 with the stationary housing 106, and with reference primarily to FIGS. 3, 10, 10A, 10B and 12, the cover 220 may first be positioned as shown in FIG. 3. For purposes of description, this particular configuration of cover 220 shown in FIGS. 3 and 12 is described herein as the "180E position." Also, it should be noted that for purposes of interconnecting the cover 220 with the stationary housing 106, the stationary housing 106 must be removed from the work surface 104. With the stationary housing 106 removed from the work surface 104, the cover 220 may be positioned as expressly shown in FIGS. 10 and 10B, with the pivot mandrels 232 located immediately below corresponding ones of the cover connecting chambers 128. After being located in this position, the cover 220 can be moved upwardly so that each of the pivot mandrels 232 associated with a pivot arm 230 is inserted into a corresponding one of the lower bores 130, illustrated in FIGS. 10 and 10B, and previously described herein with respect to the stationary housing 106. After being positioned therein, the pivot mandrels 232 may be forced upwardly, and the resiliency of the chambers 128 will allow the pivot mandrels 232 to be moved upwardly into the substantially cylindrical apertures 132. The position of the pivot mandrels 232 within the substantially cylindrical apertures 132 is illustrated in FIG. 10A. The size of the pivot mandrels 232, relative to the diameters of the substantially cylindrical apertures 132, will allow for relatively free rotational movement of the pivot mandrels 232 within the substantially cylindrical apertures 132, while still maintaining the mandrels 232 within the apertures 132.

To remove the cover 220 from the stationary housing 106, again the stationary housing 106 must be removed from the work surface 104. Thereafter, the user may manually push downward on the pivot arms 230 relative to the stationary housing 106, thereby forcing the pivot mandrels 232 out of the cylindrical apertures 132 and through the lower bores 130. In this manner, the pivot mandrels 232 can be removed from the chambers 128 and the cover 220 can be correspondingly removed from the stationary housing 106.

The positioning of the pivot mandrels 232 in the substantially cylindrical apertures 132 comprises the operative position for use of the cover 220 with the power and data center 100. With the stationary housing 106 then secured to the work surface 104, the cover 220 is free to rotate relative to the stationary housing 106 through the pivot mandrels 232. In the 180E position previously described herein, the cover 220 would essentially lay "flat" on the work surface 104.

The cover 220 also includes another important concept in accordance with one aspect of the invention. More specifically, the cover 220 includes a pair of cable passages 234 formed adjacent the coupling portion 226 and adjacent the side edges 224 of the cover 220, as particularly shown in FIG. 1. As will be described in subsequent paragraphs herein, the cable passages 234 provide a means for maintaining electrical and communications engagement of various electrical and communications devices, even with the power and data center in a closed, retracted configuration.

Figure 2:
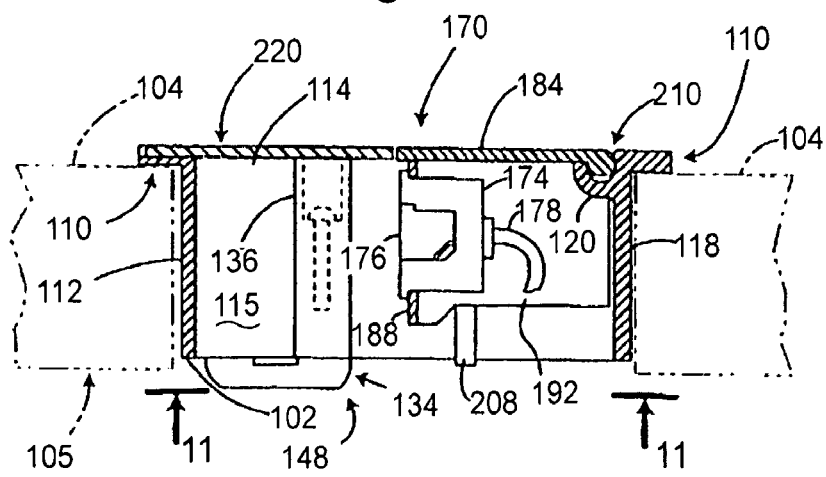
FIG. 2 is a sectional view of the rotatable power and data center illustrated in FIG. 1, taken along lines 2-2 of FIG. 1.

The operation of the power and data center 100 will now be described with respect to all of FIGS. 1-17. After initially being assembled, the power and data center 100 may have a configuration as illustrated in FIGS. 1 and 2. This configuration may be characterized as the "closed, retracted configuration" for the power and data center 100. In this configuration, the cover 220 is in a substantially planar configuration, with the pivot arms 230 abutting the upper surfaces of the slots 126 formed within the horizontal flange or lip 110. In this configuration, and as primarily shown in FIG. 2, the cover 220 can rest not only upon the upper surfaces of the slots 126, but may also partially rest on the upper surfaces of the bushings 136 formed in the side walls 114, 116 of the stationary housing 106. Alternatively, the cover 220 may not necessarily rest on the upper portion of the bushings 136, but instead may be adjacent the tops of the bushings 136. In this configuration, the bushings 136 would still protect against the cover 220 being substantially bent or otherwise damaged through the user accidentally forcing the cover 220 downward near its forward edge 222, thereby misshaping the cover 220. For the cover 220, this configuration is referred to herein as the "closed" configuration.

Also in this closed, retracted configuration of the power and data center 100, the carriage 170 is in a configuration which may be characterized as a "closed" configuration. This configuration is also shown in FIGS. 1 and 2. In this configuration, the top portion 184 is in a substantially horizontal plane, and the pivot tongues 210 are essentially "locked" within the U-shaped channels 124, as shown in dotted line format in FIG. 6. It should be emphasized that) although the relative sizing of the U-shaped channels 124 and the pivot tongues 210 are such that the pivot tongues 210 cannot be forcibly removed from the U-shaped channels 124 when the carriage 170 is in the closed position shown in FIG. 1, the carriage 170 may still be freely rotated, with the pivot tongues 210 rotating within the U-shaped channels 124.

Figure 15:
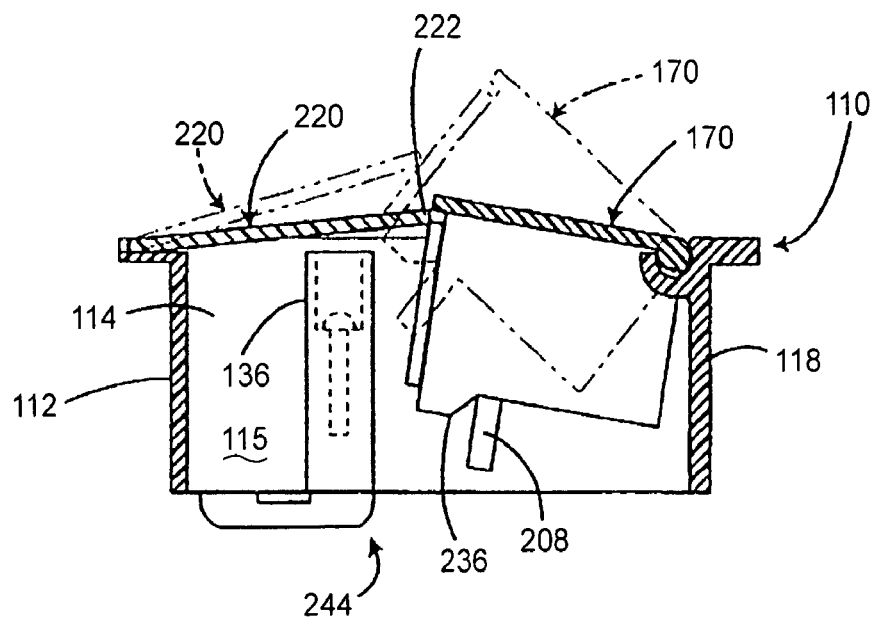
FIG. 15 is a sectional, end view of the rotatable power and data center, similar to FIG. 5 but showing intermediate movement of the cover and carriage from the closed, retracted position to the open, extended position.

When it is desired to utilize the power and data center 100 to energize electrical utility or communication devices, the user may "open" the power and data center 100 by first inserting a finger or thumb into the area forming the finger notch 228 of the cover 220. However, instead of grasping and rotatably moving the cover 220, the user preferably will use the area at the finger notch 228 to actually grasp the carriage 170 so as to rotate the carriage 170 in a clockwise direction as shown in the views of FIGS. 2, 5 and 15. The axis of rotation of the carriage 170 will be substantially through a center line extending longitudinally through each of the coaxial pivot tongues 210. As the carriage 170 is being pivotably rotated from its closed position in a clockwise direction relative to the views of FIGS. 2, 5 and 15, the front portion 188 of carriage 170 will begin to abut the forward edge 222 of the cover 220. This abutment and relative positioning of the cover 220 and carriage 170 is shown in intermediate positions in solid and dotted-line format in FIGS. 15 and 16.

Figure 16:
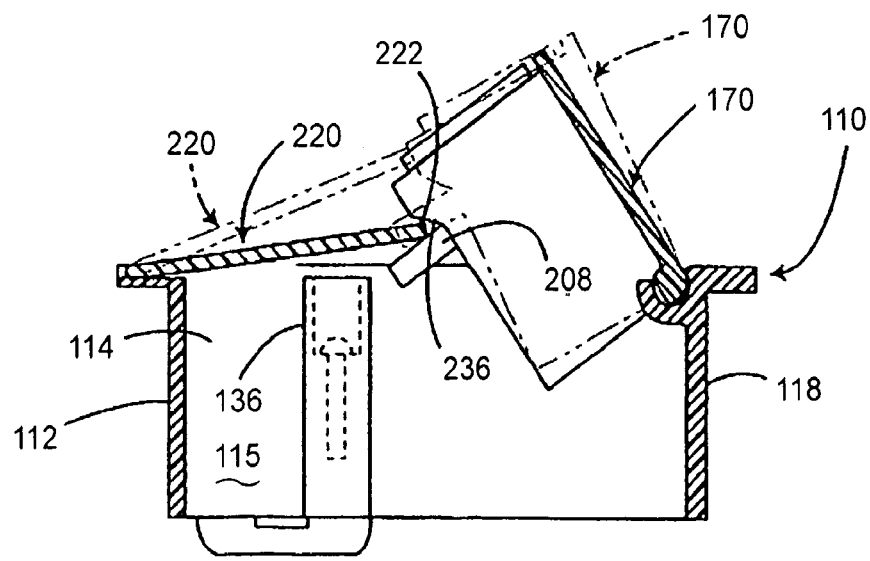
FIG. 16 is a sectional, end view of the rotatable power and data center, similar to FIG. 15 but showing intermediate movement of the carriage and cover between the open, extended position and the closed, retracted position.

The carriage 170 will continue to be rotated clockwise and upwardly until a lower edge 236 (as shown in FIGS. 5, 15 and 16) "clears" the forward edge 222 of cover 220. At that instant, the cover 220 will pivot or "fall" a short distance downwardly, until the forward edge 222 abuts the projecting stub 208 as illustrated in FIG. 16. After clearance of the lower edge 236 from the forward edge 222 of cover 220, the user can then allow the carriage 170 to "fall back" in a direction such that the carriage 170 is rotatably pivoting back through a counter-clockwise direction relative to the views illustrated in FIGS. 5, 15 and 16. The carriage 170 will essentially rotate until it attains a position as primarily shown in FIG. 5. In this position, the lower edge 236 of the front portion 188 is supported on the cover 220 near the forward edge 222.

Figure 17:
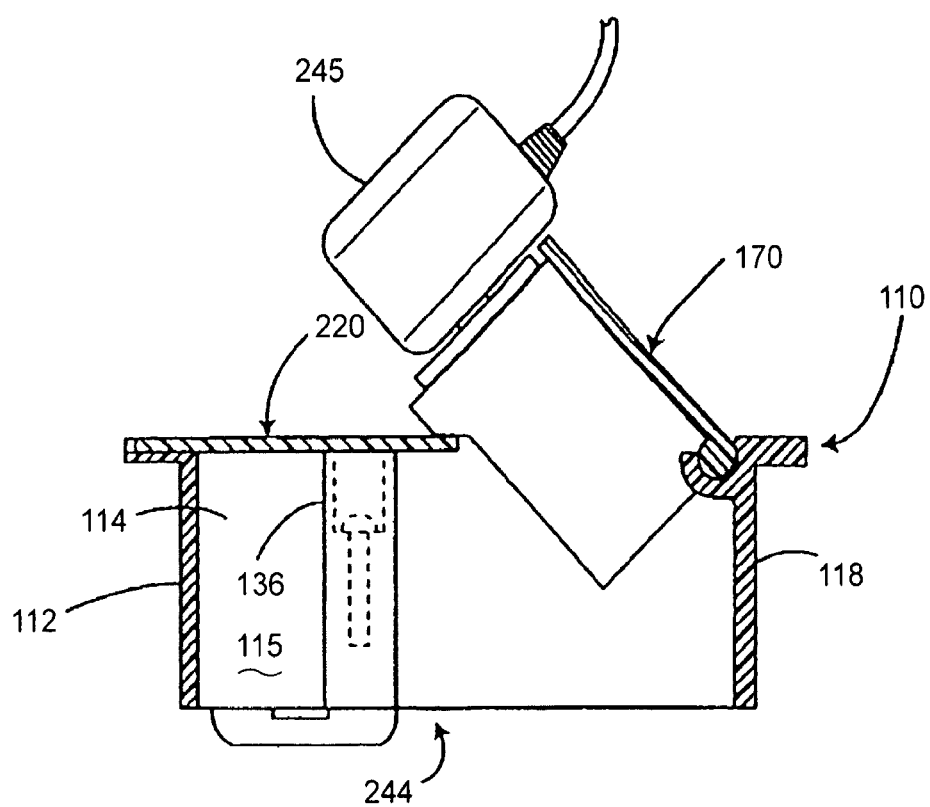
FIG. 17 is a sectional, end view of the rotatable power data center, similar in structure to FIG. 5 but showing interconnection of a relatively large plug-type electrical connector to one of the electrical receptacles when the carriage is in the open, extended position.

As apparent to the reader, the specific, relative positioning of the cover 220 and carriage 170 will depend on the relative sizing of various components of these elements. For example, and as generally shown in this embodiment and particularly FIG. 5, the relative sizing of the various components is such that when the lower edge 236 of the carriage 170 rests on the cover 220, the face of the front portion 188 is positioned essentially at an angle of approximately 45E relative to the horizontal. This particular configuration is also illustrated in FIGS. 3, 4 and 17. In this configuration, the conventional electrical receptacles 180 and the communications receptacles 178 are readily accessible to the user. Accordingly, various electrical utility and communications devices may then be energized through interconnection with their own electrical and communication cables. For example, FIG. 4 illustrates the interconnection of a conventional electrical plug 238 and interconnected electrical cables 240 to one of the conventional electrical receptacles 180. FIG. 4 also illustrates the interconnection of a communication line 242 to one of the communications receptacles 174 comprising a data port 176.

During the rotational and pivotable movement of the carriage 170 relative to the stationary housing 106, the movement is facilitated by the pivotable coupling and interrelationship between the pivot tongues 210 on the carriage 170 and the U-shaped channels 124 of the carriage pivot flanges 120. Also during the movement of the carriage 170 as described in previous paragraphs herein, the cover 220 is also caused to move. This movement is also pivotable and rotatable relative to the stationary housing 106, and facilitated by the pivotable coupling and interrelationship between the pivot mandrels 232 and the cover connecting chambers 128.

The position of the carriage 170 as illustrated in FIG. 5 will be referred to herein as the "open" or "open, extended" position. When it is desired to move the carriage 170 from the open position to the closed position, the user may grasp the carriage 170 and pivot the carriage 170 first in a clockwise rotation (as viewed in FIG. 5). This clockwise, rotational movement will cause the carriage 170 to pivot such that the projecting stub 208 will abut the forward edge 222 of cover 220, as illustrated in solid line format in FIG. 16. Further clockwise, rotational movement of the carriage 170 will cause the projecting stub 208 to move the cover 220 away from its closed position, so that the cover 220 partially pivots in a clockwise, rotational movement, as further illustrated in dotted line format in FIG. 16. This movement of the cover 220 will cause the cover 220 to be moved to a position where the user may readily grasp the cover 220 by the finger notch 228. The user can then rotate the cover 220 toward its 180E position (illustrated in FIG. 3). However, the user only needs to pivotably rotate the cover 220 a sufficient distance so that the carriage 170 may "clear" the forward edge 222 of cover 220 as the user releases clockwise, rotational forces on the carriage 170 and allows the carriage 170, through gravitational forces or otherwise, to pivotably rotate in a counter-clockwise direction back to its closed position as illustrated in FIG. 5. When the carriage 170 rotates back to its closed position, the cooperative relationship between the pivot tongues 210 and U-shaped channels 124 will cause the carriage 170 to be maintained in a closed position, absent external rotational forces. After the carriage 170 has been returned to its closed position, the user can then allow the cover 220 to rotate in a clockwise direction so as to again return to its closed position, as illustrated in FIG. 2.

However, the user also has several other options and advantages associated with the power and data center 100. The user can return the carriage 170 from its open position to the closed position while retaining electrical and voice/data interconnections between the voice/data receptacles 174, conventional electrical receptacles 180 and communication cables 242, electrical plugs 238, respectively. If the user retains electrical and/or voice/data interconnection with electrical utility devices or communication devices while the carriage 170 is in the closed position, the user may allow the cover 220 to completely pivot over to its 180E position, as illustrated in FIGS. 3 and 12. While in this position, and with the carriage 170 in its closed position, cord and cable "excess" from electrical utility devices and communication devices can be stored within a recessed portion 244 formed within the rectangular sleeve 108 of the stationary housing 106. It should be emphasized, again, that the electrical plugs 128 and communication cables 242 can remain energized through the component section 172, while the carriage 170 is in the closed position.

Figure 13:
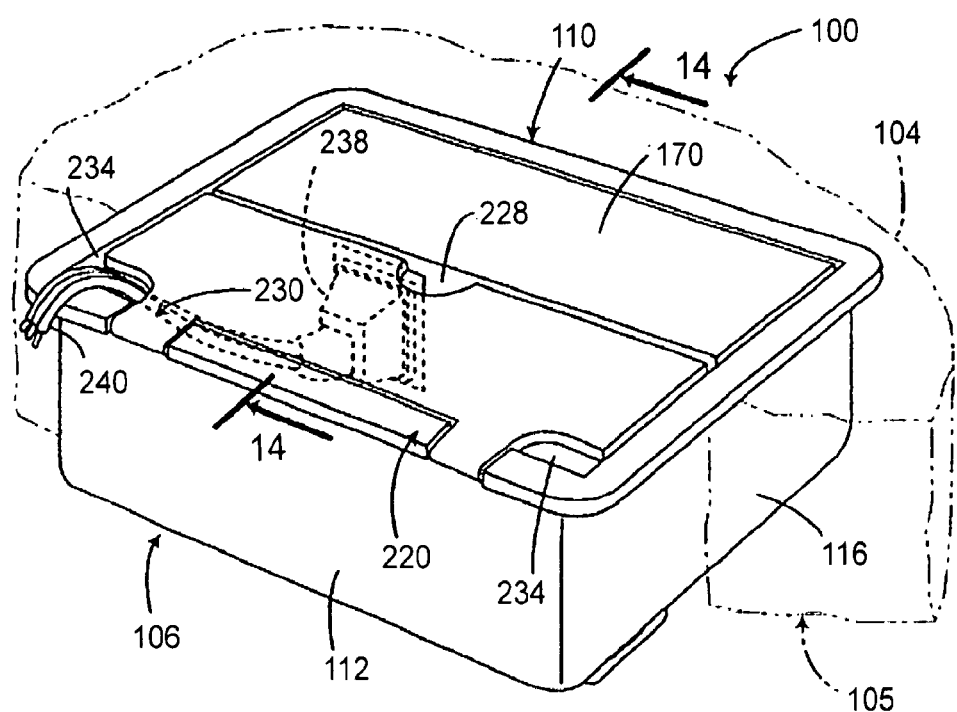
FIG. 13 is a perspective view of the rotatable power and data center of FIG. 1, similar to FIG. 1 but illustrating an electrical cord extending out of the cover and further illustrating interconnection of an electrical plug-type cord with an electrical receptacle of the carriage.

In addition to use and operation of the power and data center 100 with the cover in the 180E position as illustrated in FIGS. 3 and 12, an additional configuration may be utilized, while still retaining energization of electrical utility devices and communication devices through the component section 172. More specifically, and as illustrated in FIGS. 13 and 14, electrical plug 238 and associated electrical cables 240 may remain energized with the component section 172 of carriage 170, and the electrical cables 240 positioned (with the cover 220 in a closed position) so as to extend outwardly through the cable passages 234 formed in the cover 220. For purposes of illustration, only one electrical plug 238 and set of electrical cables 240 is illustrated in FIGS. 13 and 14. However, additional electrical plugs 238 and electrical cables 240 can remain energized with the component section 172 of carriage 170, in addition to continued interconnection of communication cables 242 with voice/data receptacles 174. In such instance, the additional electrical cables 240 and communication cables 242 would also extend outwardly through the cable passages 234. This type of configuration has aesthetic advantages, since the recessed portion 244 and various components of the carriage 170 are substantially hidden from view, when the cover 220 is maintained in a closed configuration.

The power and data center 100 facilitates ease of removal of the carriage 170 from the stationary housing 106. When it is desired to remove carriage 170 from its coupled and pivotable relationship with the stationary housing 106, the carriage 170 is moved to its "vertical" position, whereby the top portion 184 is in a vertical orientation, as illustrated in solid line format in FIG. 6. In this configuration, the pivot tongues 210 are positioned as shown in FIG. 6 relative to the U-shaped channels 124. This positioning and the relative sizing and shaping of the tongues 210 and channels 124 allow the carriage 170 to be moved upwardly so that the tongues 210 are removed from the channels 124. As also earlier described, assembly and intercoupling of the carriage 170 with the stationary housing 106 requires merely a reversal of operation. That is, the carriage 170 is positioned and moved downwardly (as indicated by arrow A in FIG. 6) so that the pivot tongues 210 are inserted within the U-shaped channels 124. The carriage 170 is then rotated in a counter-clockwise position (as viewed in FIG. 6 and shown by arrow B therein) so that the top portion 184 moves to a substantially horizontal position, as shown in dotted line format in FIG. 6. In this configuration, and in essentially any configuration other than the one which provides for a substantially vertical orientation of top portion 184, the pivot tongues 210 are essentially "locked in" to the U-shaped channels 124.

Another aspect of the power and data center 100 relates to facilitating use of relatively large plug-type devices. For example, it is relatively common, in today's industries, to require AC charging of various devices, such as cellular phones, calculators and the like. Many of these devices use charging elements comprising relatively large AC adaptors, such as the adaptor 246 illustrated in FIG. 17. With the open configuration of the carriage 170 having the substantially 45E angular relationship illustrated in FIG. 17, interconnection of a device such as the adaptor 246 to one of the conventional electrical receptacles 180 is relatively easy and other components of the power and data center 100 do not "get in the way" or otherwise prevent such interconnection.

One other aspect of the power and data center 100 should be mentioned. Specifically, FIG. 3 illustrates the carriage 170 in a substantially 45E configuration. However, FIG. 3 also illustrates the cover 220 as being in the 180E position. With the elements of the power and data center 100 as described in previous paragraphs herein, the carriage 170 could not be maintained in the 45E position shown in FIG. 3, absent external forces or reorientation of the cover 220. However, in addition to the elements of the power and data center 100 previously described herein, additional elements in the form of bosses or the like could be resiliently positioned on inner surfaces of the walls 114, 116 of the stationary housing 106, with the specific positioning allowing the carriage 170 to be maintained in the position shown in FIG. 3. With such resilient bosses or similar elements, the user could manually force the carriage 170 downward against the bosses when it would be desired to return the carriage 170 to a closed position. Various other arrangements could also be utilized for maintaining the carriage 170 in the position shown in FIG. 3, with the cover 220 maintained in the 180E position as also shown in FIG. 3.

In summary, the power and data center 100 includes a substantial number of advantages. With the carriage 170 in the open position, and the cover 220 in the closed position, the cover 220 essentially "hides" the recessed portion 244. This is particularly useful for aesthetic purposes. Another substantially advantageous aspect of the power and data center 100 in accordance with the invention comprises facilitating the use of electrical receptacles and voice/data or "communications"

receptacles with external power and data cables, even when the carriage 170 is in the closed position.

The power and data center 100 provides for the recessed portion 244, which allows a substantial area for storage of "excess" wire and cable. In addition, the recessed portion 244 is "open" in its bottom area. Accordingly, even a greater amount of area is therefore provided for wire and cable storage. With respect to the use of the electrical and voice/data receptacles, even when the carriage 170 is in the closed position, the cover 220 can also be closed during use, with the electrical cables 240 and communication cables 242 extending outwardly through the cable passages 234. In accordance with all of the foregoing, substantial and complete use of the power and data center 100 is allowed, even when the power and data center 100 is in a closed, retracted position.

Another substantial advantage resides in the concept that the carriage 170 may be assembled with and removable from the stationary housing 106, without any requirement for the use of tools. That is, such assembly and disassembly is provided merely by extending the carriage 170 in the "vertically oriented" position as illustrated in solid line format in FIG. 6. In addition, the cover 220 is also capable of assembly with and removal from the stationary housing 106, without requiring tools. Such assembly and disassembly is provided as previously described herein with respect to FIGS. 10, 10A and 10B.

Still further, and as also previously described herein, the depth of the stationary housing 106 is relatively small. For example, in the power and data center 100, the depth of stationary housing 106 is less than the depth of the work surface 104. This relatively short "profile" of the stationary housing 106 provides the user with additional leg room or other storage area below the work surface 106, without intrusion of structural elements of the power and data center 100. With the rotatable interconnection of the carriage 170 to the stationary housing 106, this relatively short profile of the stationary housing 106 can be provided, while still maintaining "stability" of the carriage 170 during use.

As earlier described, the foregoing description of the power and data center 100 comprises a description of a prior art power and data center. The following paragraphs will now describe embodiments of expandable power and data centers in accordance with the invention.

Specifically, reference is made to the embodiment of the invention described herein as the one touch and pivotable, expandable power and data center 300, and primarily illustrated in FIGS. 18, 20, 28-33 and 36-51. A second embodiment of a one touch and pivotable expandable power and data center 600 is primarily illustrated in FIGS. 19, 21-27, 34 and 35. The expandable power and data center 300 is adapted to be mounted to a work surface or the like. Such a work surface is illustrated as work surface 302 in FIGS. 44, 45 and 46. The power and data center 300 is provided with a storage area, and facilitates access, potentially at a work surface level, to electrical power, voice/data signals and other types of desired electrical and/or communications input/output. The power and data center 300 is adapted to be maintained in a closed, retracted position, while still retaining the capability of interconnection of electrical and communication devices. Such a configuration is illustrated for power and data center 300 in FIG. 20. In addition, the power and data center 300 is adapted to facilitate interconnection of electrical and communication lines when a rotatable carriage of the power and data center 300 is moved to an open, extended position. This configuration is illustrated in FIG. 18. Still further, the power and data center 300 may be expanded or reduced, in terms of the number of power receptacles, data ports or other electrical and communications interconnection elements. In addition, the power and data center 300 in accordance with the invention provides for movement from an open to a closed position merely by a single, manual "touch" on the top of the power and data center 300.

Figure 44:
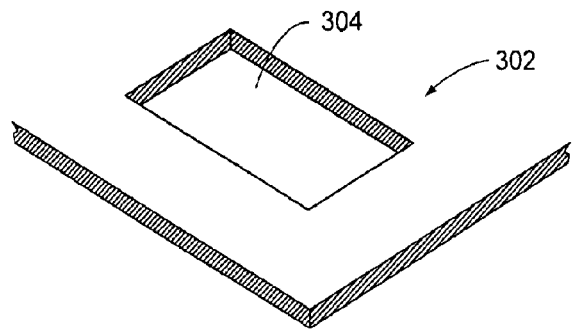
FIG. 44 illustrates a work surface to which the first embodiment of the power and data center shown in FIG. 18 may be installed.
Figure 45:
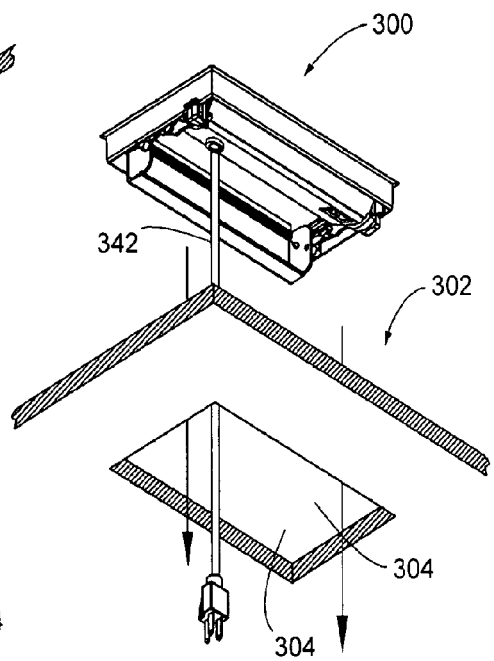
FIG. 45 illustrates an initial position of the power and data center as it is being installed into a work surface.
Figure 46:
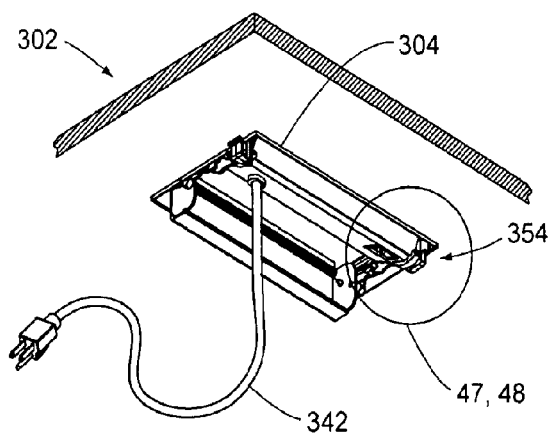
FIG. 46 illustrates a final spatial position of the power and data center as installed within the work surface shown in FIGS. 44 and 45.

More specifically, and with reference to the drawings, the power and data center 300 as illustrated in FIG. 18 is adapted to be mounted within a slot or opening, such as the slot 304 of the work surface 302 illustrated in FIGS. 44, 45 and 46. The work surface 302 may, for example, comprise a work surface of a furniture component. The slot 304 may be rectangular or a similar shape, for purposes of appropriately fitting and securing the power and data center 300.

The power and data center 300 includes a stationary housing 306, which may comprise a rectangular sleeve or casing 308. The rectangular sleeve 308 is vertically disposed and includes a frontal wall 320, left side wall 322 and right side wall 324. A rear vertical wall 326 is also provided. The walls may be integrally coupled or otherwise connected together with appropriate means. These walls form a rectangular box or sleeve-like structure 308 for protecting the electrical and communications components associated with the power and data center 300.

Integral with or otherwise appropriately connected to the rectangular sleeve or casing 308 is a horizontal flange or lip 310. The horizontal flange or lip 310 may also be rectangular in shape, and should be of an appropriate size so as to provide support on the work surface 302 for the power and data center 300 within the slot 304. The rectangular sleeve 308 may be appropriately sized, and the power and data center 300 may be configured, so that the flange or lip 310 is supported on the upper surface of the work surface 302, when the stationary housing 306 is positioned within the slot 304. The horizontal flange 310 may include a front portion 312, rear portion 314, left side portion 316 and right side portion 318.

The expandable power and data center 300 also includes a carriage 328. The carriage 328 is shown in an exploded view in FIG. 49. As illustrated in FIG. 18 and FIG. 49, the carriage 328 includes a top surface 330, sides 332 and frontal face 334. Extending outwardly from the frontal face 334 is a set of windows 336. The windows 336 can be varied in number, and comprise socket areas where electrical and communication devices such as power receptacles and data ports can be inserted. For example, in FIG. 18, three of the windows 336 include three power receptacles 338. Correspondingly, four of the windows 336 include four data ports 340. In a well known and conventional manner, the power receptacles 338 can each be connected to a power cord 342, as further shown in FIG. 18. The power cord 342 can be interconnected to any appropriate source of electrical power. In this manner, power can be applied at the terminals of the power receptacles 338. For example, as further shown in FIG. 18, an appliance can be connected to the middle power receptacle 338 (as viewed in FIG. 18) through an appliance cord 346 partially shown in FIG. 18. As earlier stated, the power and data center 300 can vary in width, and can be expandable, so as to vary the number and position of power receptacles 338 and data ports 340 within the windows 336.

In addition to the carriage 328, the power and data center 330 also includes a front cover 348. The front cover 348 is partially shown in FIG. 18, and is shown in cross section in FIGS. 40 and 41. As described in the following paragraphs, the front cover 348 can be moved between open and closed positions as the carriage 328 is also moved between open and closed positions. When the front cover 348 is open, a user can store excess cord length within the area normally covered by the front cover 348. Also, when the front cover 348 is in a closed position, such excess cords and the like can be hidden from view. The front cover 348 includes a top surface 350 and sides 352. The front cover 348 can be appropriately and pivotably secured to the left side 322 and right side 324 of the housing 306. Such a pivot connection is shown as pivot 376 in FIGS. 42 and 43.

As earlier stated, in addition to the power receptacles 338, the power and data center 300 illustrated in FIG. 18 includes four data ports 340. Each of the data ports 340 can be individually connected to any type of voice/data interconnection location, which may be positioned below the work surface 302 or in any other convenient location. The data ports 340 can be connected to these voice/data communications connections through conventional data lines 334.

Figure 47:
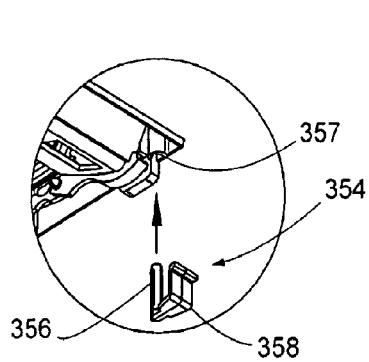
FIG. 47 illustrates one of the locking cams as it is inserted into the power and data center.
Figure 48:
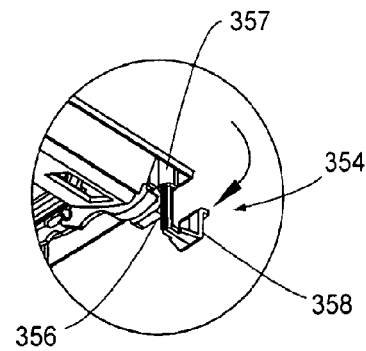
FIG. 48 illustrates the locking cam shown in FIG. 47, but with the locking cam rotated to a position where the cam will lock into place.

In addition to the foregoing, the power and data center 300 includes a pair of locking cams 354. As shown in FIGS. 47 and 48, each of the locking cams 354 includes a bushing 356 and foot 358. The locking cams 354 operate substantially in the same manner as the coupling connectors 134 previously described with respect to the power and data center 100. As shown in FIGS. 47 and 48, the locking cams 354 can be moved into position relative to the power and data center 300 so that the bushings 356 are engaged within corresponding bushings 357 located on the power and data center 300. As screws within the bushings 356 are rotated, the locking cams 354 move from the position shown in FIG. 47 to the position shown in FIG. 48. That is, the feet 358 of each locking cam 354 is rotated 90°. At that stage, the locking cams are further prevented from rotation, and a further "tightening" of the locking cams 354 will cause the feet 358 to move upwardly from the position shown in FIG. 48. In this manner, the feet 358 can be utilized to secure the power and data center 300 to the bottom surface of the work surface 302.

Figure 40:
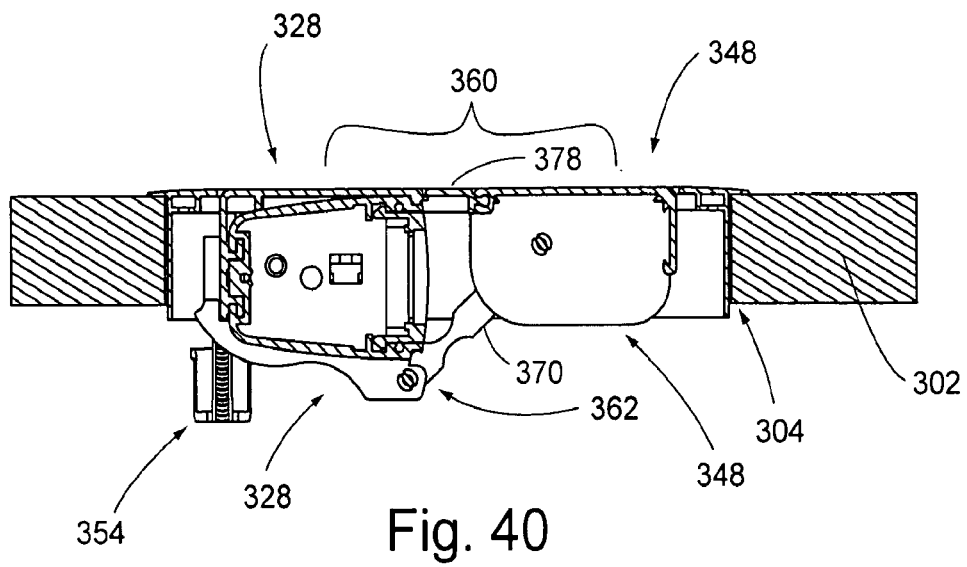
FIG. 40 is a sectional left side view of the first embodiment of the power and data center in accordance with the invention, showing the power and data center in the normal, closed position.
Figure 41:
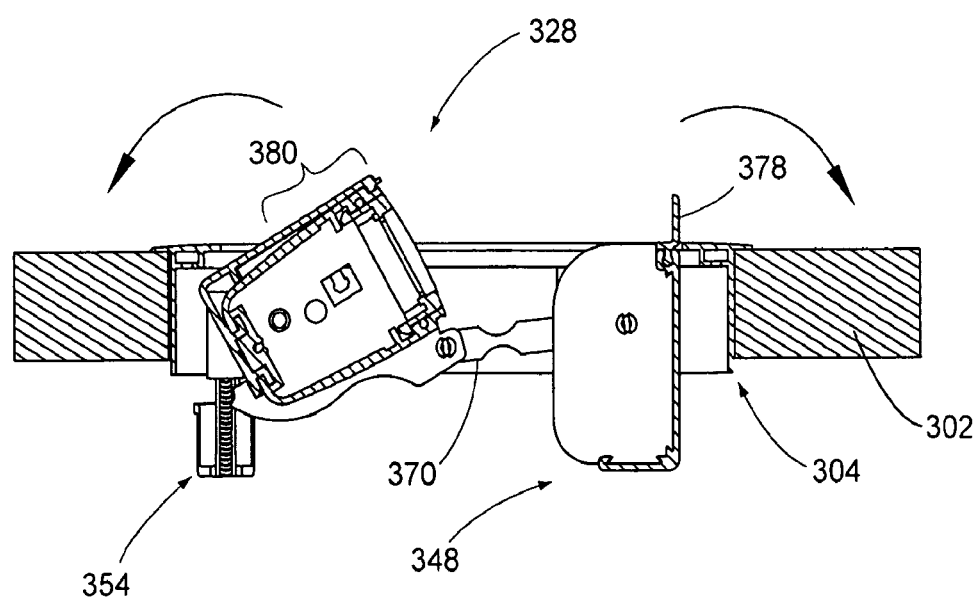
FIG. 41 shows the action of components of the power and data center shown in FIG. 40, when downward pressure is exerted so as to release a spring mechanism of the power and data center, and move the power and data center to an open position as shown in FIG. 41.
Figure 42:
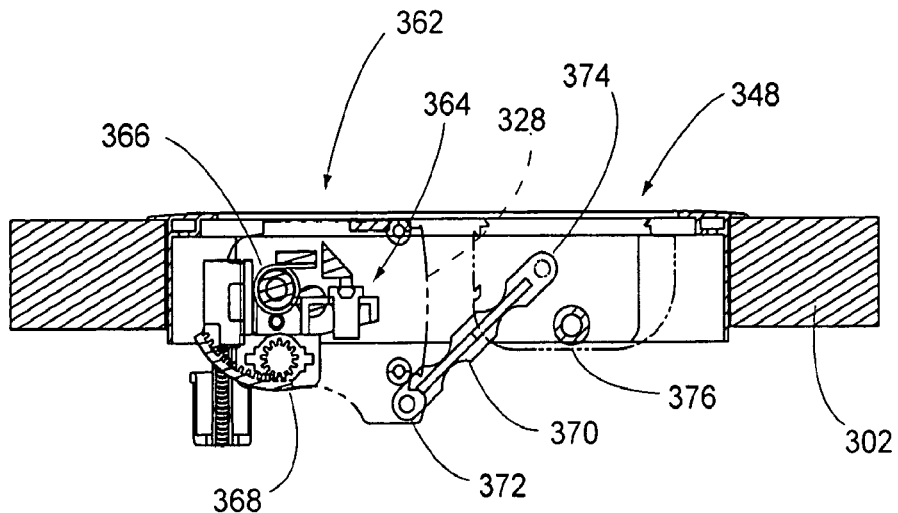
FIG. 42 is a sectional left side view similar to FIG. 40, but showing mechanical components comprising a latching mechanism, spring, damper and link associated with the one touch power and data center.
Figure 43:
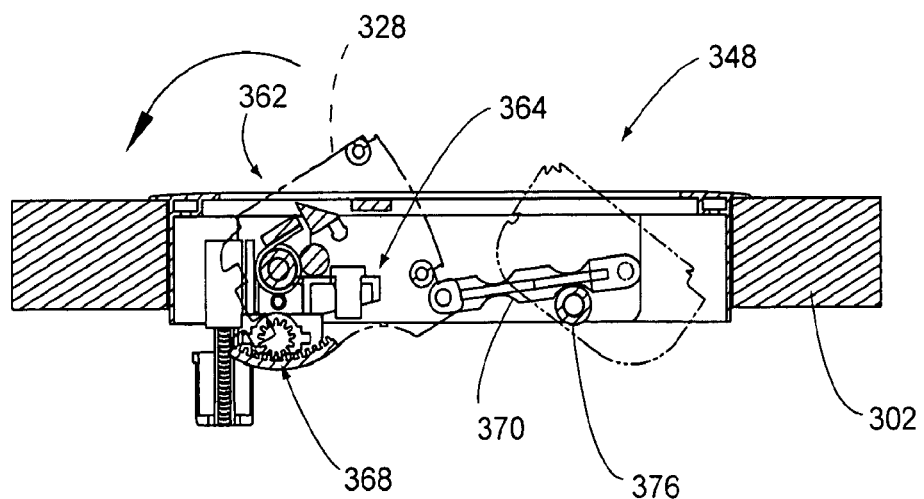
FIG. 43 is similar to FIG. 42 but shows the power and data center as it is moving toward an open position.

The operation of the power and data center 300 will now be described, primarily with respect to FIGS. 40-43. FIG. 40 is a cross sectional view showing the carriage 328 and the front cover 348 in a closed position. Certain areas of the top surface 330 of the carriage 328 and the top surface 350 of the frontal cover 348 are characterized herein as the pressure area 360. This pressure area 360 is illustrated in FIG. 40. For purpose of opening the power and data center 300, so as to gain access to the power receptacles 338 and data ports 340, a user will exert a slight downward pressure anywhere within the pressure area 360. The carriage 328 includes, on each opposing end, a spring mechanism 362. Release of the spring mechanism 362 of each end of the carriage 328 will cause the carriage 328 and the frontal cover 348 to move to open positions. These open positions are illustrated in FIG. 41. The closed positions are illustrated in FIGS. 40 and 42. Also, the configuration of each of the spring mechanisms 362, when the carriage 328 is in the open position, is illustrated in FIG. 43. FIG. 42 illustrates the configuration of one of the spring mechanisms 362 when the carriage 328 and frontal cover 348 is in the closed position.

The carriage 328 is initially held in the closed position shown in FIG. 40 through a latch mechanism 364 as illustrated in FIGS. 42 and 43. When the user exerts a slight downward pressure on the pressure area 360, this pressure causes the latch mechanism 364 to release. The spring mechanism 362 includes a spring 366, primarily shown in FIGS. 42 and 43. When the latch mechanism 364 is released, the spring 366 (one of each being on opposing ends of the carriage 328) moves the carriage 328 to the open position. So as to prevent the carriage 328 from moving "too fast" to the open position, a damper 368 is coupled (one on each end) to the carriage 328 at the ends thereof. This damper 368 on each end restricts the speed at which the carriage 328 moves from a closed position to an open position and also from an open position to a closed position.

To cause the operation of the spring mechanism 362 to act not only upon the carriage 328, but also the frontal cover 348, a link 370 is provided on each end of the carriage 328. The link 370 couple the carriage 328 to the frontal cover 348 on each end thereof. As shown primarily in FIGS. 42 and 43, each link 370 includes a first link pivot 372 which couples the link 370 to the carriage 328. At the opposing end of the link 370, a second link pivot 374 couples the link 370 to the frontal cover 348. Again, a pair of links 370 are utilized, one on each end of the power and data center 300. It is also shown in FIGS. 42 and 43 that the frontal cover 348 pivots on the power and data center 300 between open and closed positions, through the front cover pivot 376. Again, the link 370 causes the opening of the carriage 328 to correspondingly cause the movement of the frontal cover 348 from a closed position (FIG. 40) to an open position (FIG. 41). As apparent from FIG. 41, with the frontal cover 348 moved to an open position, the user has full access to the power receptacles 338 and data ports 340 associated with the carriage 328. If desired, the power and data center 300 can be used in the open position illustrated in FIGS. 18 and 40. Alternatively, any excess cords can be stored below the work surface 302 and the carriage 328 and frontal cover 348 be caused to move to a closed position (FIG. 40). In this closed position, space below the top surface 350 of the frontal cover 348 allows for excess cords. Also, as shown primarily in FIG. 41, the frontal cover 348 includes a flexible lip 378. This flexible lip 378 provides for a protective closure when the power and data center 300 is in the closed position, but still allows power cords and data lines to enter and exit the interior of the power and data center 300 through the flexible lip 378.

Assuming that the power and data center 300 is in the open position as shown in FIGS. 41 and 43, the user can now use a "single touch" to close the power and data center 300. Specifically, the user can exert a downward pressure on the push down pressure area 380 on the top surface 330 of the carriage 328. This pressure area 380 is illustrated in FIG. 41.

As earlier described, the power and data center 300 can be expanded or contracted, based on the number of power receptacles 338 and data ports 340 which a user may wish to use with the power and data center 300. The particular power and data center 300, as shown in FIG. 18, includes seven windows 336 for locating power receptacles 338 and data ports 340. A second embodiment of a one touch data expandable power and data center in accordance with the invention is illustrated as power and data center 600 in FIG. 19. The power and data center 600 is also illustrated in FIGS. 21-27, 34 and 35. The power and data center 600 differs from the power and data center 300 in at least two ways. First, the number of windows 336 in the power and data center 600 is reduced from the number of windows 336 in the power and data center 300. Also, the power and data center 300 is a somewhat different embodiment, in that it includes a frontal cover 348. In contrast, the power and data center 600 has a narrower opening formed by its housing 306. Accordingly, the power and data center 600 only includes a carriage 328, and does not include any type of other cover such as the frontal cover 348. Otherwise, the power and data center 600 operates in the same manner as the power and data center 300. For example, the power and data center 600 includes the capability of a user exerting a slightly downward pressure on the top surface 330 of the carriage 328. This downward pressure will cause a spring mechanism (not shown) to operate in a manner similar to how the spring mechanism 362 operates for the power and data center 300. However, the power and data center 600 does not include any elements corresponding to the links 370. As will be recalled, the links 370 interconnect the carriage 328 of the power and data center 300 to the frontal cover 348 of the power and data center 300. Because there is no element corresponding to the frontal cover 348 within the power and data center 600, there is no element corresponding to the links 370.

With the foregoing concepts in mind, the elements of the power and data center 600 will now be briefly described. For purposes of clarity, elements of the power and data center 600 which correspond in function and substantial structure to comparable elements within the power and data center 300 will be numbered with identical reference numerals. However, it should be emphasized that certain of the elements of the power and data center 600 may be of a different size than the comparable elements found in power and data center 300. For example, the power and data center 600 can include a housing 306 comprising a rectangular sleeve 308. Although the housing 306 and rectangular sleeve 308 of the power and data center 600 correspond to like numbered elements of the power and data center 300, it is apparent that the rectangular sleeve 308 of the power and data center 300 is substantially larger than the corresponding rectangular sleeve 308 of the power and data center 600.

As with the power and data center 300, the power and data center 600 is adapted to fit within a slat 304 of a work surface 302. Again, however, the slat 304 of the power and data center 600 would be smaller than the corresponding slat 304 adapted for use with the power and data center 300. The power and data center 600 includes a horizontal flange 310, with a front portion 312, rear portion 314, left side 316 and right side 318. Correspondingly, the rectangular sleeve 308 of the power and data center 600 includes a frontal wall 320, left side wall 322, right side wall 324 and rear vertical wall 326.

Still further, the power and data center 600 includes a carriage 328. The carriage 328 includes a top surface 330 with opposing sides 332. A frontal face 334 is also provided. Within the frontal face 334 of the power and data center 600 are a set of four windows 336. In the particular configuration illustrated in FIGS. 19 and 35, two of the windows 336 are left without any receptacles or data ports. Another two of the windows 336 include a pair of power receptacles 338. In addition, a power cord 342 extends from the power receptacles 338 downwardly for purposes of energizing the power and data center 600 through external power. Because the windows 336 do not include any data ports, the particular embodiment of the power and data center 600 shown in FIG. 19 does not include any data lines corresponding to data lines 344 of power and data center 300. However, such data lines would exist if any data ports were included within the windows 336.

As earlier stated, the power and data center 300 includes a frontal cover 348 as previously described herein. The embodiment of a power and data center 600 in accordance with the invention, as apparent from the drawings, does not include any corresponding frontal cover. However, like the power and data center 300, the power and data center 600 can include a pair of locking cams 354, for purposes of securing the power and data center 600 to a work surface 302. The locking cams 354 each include a bushing 356, a corresponding bushing (not shown) within the power and data center 600, and a foot 358.

Figure 19:
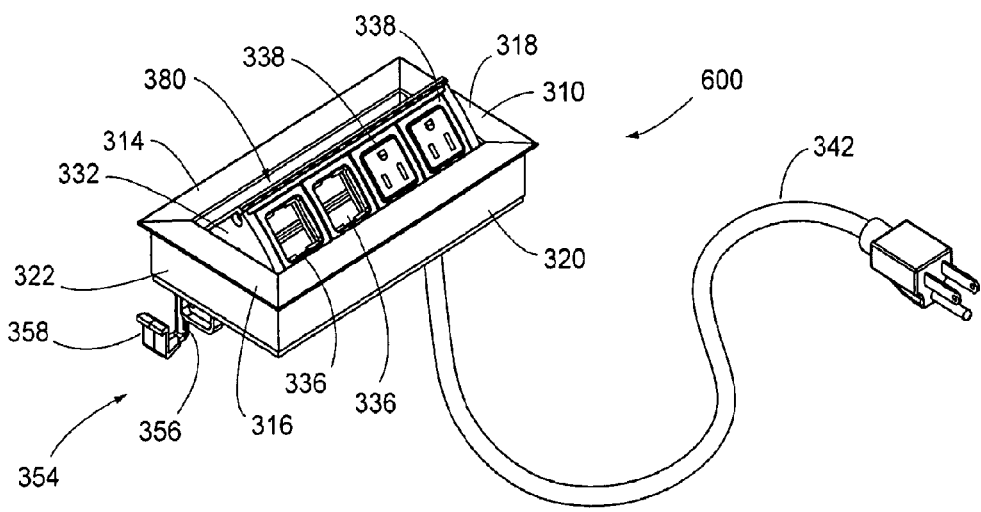
FIG. 19 is a perspective view of a second embodiment of a one touch pivotable, expandable power and data center in accordance with the invention, with the second embodiment including only a pair of power receptacles, with no data ports.
Figure 20:
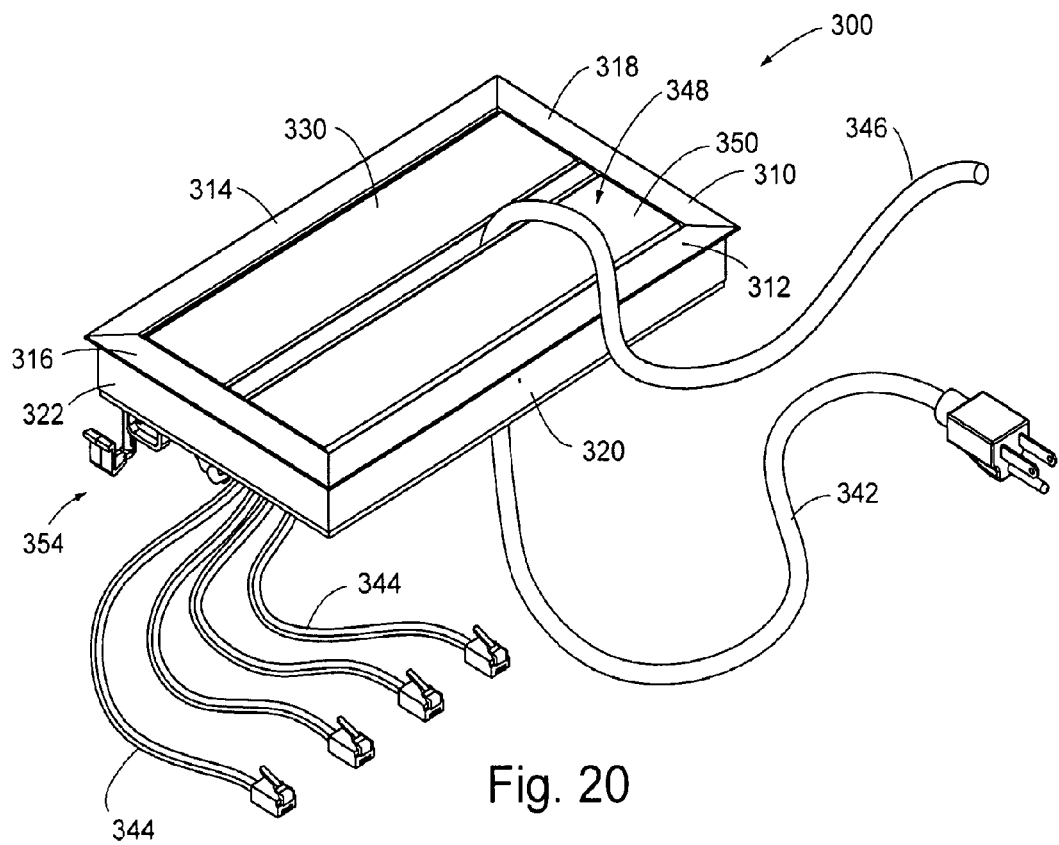
FIG. 20 is a perspective view of the first embodiment of the power and data center shown in FIG. 18, with the power and data center in a closed configuration, with extra cords hidden while in use.
Figure 21:
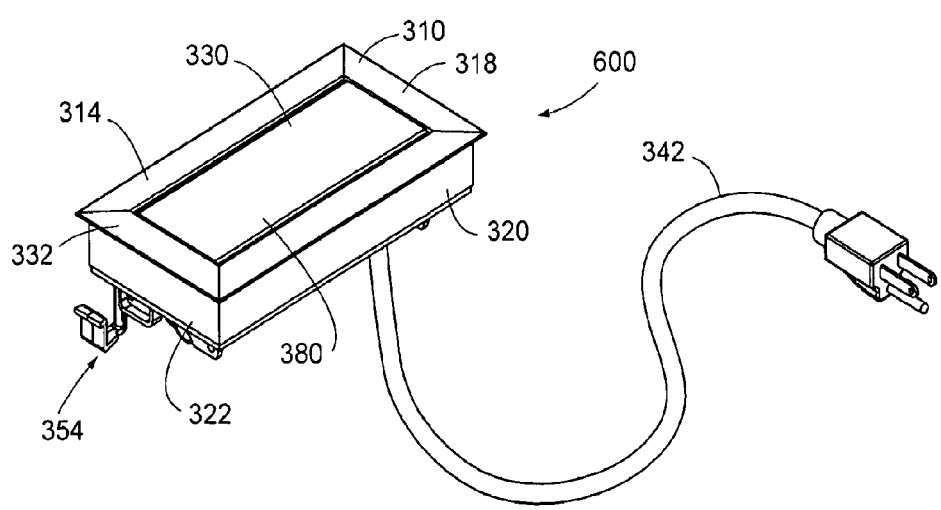
FIG. 21 is a perspective view of the second embodiment of the power and data center in accordance with the invention as shown in FIG. 19, but with the power and data center in a closed configuration.
Figure 22:
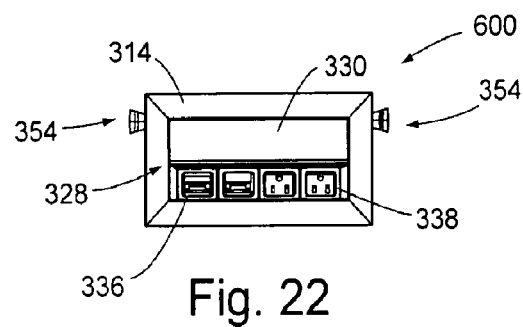
FIG. 22 is a plan view of the second embodiment shown in FIG. 19.
Figure 23:
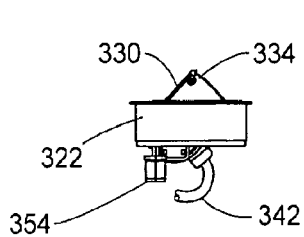
FIG. 23 is a left side view of the second embodiment shown in FIG. 19.
Figure 24:
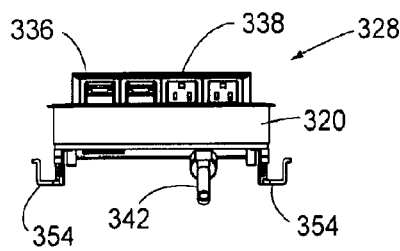
FIG. 24 is a front, elevation view of the second embodiment shown in FIG. 19.
Figure 25:
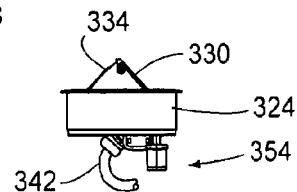
FIG. 25 is a right side view of the second embodiment shown in FIG. 19.
Figure 26:
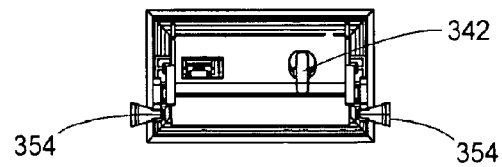
FIG. 26 is an underside view of the second embodiment shown in FIG. 19.
Figure 27:
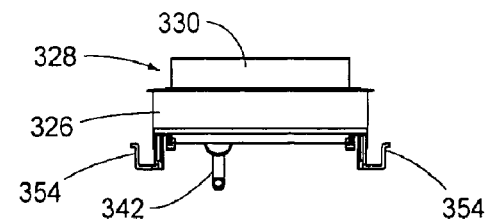
FIG. 27 is an upside down, rear view of the second embodiment shown in FIG. 19.
Figure 28:
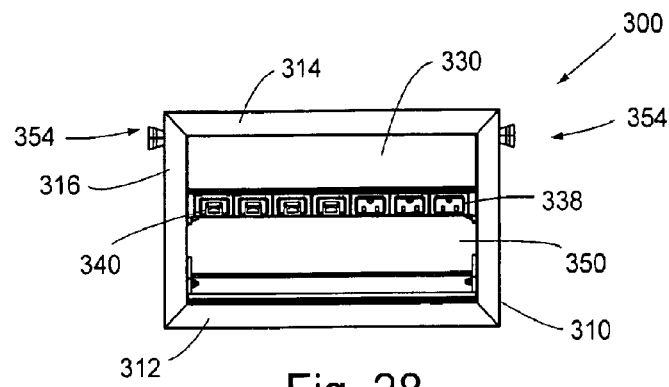
FIG. 28 is a top, plan view of the first embodiment of the power and data center in accordance with the invention shown in FIG. 18.
Figure 29:
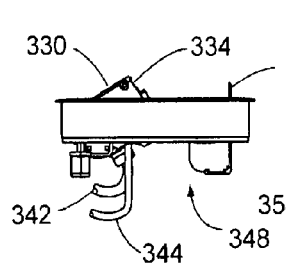
FIG. 29 is a left side view of the first embodiment shown in FIG. 18.
Figures 30, 31:
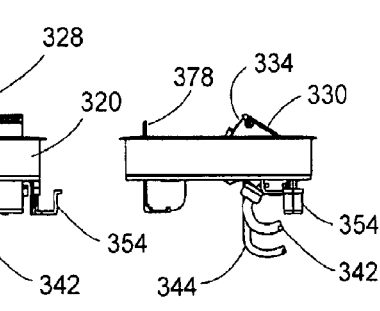
FIG. 30 is a front, elevation view of the first embodiment shown in FIG. 18.
FIG. 31 is a right side view of the first embodiment shown in FIG. 18.
Figure 32:
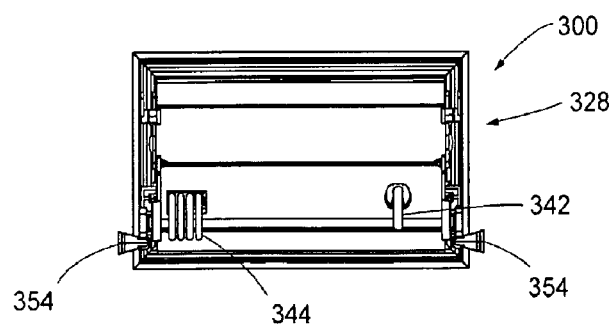
FIG. 32 is an underside view of the first embodiment shown in FIG. 18.
Figure 33:
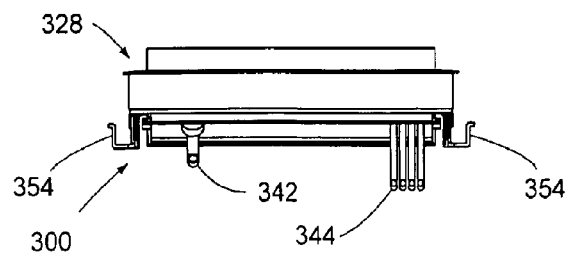
FIG. 33 is an upside down, rear view of the first embodiment shown in FIG. 18.
Figure 34:
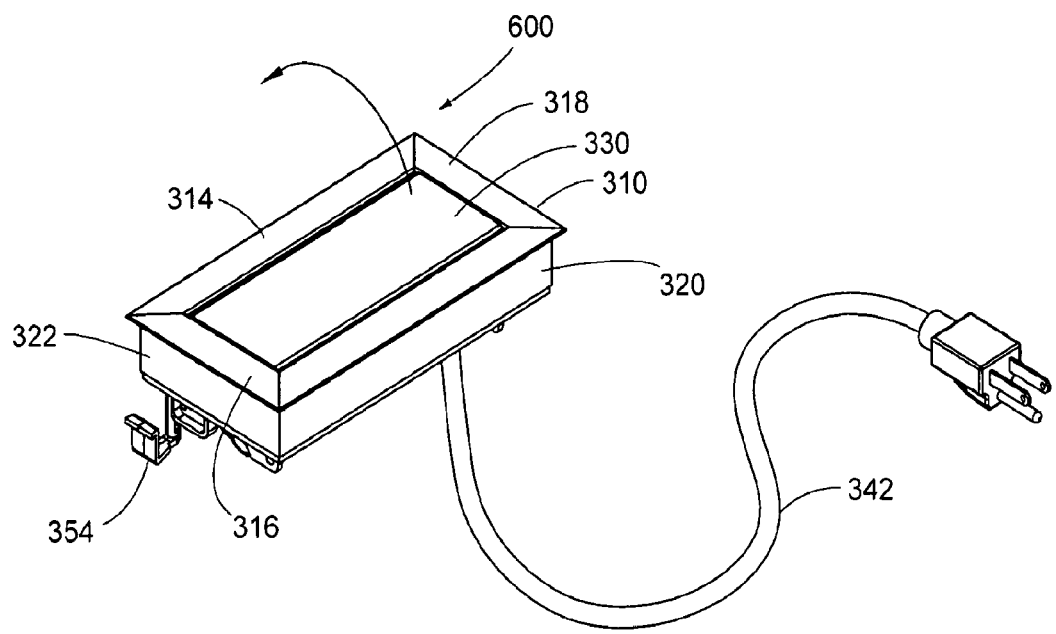
FIG. 34 is a perspective view of the second embodiment shown in FIG. 19 in a closed configuration, and showing the direction of movement when opening the second embodiment.
Figure 35:
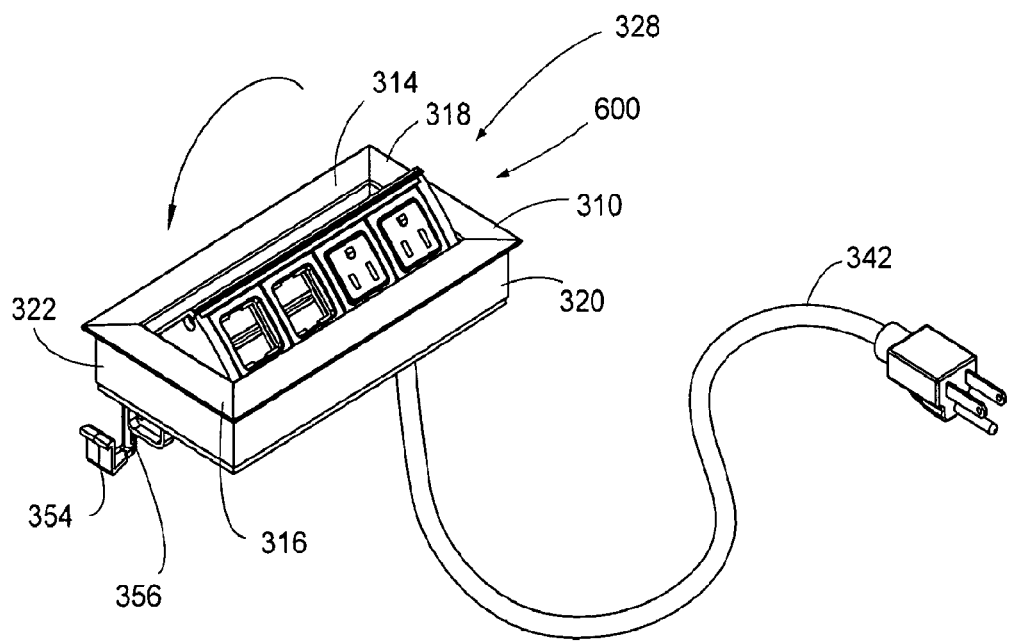
FIG. 35 is a perspective view of the second embodiment in an open configuration, and showing the direction of movement when moving the second embodiment from an open to a closed configuration.
Figure 36:
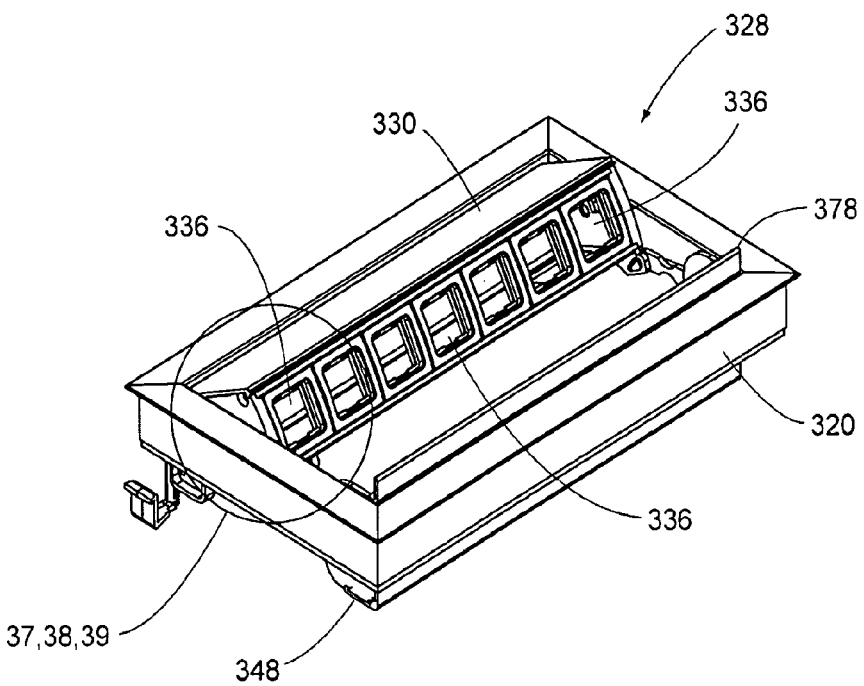
FIG. 36 is a perspective view of the first embodiment shown in FIG. 18, and specifically showing the embodiment with all empty windows.
Figures 37, 38, 39:
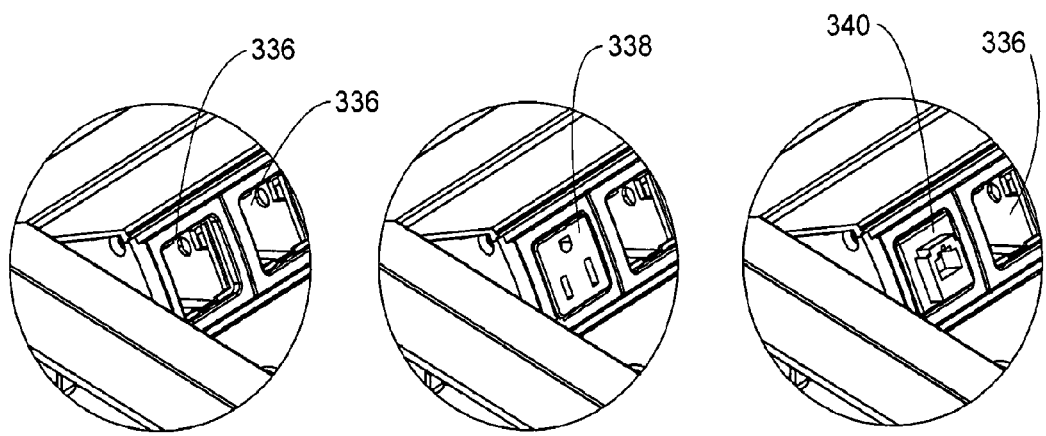
FIG. 37 is an enlarged view of a part of the power and data center shown in FIG. 36, and further showing the empty window option.
FIG. 38 is an enlarged view of a portion of the power and data center in FIG. 36, but showing one of the windows with a simplex power receptacle.
FIG. 39 is an enlarged view similar to FIG. 38, but shows the use of a data adapter or data port with the power and data center.

Also, as with the power and data center 300, the power and data center 600 would include pressure areas for purposes of operating spring mechanisms (not shown) so as to cause the carriage 328 to move between a closed position (as shown in FIG. 21) and an open position, such as that shown in FIG. 19.

The spring mechanisms (not shown) would, as the spring mechanisms 362 included within the power and data center 300, also include latch mechanisms, springs and dampers (all not shown). However, as earlier stated, the spring mechanisms associated with the power and data center 600 would not include links corresponding to the links 370 associated with the power and data center 300, since the power and data center 600 does not include any type of frontal cover. Also, as with the power and data center 300, the top surface 330 of the carriage 328 would include a push down pressure area 380. This push down area 380 is illustrated in FIG. 19. The user would exert a downward pressure on the push down area 380, for purposes of closing the carriage 328 of the power and data center 600.

Figure 59:
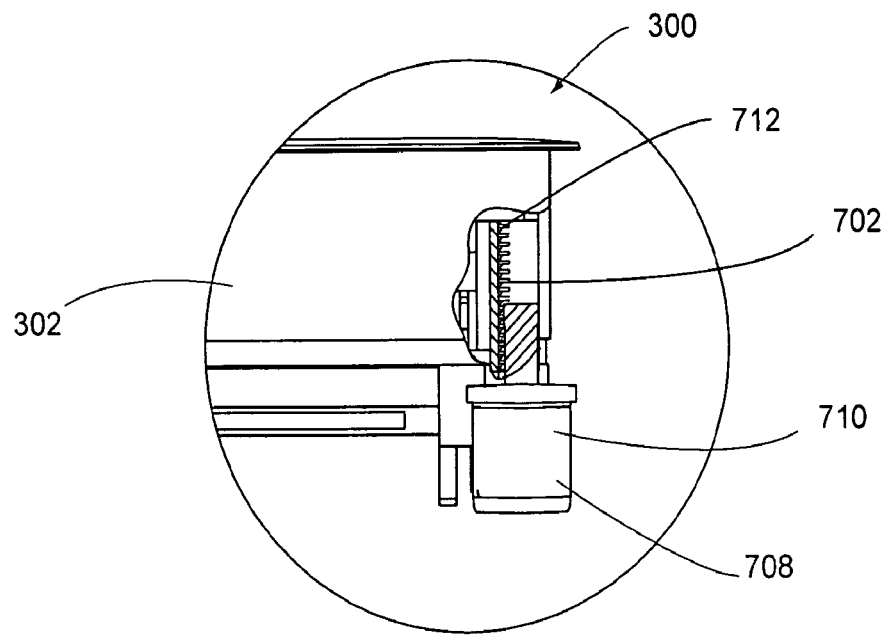
FIG. 59 illustrates the locking mechanism shown in FIG. 52 as the same as inserted into the power and data center.
Figure 60:
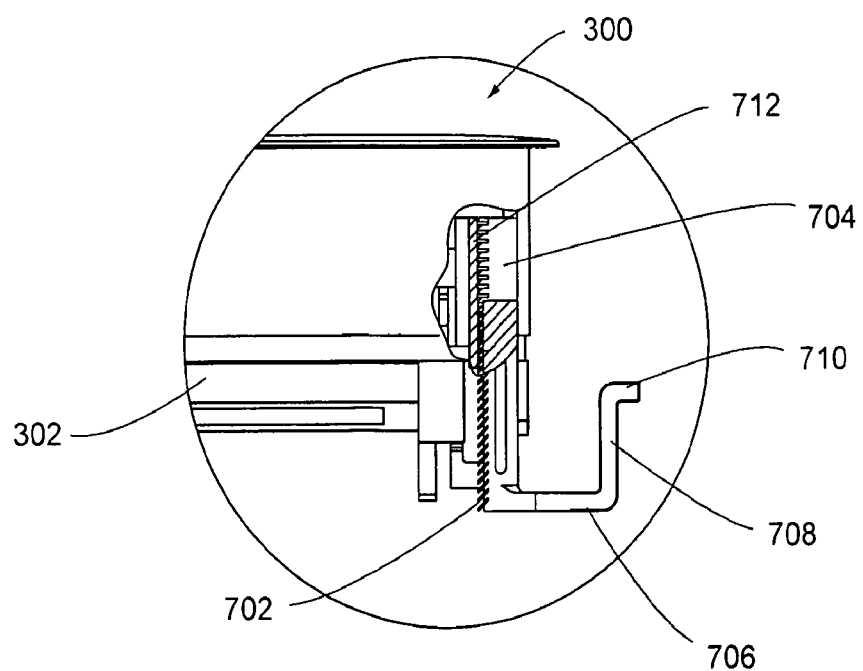
FIG. 60 illustrates the locking mechanism shown in FIG. 59, after it has been rotated 90°.
Figure 61:
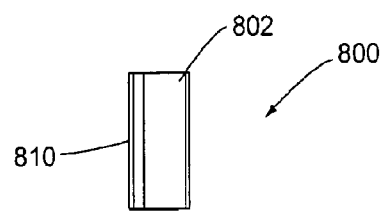
FIG. 61 illustrates a plan view of a connecting clip in accordance with the invention.
Figure 62:
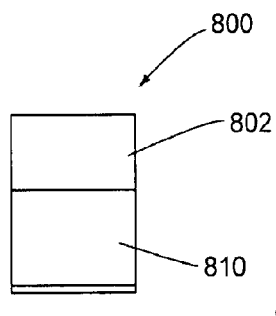
FIG. 62 illustrates a left-side, elevation view of the connecting clip shown in FIG. 61.
Figure 63:
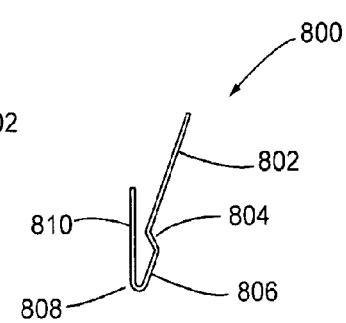
FIG. 63 is a front, elevation view of the connecting clip shown in FIG. 61.
Figure 64:
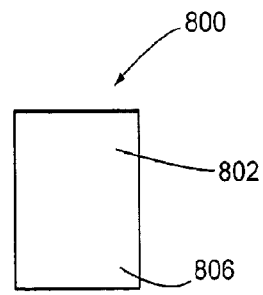
FIG. 64 is a right-side, elevation view of the connecting clip shown in FIG. 61.
Figure 65:
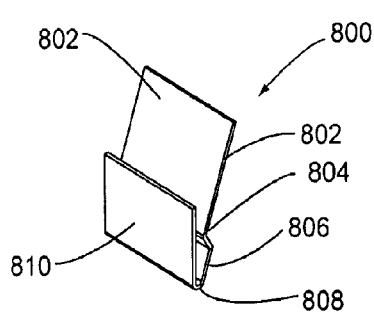
FIG. 65 is a perspective view of the connecting clip shown in FIG. 61.
Figure 66:
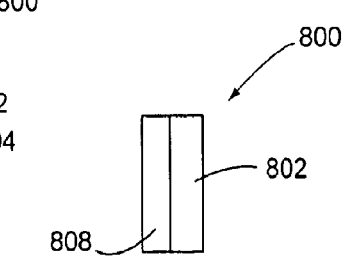
FIG. 66 is an underside view of the connecting clip shown in FIG. 61.
Figure 67:
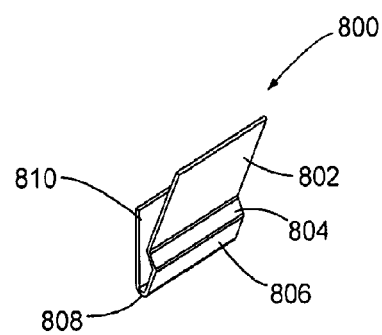
FIG. 67 is a perspective view of the connecting clip shown in FIG. 61, rotated 180° relative to the perspective view at FIG. 65.
Figure 68:
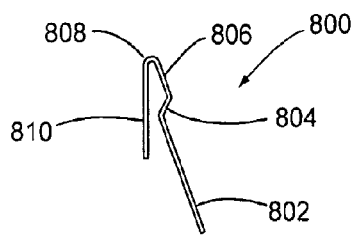
FIG. 68 is an upside down, elevation view of the connecting clip as shown in FIG. 61.

Certain principles will now be described with respect to a latching mechanism 700 and a connecting clip 800 which may be utilized in accordance with certain concepts of the invention. The latching mechanism 700 can be utilized in place of the locking cams 354 previously described herein with respect to FIGS. 47 and 48. As shown first in FIGS. 52-58 in a stand alone configuration, the latching mechanism 700 includes a vertically disposed bushing thread 702. The bushing thread 702 is mounted to a tower 704. Connected to or otherwise integral with the bottom of the tower 704 is a foot 706. The foot 706 has a triangular configuration. At its base, the foot 706 is connected to or otherwise integral with a vertical bracket 708. As the top of the vertical bracket 708 a lip 710 extends outwardly therefrom. The power and data centers previously described herein may be utilized with the latching mechanism 700, in somewhat as the same manner as the power and data center 300 operated with the locking cams 354. More specifically, it is preferable that a pair of latching mechanisms 700 be utilized. As shown in FIGS. 59 and 60, the latching mechanisms 700 can be moved into position relative to the power and data center 300, so that the bushing threads 702 are engaged with corresponding threads 712 located on the power and data center 300. As the latching mechanisms 700 are rotated 90°, they are essentially prevented from further rotation. Accordingly, a further "tightening" of the latching mechanism 700 will cause the feet 706 to move upwardly from the position shown in FIG. 60. In this manner, the feet 706 can be utilized to secure the power and data center 300 to the bottom surface of a work surface 302.

In addition to the latching mechanisms, additional concepts in accordance with the invention are embodied within the use of connecting clips 800. One of the connecting clips 800 is illustrated in detail in FIGS. 61-68. As shown therein, each connecting clip 800 includes an angled back portion 802, having the angle primarily shown in FIG. 63. Integral with a lower part of the angled back portion 802 is a reverse angle section 804, having the angular configuration shown in FIG. 63, relative to the configuration of portion 802. At the bottom portion of the reverse angled section 804 is a parallel angled section 806. The angled section 806 essentially lies in a plane parallel to the plane of the angled back portion 802. A lower, integral connection 808 is made between the lower part of the parallel angled section 806 and the lower portion of a vertical front plate 810.

Figure 69:
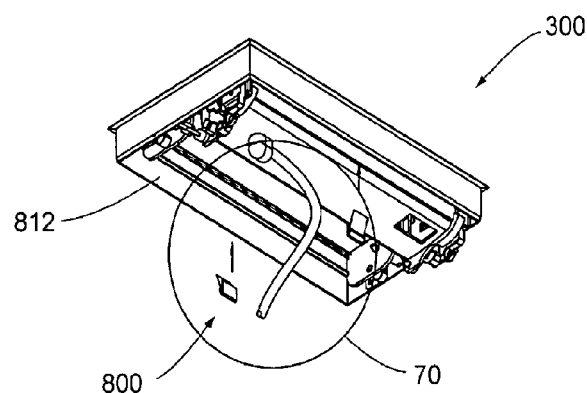
FIG. 69 is an underside perspective view showing the position of the connecting clip of FIG. 61 as it is to be clipped to a side of a power and data center.
Figures 70, 71:
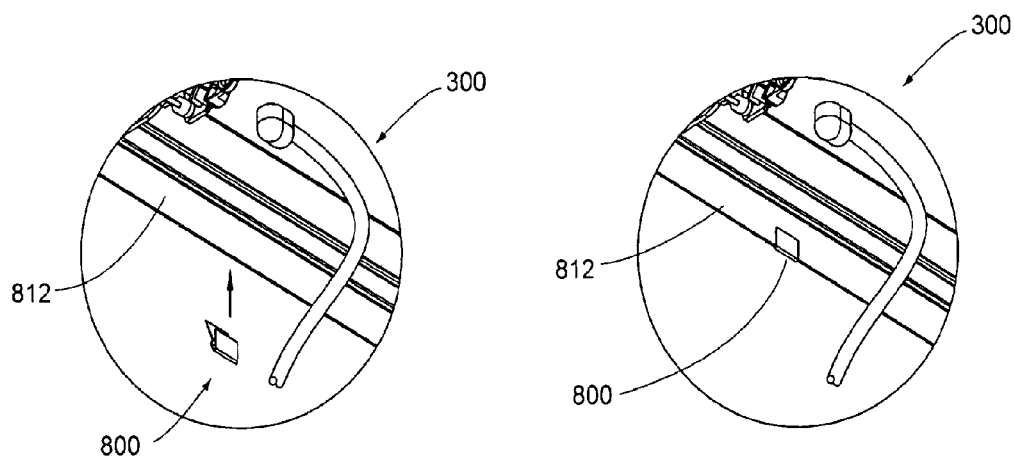
FIG. 70 is an enlarged view of the portion of FIG. 69 showing the connecting clip.
FIG. 71 is an enlarged view showing the connecting clip after it has been inserted onto the power and data center.
Figure 72:
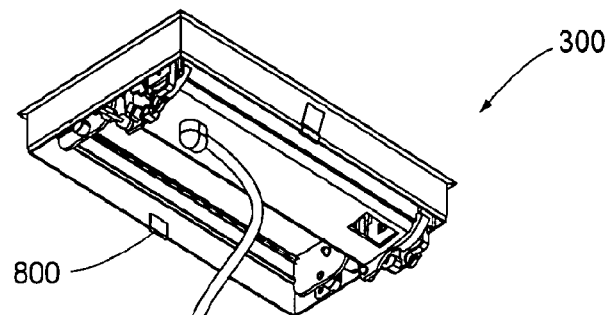
FIG. 72 is an underside perspective view showing the relative positioning of a power and data center in accordance with the invention, as the same as the position within a slot of a work surface.
Figure 73:
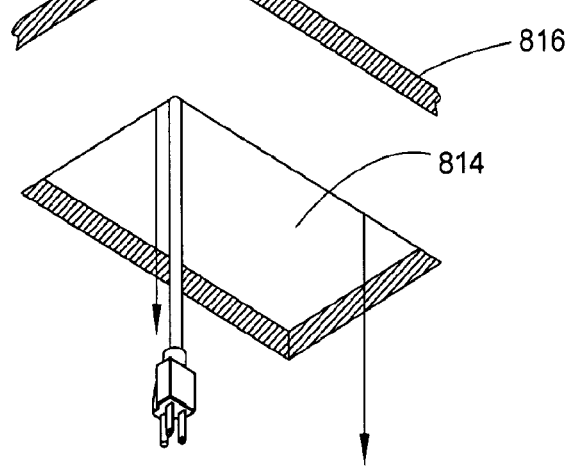
FIG. 73 is similar to FIG. 72, but shows the power and data center as it is positioned within the work surface.
Figure 73:
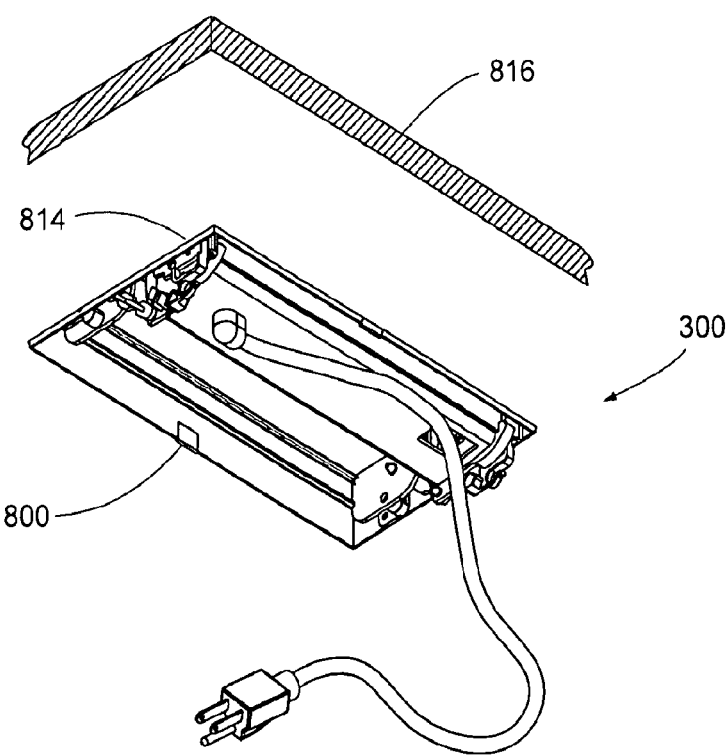

The purpose of the connecting clip is to provide a relatively simple means for securing and power and data center to a work surface, in a manner so that the power and data center cannot be inadvertently lifted upwardly out of a slot within the work surface. FIG. 69 illustrates a power and data center 300 with a connecting clip 800 in position to be inserted along a lower edged surface 812 of the power and data center 300. This view is also shown in enlargement in FIG. 70. FIG. 71 illustrates the final position of the connecting clip 800 relative to the lower edge surface 812 of the power and data center 300. In this configuration, the vertical front plate is positioned inside of the interior of the power and data center 300, while the angled back portion 802, reverse angle section 804 and parallel angled section 806 are positioned outside of the lower edged surface 812. The upper edge of the angled back portion 802, with its configuration, will prevent the power and data center from being lifted upwardly through a slot 814 of a work surface 816 (FIGS. 72 and 73), in that the top of the angled back portion 802 will preventably abut the lower surface of the work surface 816. However, with the connecting clip 800 having a resilient configuration, when the power and data center 300 is lowered into the slot 814 (as shown in FIG. 72), the angled back portion 802 will be deflected inwardly, so that the power and data center 300 can be received through the slot 814. When it is desired to remove the power and data center 300 from the slot 814, the angled back portions 802 can be manually deflected inwardly, either completely manually or with the use of a screwdriver or the like, so that the power and data center 300 can be lifted upwardly through the slot 814.

FIGS. 74-79 show various embodiments of power and data centers with which latching mechanisms and connecting clips in accordance with the invention can be utilized.

Figure 74:
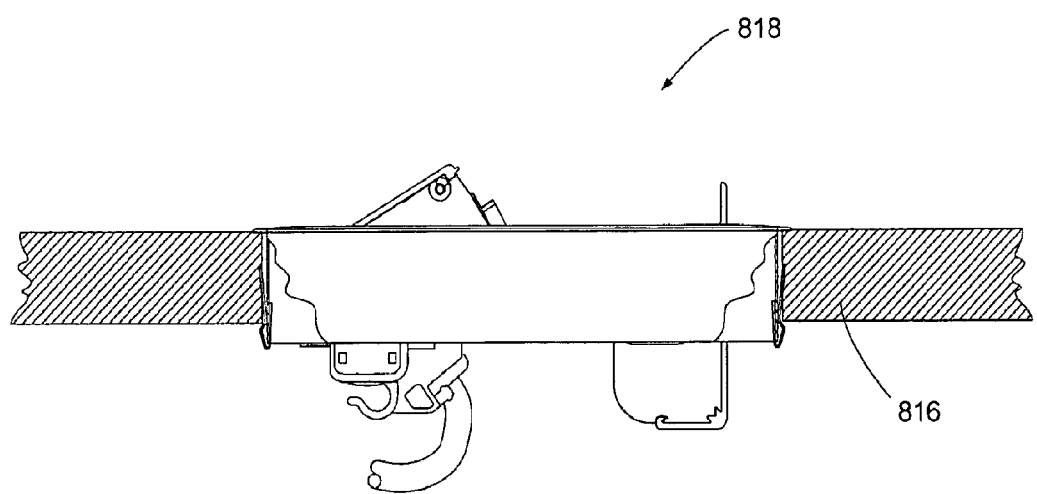
FIG. 74 is a sectional, end view showing the power and data center in an open position.
Figure 75:
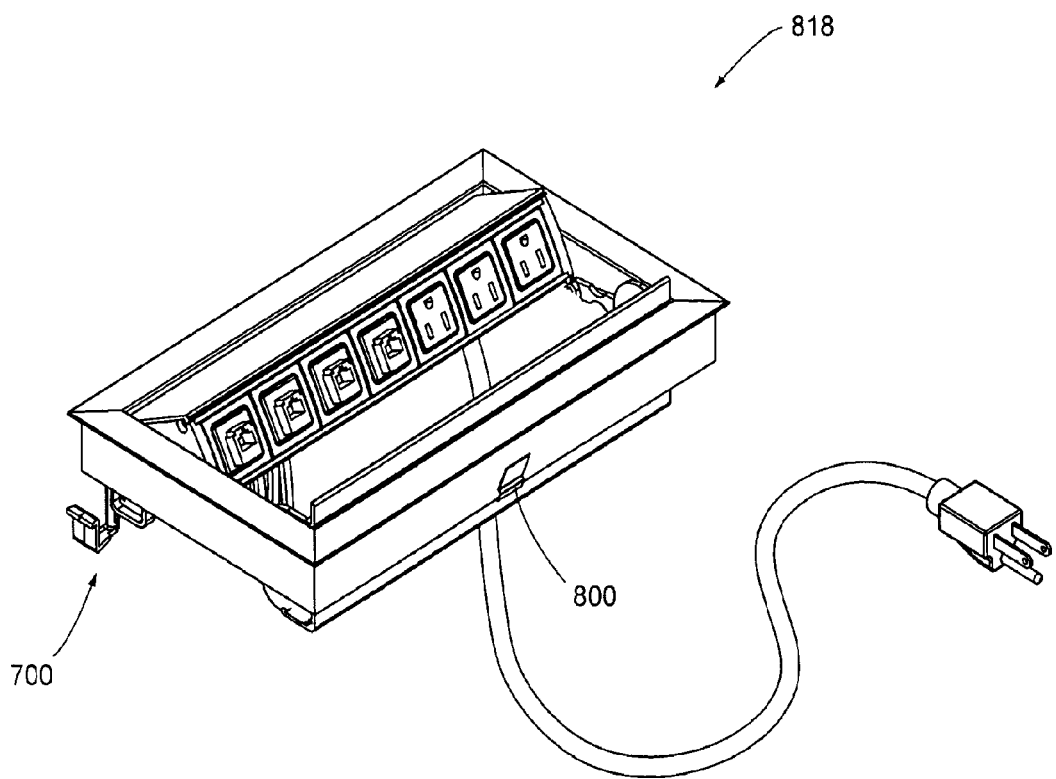
FIG. 75 is a perspective view of the power and data center in an open position.
Figure 76:
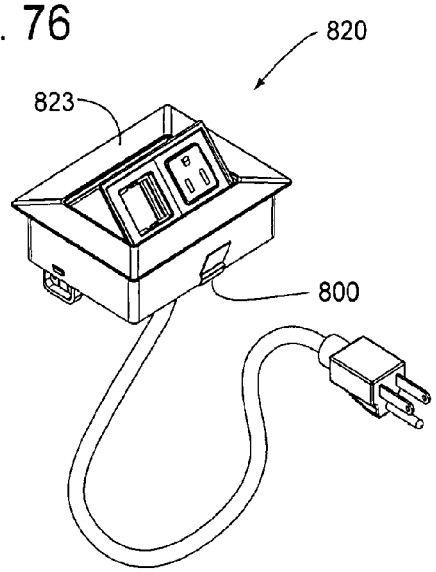
FIG. 76 is a perspective view of an alternative embodiment of a power and data center in accordance with the invention.
Figure 77:
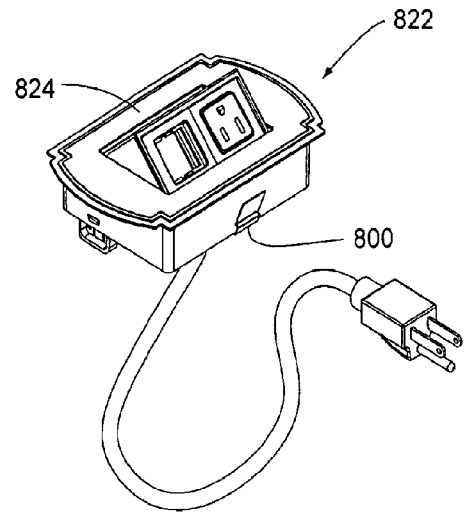
FIG. 77 is a still further embodiment of a power and data center in accordance with the invention.

For example, FIG. 74 illustrates a side, sectional view of a power and data center 818 which may utilize the locking mechanisms 700 and connecting clips 800. FIG. 75 is a perspective view of the power and data center 818. In view of prior description herein, individual elements of the power and data center 818 and other power and data centers subsequently described herein will not be set forth in detail. As apparent from FIG. 75, the power and data center 818 includes a set of four voice/data connectors, and three electrical receptacles. FIG. 76 illustrates a further power and data center 820 which may be utilized in accordance with the invention. The power and data center 820 includes an electrical outlet receptacle and a "blank" where a suitable type of connector may be employed. FIG. 77 shows a power and data center 822. The power and data center 822 is similar to the power and data center 820, but includes a surface plate 824 having a slightly different configuration than the surface plate 823 of the power and data center 820. FIG. 78 illustrates a power and data center 824, having a pair of carriages. One of the carriages carries two voice/data connectors and two electrical outlet receptacles. FIG. 79 illustrates a modified version of a power and data center 826. The power and data center 826 shows two communication "blank" connectors, along with two electrical outlet receptacles.

The principles of the invention with respect to the use of latching mechanisms and similar components with power and data centers will now be described with respect to embodiments illustrated in FIGS. 80-99. However, it should be expressly understood that concepts associated with the mechanisms in accordance with the invention are not limited to the specific embodiments described herein. Turning to the drawings, FIGS. 80-85 illustrate various views of a power and data center 830 in which latching mechanisms and connecting components may be utilized in accordance with the invention. Substantive operational details of the power and data center 830 will not be described herein, since the power and data center 830 functions and is structured in a manner substantially similar to the power and data centers previously described herein. Suffice it to say that and as shown in the drawings, the power and data center 830 includes a pair of rotatable or pivotable carriages 832. The carriages 832 each mount a desired set of communications and electrical outlets and terminals. For example, the power and data center 830 utilizes a pair of carriages 832, with each carriage 832 carrying two electrical outlet receptacles 834 and two voice-data connectors 836. The electrical outlet receptacles 834 may be supplied with power through one or more incoming power cables 838. Correspondingly, communication signals may be carried through voice-data connectors 836 and communications cables 840. The carriages 832 are mounted within a housing 842. The housing can be characterized as having four sides 844, comprising a first side 846, second side 848, third side 850, and fourth side 852. As shown, for example, in FIG. 89, each of the sides 844 can be characterized as having a substantially horizontal or slightly angled flange 854 and a vertically disposed bracket 856. Each corresponding horizontal flange and vertical bracket 856 may be integral with each other or otherwise connected by any suitable, permanent means, such as welding or the like.

Figure 86:
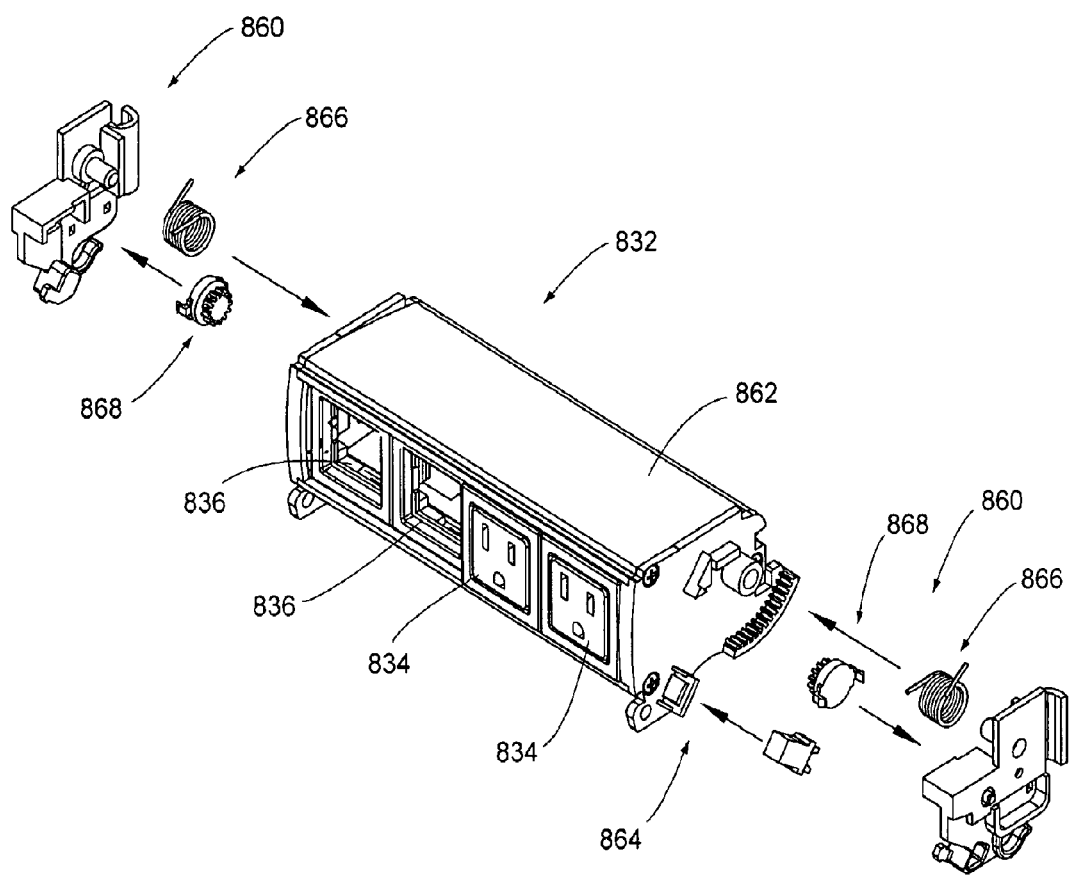
FIG. 86 is a perspective and partially exploded view of one carriage of the power and data center shown in FIG. 80, and further showing components of the spring mechanism used with the power and data center.

FIG. 86 illustrates, in a stand-alone format, one of the carriages 832. The carriage 832 substantially corresponds to the carriages previously described herein, and includes a cover 862. Also as shown in FIG. 86 is a rotational latching mechanism 860 positioned on each side of the carriage 832. The rotational latching mechanism 860 operates substantially the same as the previously described mechanism 362 associated with other power and data centers shown in other drawings. Assuming that the carriage 832 is in a closed position, a user can exert pressure on a pressure area (previously described herein) on the top surface of the cover 862. The pressure will be a downward pressure. The pressure will cause a release of each of the rotational latching mechanisms 860. This release will prevent the carriage 832 and the cover 862 to move to an open position. Such an open position is illustrated in FIGS. 80-85. The carriage 832 is initially held in the closed position for the use of a latch mechanism 864. When the user exerts a slight downward pressure on the pressure area, the latch mechanism 864 is released. The latching mechanism 860 can be characterized as including springs 866. When the latch mechanism 864 is released, the spring 866 (one of each being on opposing ends of the carriage 832) moves the carriage 832 to the open position. So as to prevent the carriage 832 from moving "too fast" to the open position, a damper 868 can be coupled (one on each end) to the carriage 832 at the ends thereof. This damper 868 on each restricts the speed at which the carriage 832 can move from a closed position to an open position, and also from an open position and closed position.

Figure 87:
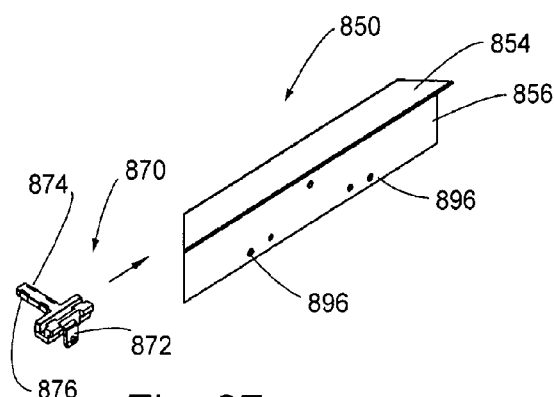
FIG. 87 is a perspective and partially exploded view of a housing side bracket and a latching component which may be utilized with the power and data center shown in FIG. 80.
Figure 88:
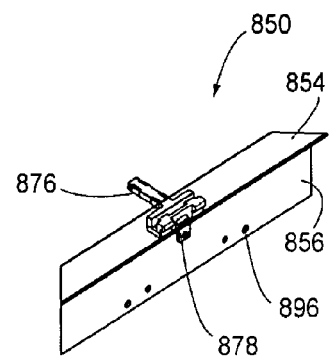
FIG. 88 shows the housing side bracket and latching component in an assembled state.

Reference is now made to FIGS. 87-90, showing the particular latching and connecting configurations in accordance with the invention. With reference first to FIG. 87, the illustration shows the third housing side 850. Also shown in an exploded view adjacent the third housing side 850 is a latch component 870 in accordance with the invention. As will be made apparent herein, latch components 870 may be utilized for purposes of securing cross bars or other connecting elements to the housing of the power data center 830. The latch component 870 includes a vertically disposed connecting bracket 872. As shown in FIG. 88, the connecting bracket 872 can be utilized with screws, pop rivets or similar connecting components 878 so as to secure the latch component 870 to the inner surface of the vertical bracket 856 of third housing side 850. The latch component 870 also includes a latching bar 874 extending outwardly from the connecting bracket 872. At the terminating end of the latching bar 874 are a set of resilient tabs 876.

Figure 89:
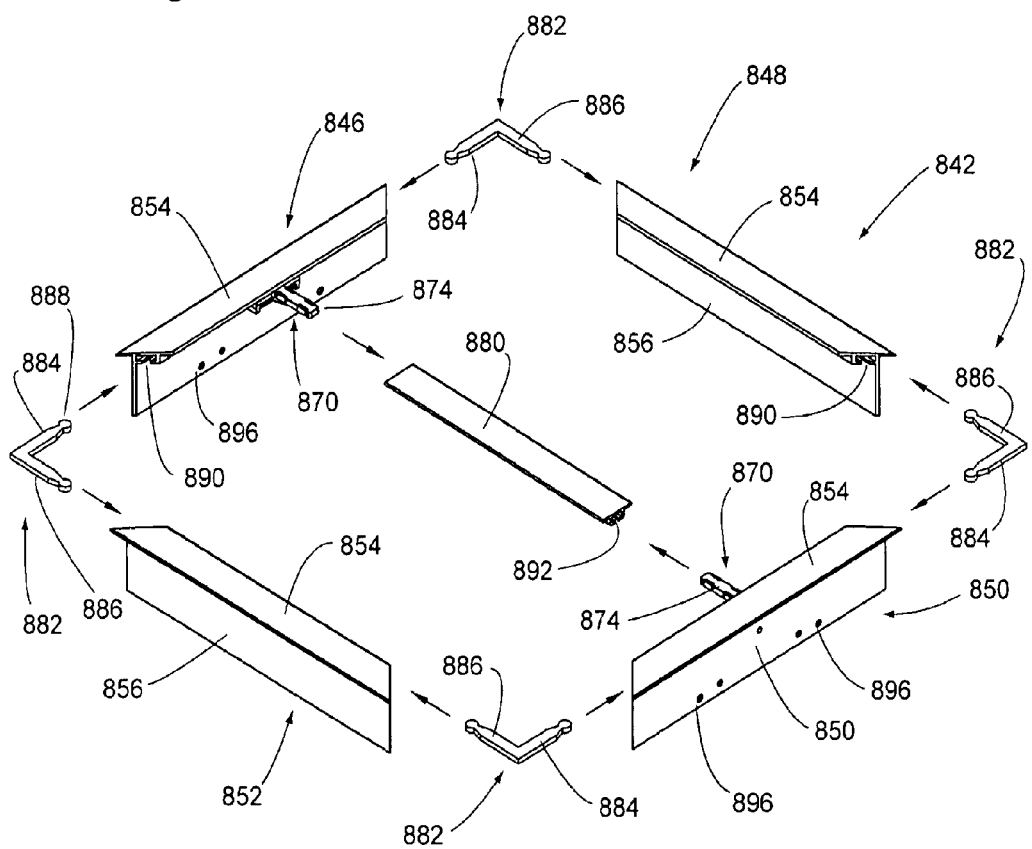
FIG. 89 is a perspective and partially exploded view of various brackets of a housing which may be utilized with the power and data center shown in FIG. 80, and further showing the latching and connecting means for connecting together components of the housing.

As shown in FIG. 89, a latch component 870 can be secured to the third housing side 850 in a manner previously described herein. Correspondingly, another latch component 870 can be secured to the inner surface of the vertical bracket 856 of the first housing side 846, directly opposing the third housing side 850. One of the elements of the power and data center 830 is a cross bar 880 as shown in perspective view in FIG. 89. The cross bar 880 includes cross bar channels 892 located on the underside of the cross bar 880. The cross bar channels 892 are appropriately sized so as to receive the latching bars 874 and resilient tabs 876 in a "snap fit" arrangement. Also, other means can be utilized to secure the latching bars 874 to the cross bars 880. In any event, this arrangement provides a means for securing the cross bar 880 to opposing sides of the housing 842.

In addition to the foregoing, and as particularly showing in FIG. 89, the housing sides 846, 848, 850 and 852 can be secured together so as to form the rectangularly shaped housing 844 through the use of what are described as right angled connecting couplers 882. As shown in FIG. 89, four of the couplers 882 are employed. Each of the couplers 882 has a right angled configuration, with a first leg 884 and a second elongated leg 886. The legs 884 and 886 are connected together or otherwise integral with each other and form a right angle configuration. In a preferred embodiment, at the terminating end of each of the first and second legs 884, 886 are resilient buttons 888.

Turning to the specific housing sides 844, each of the sides 844 includes a slide channel 890 located on the under surface of the horizontal flange 854 and positioned inwardly of the vertical bracket 856. Each side channel 890 may have any of a number of different types of configurations. However, each side channel 890 should be sized and configured so as to receive the resilient buttons 888. In accordance with the invention, the resilient buttons 888 and the side channels 890 can be configured so that the connections there between are either relatively permanent or, alternatively, are formed in a releasably securing manner. In any event, the right angled connecting couplers 882 provide for an efficient means of interconnecting adjacent ones of the housing sides 844. Also, it should be noted that the connecting couplers 882 provide for a means of connecting together housing sides 844 of various sizes. That is, the same connecting couplers 882 can be utilized regardless of the particular lengths of any of the housing sides 844. This is particularly advantageous when assembling power and data centers of varying dimensions.

Figure 90:
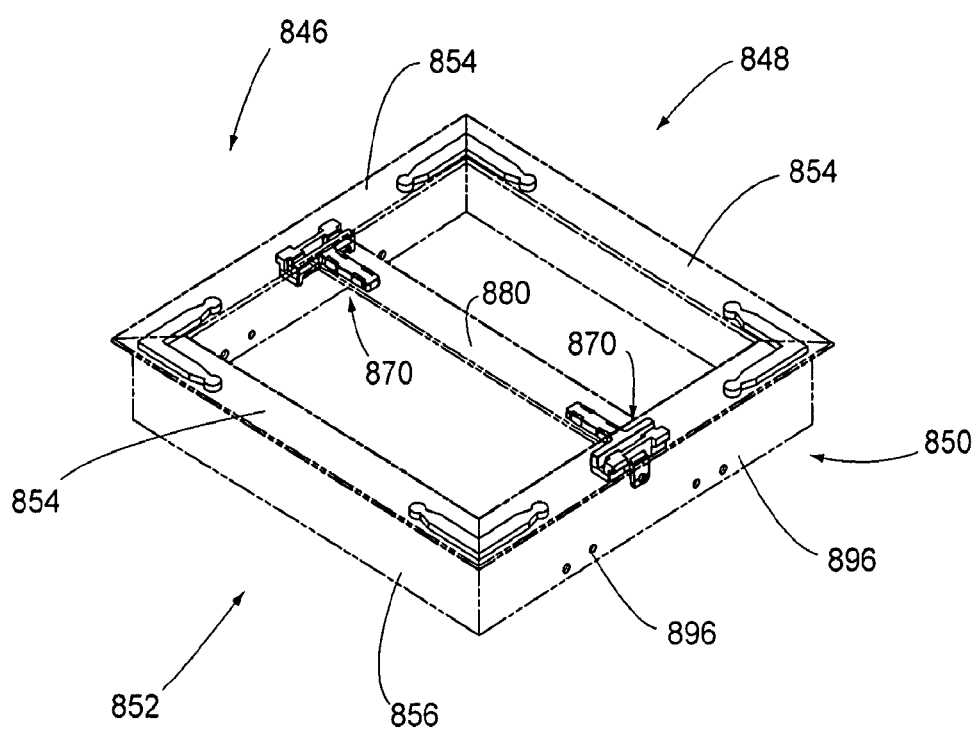
FIG. 90 is a perspective view of the housing and latching components shown in FIG. 89, in a fully assembled state.

FIG. 90 is a perspective view showing a fully assembled housing 842. In accordance with the invention, the latching and coupling components to connect the four housing sides 844 together include four right angled connectors 882 and a pair of latch components 870. With these connecting latching components, assembly of the housing 842 is substantially facilitated.

Figure 91:
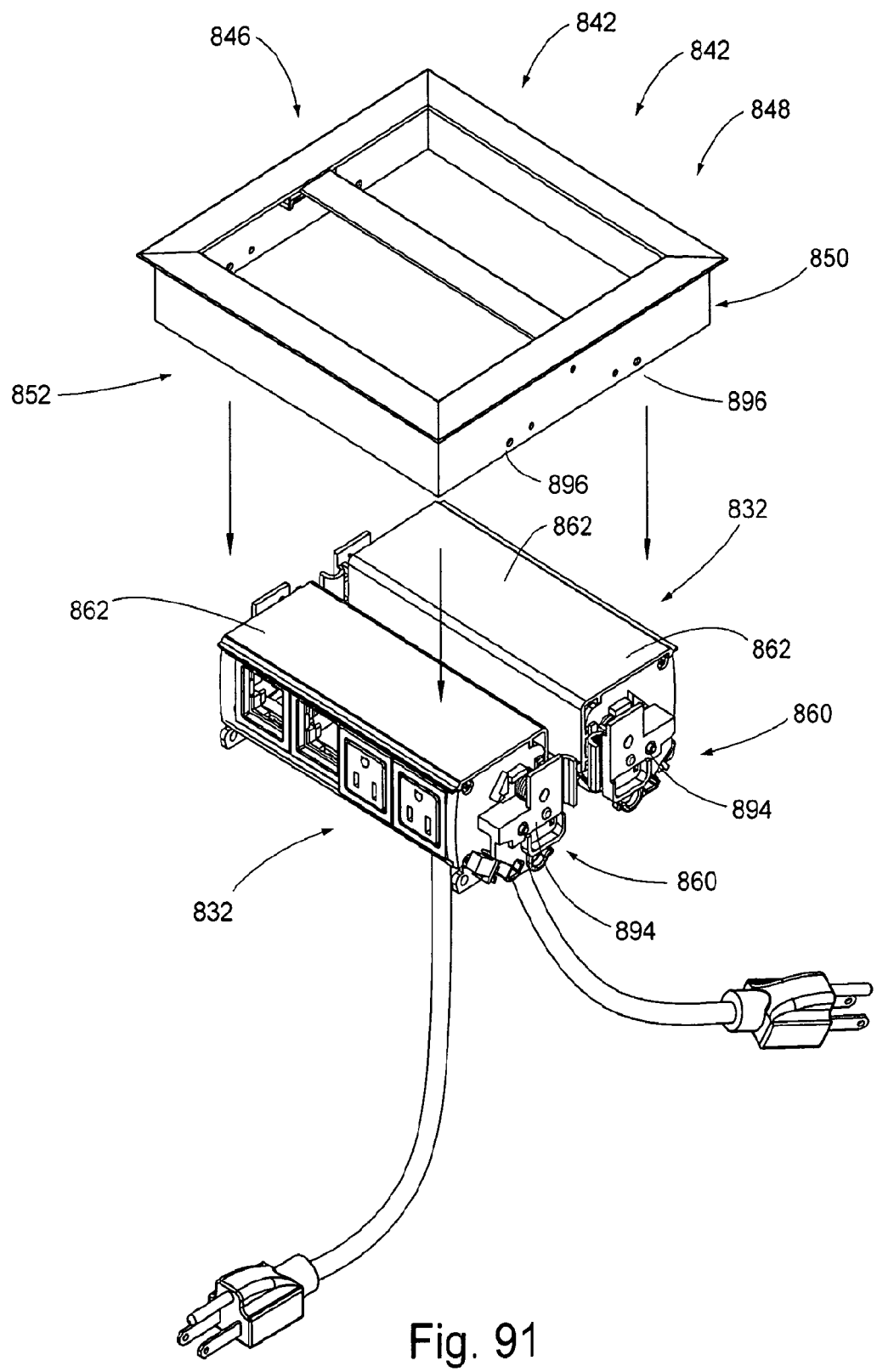
FIG. 91 is a perspective and partially exploded view, illustrating the assembled housing and the relative positioning of a pair of carriages of the power and data center shown in FIG. 80, when the carriages are to be coupled to the housing.
Figure 92:
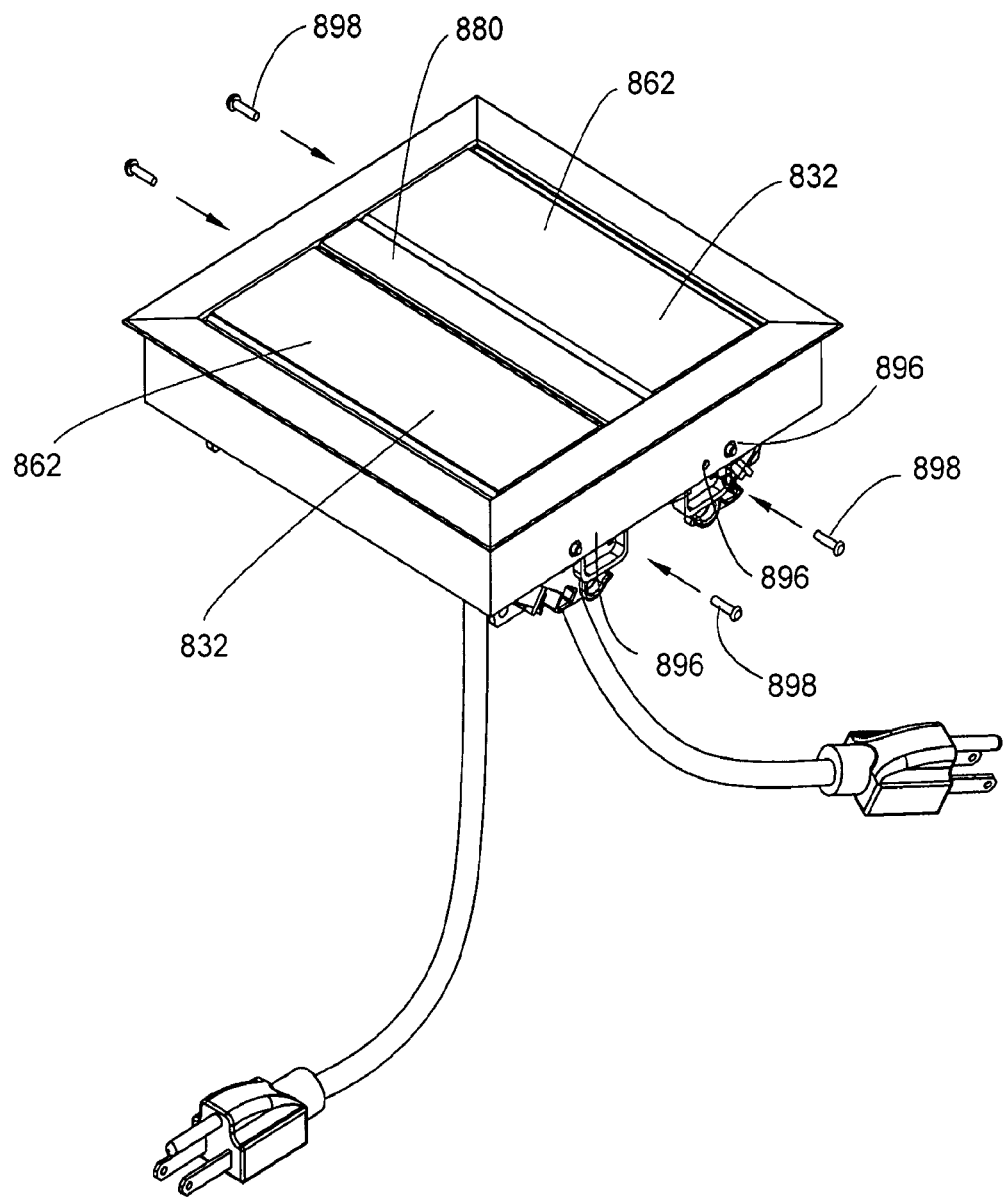
FIG. 92 is a perspective and partially exploded view showing the carriages of FIG. 91 in an assembled position relative to the housing, and further showing the connecting screws utilized to secure the carriages to the housing.

FIG. 91 illustrates the fully assembled housing 842, with the pair of carriages 832 being initially position so as to be received within the housing 842. As shown in FIG. 91, each of the carriages 832 includes a pair of connecting brackets 894, with the connecting brackets 894 located on opposing ends of the carriages 832. As also shown in FIG. 91, apertures 896 extend through the first side 846 and the third side 850. FIG. 92 illustrates the final supporting position for the carriages 832 within the housing 842. When in this position, apertures on the connecting brackets 894 align with the apertures 896 on the housing sides 846, 850. Screws, pop rivets or other similar connecting means 898 can then be utilized so as to be received within the apertures of the connecting brackets 894 and the apertures 896. However, it should be emphasized that these connections still must permit the carriages 832 to pivot or rotate relative to the housing 842. FIG. 92 shows this assembly substantially completed, with the carriages 832 in a closed position.

Figure 93:
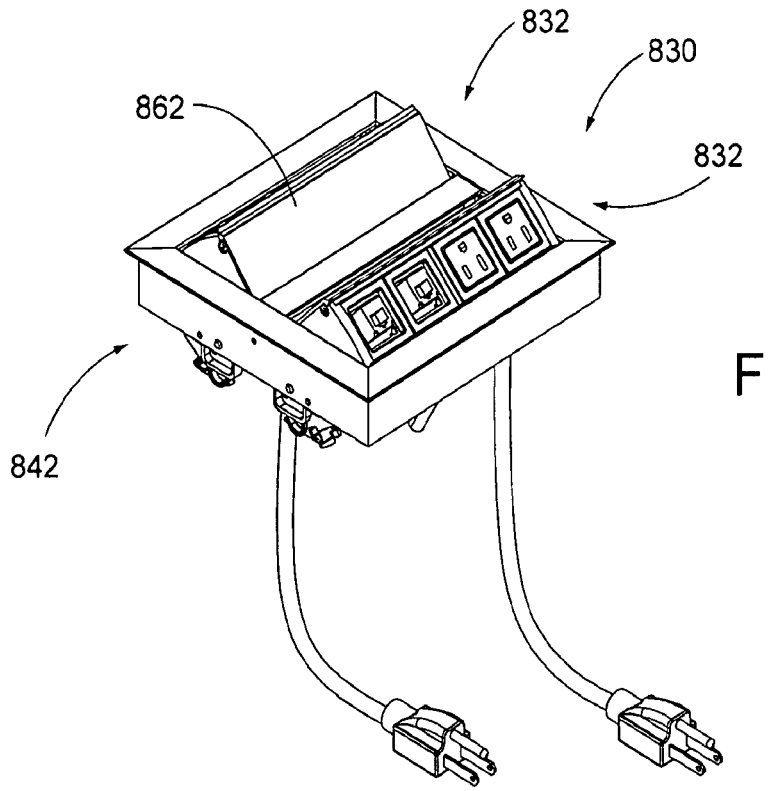
FIG. 93 is a perspective view of the fully assembled power and data center shown in FIG. 80, with the carriages in open positions.
Figure 94:
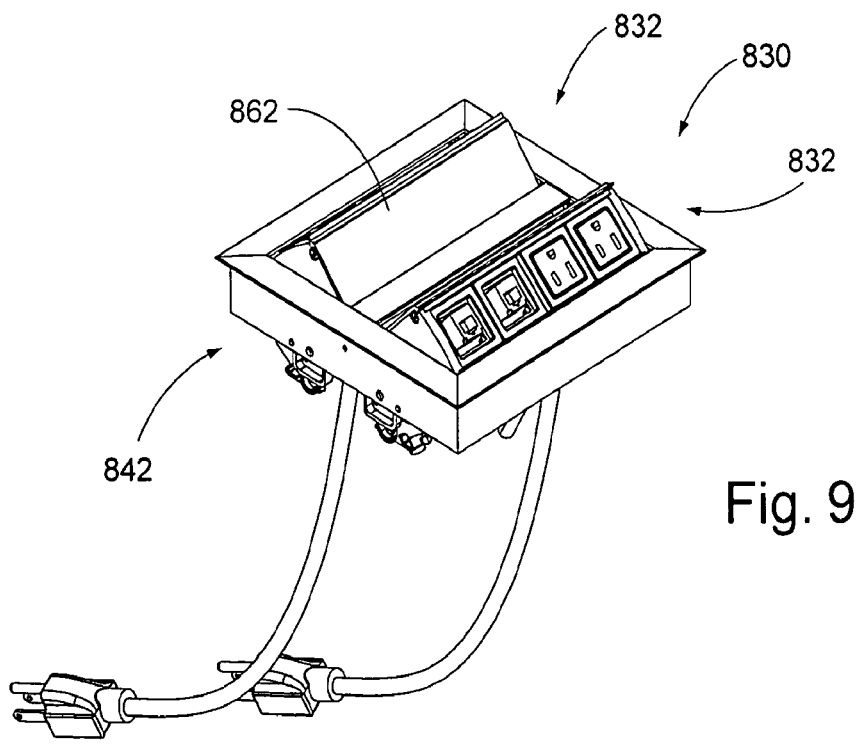
FIG. 94 is a perspective view similar to FIG. 93, but with the power and data center rotated 180° relative to the perspective view of FIG. 93.
Figure 95:
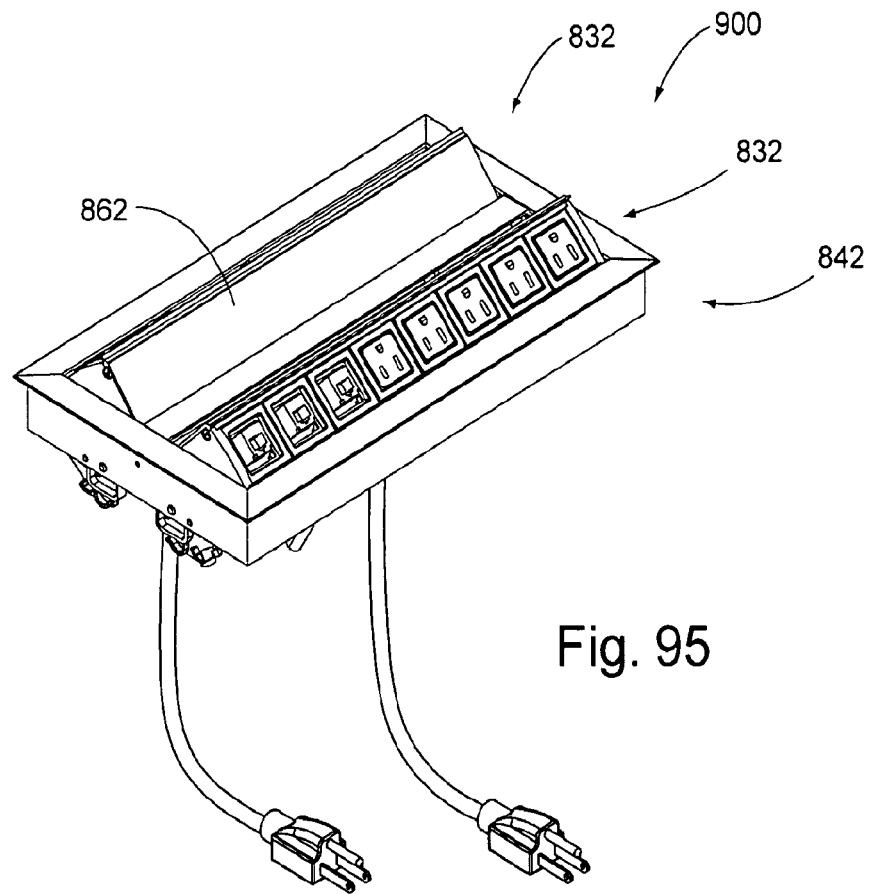
FIG. 95 is an alternative embodiment of a power and data center which may utilize the latching components in accordance with the invention.

It is apparent from the foregoing that other operational configurations of the power data center 830 may be employed. For example, FIG. 93 is a perspective view illustrating both of the carriages 832 in an open position. FIG. 94 is a perspective view similar to FIG. 93, but with the power and data center 830 rotated 180° relative to the perspective view of FIG. 93. FIG. 95 illustrates another embodiment 900 of a power and data center. In this particular embodiment, the power and data center has been expanded so as to include five electrical outlet receptacles 834 and three voice/data connectors 836, on at least one of the carriages 832. FIG. 95 also illustrates both of the carriages 832 in an open position.

Figure 96:
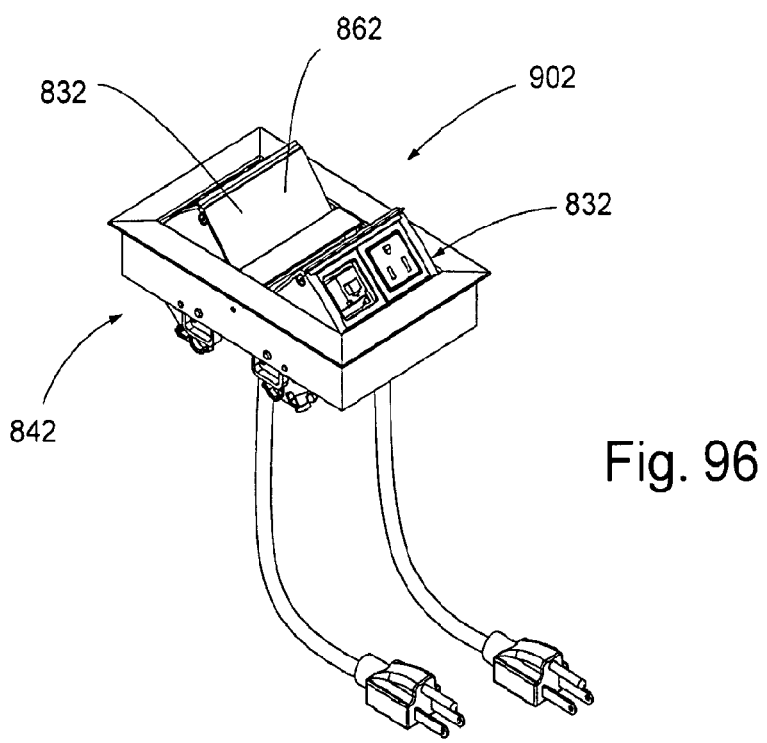
FIG. 96 is a still further embodiment of a power and data center which may utilize latching components in accordance with the invention.

FIG. 96 illustrates a still further embodiment 902 of a power and data center in accordance with the invention. In this particular configuration, the power and data center 902 is relatively narrow, and includes only a single voice/data connector 836 and a single electrical outlet receptacle 834 on each of the carriages 832. FIG. 96 also illustrates the power and data center 902 with both carriages 832 at an open position.

Figure 97:
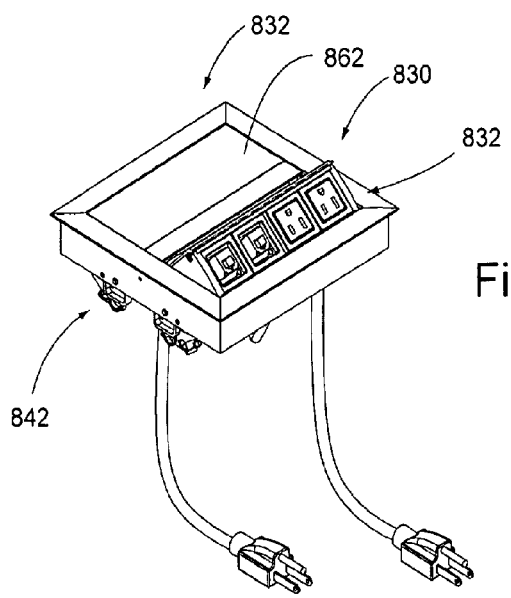
FIG. 97 is another embodiment of a power and data center which may utilize latching components in accordance with the invention.
Figure 98:
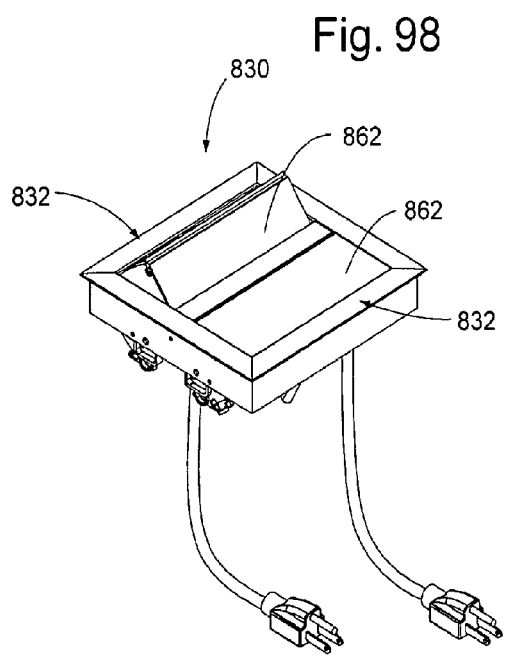
FIG. 98 is a perspective view of the power and data center shown in FIG. 97, but shown in a configuration rotated 180° from the perspective view of FIG. 97.
Figure 99:
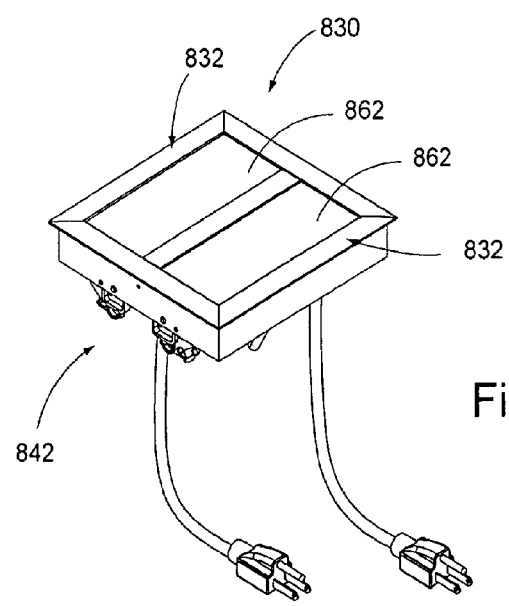
FIG. 99 is a perspective view of the power and data center shown in FIGS. 97 and 98, but showing the carriages in a closed position.

FIG. 97 is a perspective view illustrating the power and data center 830, but with the data center 830 having one of the carriages 832 in a closed position and the other of the carriages 832 in an open position. FIG. 98 is similar to FIG. 97. However, in FIG. 98, the carriage 832 that was in the closed position in FIG. 97 is now open. Correspondingly, the carriage 832 that was in the open position in FIG. 97 is now closed. Finally, FIG. 99 is a perspective view illustrating the power and data center 830, with both of the carriages 832 in a closed position.

It will be apparent to those skilled in the pertinent arts that other embodiments of power and data centers in accordance with the invention may be designed. That is, the principles of power and data centers in accordance with the invention are not limited to the specific embodiments described herein. For example, various combinations of electrical receptacles and voice/data communication receptacles may be utilized. Accordingly, it will be apparent to those skilled in the arts that modifications and other variations of the above-described illustrative embodiments of the invention may be effected without departing from the spirit and scope of the novel concepts of the invention.

What is claimed is:

1. An electrical system for distributing power and/or data, and adapted to be mounted to a work surface, said system comprising:

a housing adapted to be mounted to said work surface;

carrying or carriage means directly or indirectly coupled to said housing and either movable between a closed, retracted position and an open, extended position, or maintained stationary relative to said housing;

a cover positioned at least partially over said carrying or carriage means and movable between a closed, retracted cover position and an open, extended cover position;

at least one power and/or data component mounted to said carrying or carriage means, and accessible to a user when said cover is in said open, extended cover position;

means for releasably maintaining said cover in said closed, retracted cover position;

means responsive to an initial application of external forces directly or indirectly on said cover for releasing said cover from said closed, retracted cover position;

means for automatically moving said cover from said closed, refracted cover position to said open, extended cover position following said initial application of external forces; and said system further comprises damping means coupled to said means for automatically moving said cover, for damping movement of said cover from said closed, retracted cover position to said open, extended cover position.

2. An electrical system in accordance with claim 1, characterized in that said damping means operates so that the rate of movement of said cover from said closed, retracted cover position to said open, extended cover position remains substantially constant.

3. An electrical system in accordance with claim 1, characterized in that said system comprises means for releasably securing said housing to said work surface, said securing means comprises:
- at least one latching mechanism, said latching mechanism comprising:
  - a tower;
  - a vertically disposed bushing thread mounted to said tower;
  - a foot connected to or otherwise integral with the bottom of said tower, said foot having a triangular configuration;
  - a vertical bracket connected to or otherwise integral with said foot; and
  - a lip extending outwardly from a top of said vertical bracket.

4. An electrical system in accordance with claim 1, characterized in that said system comprises a plurality of latching mechanisms for releasably securing said housing to said work surface, each of said plurality of latching mechanisms releasably locks said housing to said work surface, in the absence of any requirement of screws or the like.

5. An electrical system in accordance with claim 1, characterized in that said system further comprises a plurality of connecting clips for releasably securing said electrical system to said work surface, in a manner so that said electrical system cannot be inadvertently lifted upwardly out of the slot within said work surface.

6. An electrical system in accordance with claim 5, characterized in that each of said connecting clips comprises:
- an angled back portion;
- a reverse angled section integral with a lower portion of said angled back portion;
- a parallel angled section located on the bottom portion of said reverse angled portion, said angled section lying in a place parallel to the plane of said angled back portion; and
- a lower integral connection is made between said lower portion of said parallel angled section and a lower portion of a vertical front plate.

\* \* \* \* \*

UNITED STATES PATENT AND TRADEMARK OFFICE
CERTIFICATE OF CORRECTION

PATENT NO.       : 8,690,590 B2                                     Page 1 of 1
APPLICATION NO.  : 12/664251
DATED            : April 8, 2014
INVENTOR(S)      : Norman R. Byrne It is certified that error appears in the above-identified patent and that said Letters Patent is hereby corrected as shown below:

In the Claims

Column 34, Claim 1, line 65: "refracted" should be --retracted--

Signed and Sealed this
Twenty-ninth Day of July, 2014

Michelle K. Lee
*Deputy Director of the United States Patent and Trademark Office*